US012805406B2

(12) United States Patent
Kaneki et al.

(10) Patent No.: US 12,805,406 B2
(45) Date of Patent: Nov. 17, 2026

(54) LED DISPLAY DEVICE HAVING MULTILAYER CURED RESIN FILMS AND INTERLAYER INORGANIC INSULATION

(71) Applicant: TORAY INDUSTRIES, INC., Tokyo (JP)

(72) Inventors: Takayuki Kaneki, Otsu (JP); Yu Shoji, Otsu (JP); Keika Hashimoto, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 443 days.

(21) Appl. No.: 18/569,050

(22) PCT Filed: Apr. 15, 2022

(86) PCT No.: PCT/JP2022/017900

§ 371 (c)(1),
(2) Date: Dec. 11, 2023

(87) PCT Pub. No.: WO2023/002728

PCT Pub. Date: Jan. 26, 2023

(65) Prior Publication Data

US 2024/0297157 A1 Sep. 5, 2024

(30) Foreign Application Priority Data

Jul. 21, 2021 (JP) ................................ 2021-120194

(51) Int. Cl.
*H10W 90/00* (2026.01)
*H10H 20/857* (2025.01)

(52) U.S. Cl.
CPC .......... *H10W 90/00* (2026.01); *H10H 20/857* (2025.01)

(58) Field of Classification Search
CPC ... H10W 90/00; H10H 20/857; H10H 20/852; H10H 20/854; H10H 20/84; G09F 9/30;
(Continued)

(56) References Cited

U.S. PATENT DOCUMENTS

2014/0346504 A1 11/2014 Misaki
2014/0367633 A1 12/2014 Bibl et al.
(Continued)

FOREIGN PATENT DOCUMENTS

JP 2011-53247 A 3/2011
JP 2016-523450 A 8/2016
(Continued)

OTHER PUBLICATIONS

Chinese First Action, Machine Translation (Year: 2023).*
(Continued)

*Primary Examiner* — Tracie Y Green
(74) *Attorney, Agent, or Firm* — Birch, Stewart, Kolasch & Birch, LLP

(57) ABSTRACT

The purpose of the present invention is to obtain an insulation film with high reliability, the insulation film and a wiring line being not susceptible to the occurrence of a crack due to thermal stress difference between the insulation film for wiring insulation or a protective film and inorganic materials, namely a metal wiring line, an inorganic light emitting diode chip and a substrate. In order to achieve the purpose, the present invention provides a display device which comprises at least a metal wiring line, a cured film, an inorganic insulation film and a plurality of light emitting elements, wherein: the cured film is obtained by curing a resin composition that contains a resin (A); each of the light emitting elements is an inorganic light emitting diode that is provided with a pair of electrode terminals on either surface; the pair of electrode terminals are connected to a plurality of the metal wiring lines that extend in the inorganic insulation film and the cured film; the display device is configured such that electrical insulation is maintained among the plurality of metal wiring lines by means of the cured film and the inorganic insulation film; the display device comprises a
(Continued)

plurality of the cured films; and the inorganic insulation film is arranged so as to be in contact with at least a part of the interlayer between the plurality of cured films.

16 Claims, 15 Drawing Sheets

(58) Field of Classification Search
CPC .... G09F 9/33; C08K 5/06; C08K 5/13; C08L 79/08; H10D 86/441; H10D 86/451
See application file for complete search history.

(56) References Cited

U.S. PATENT DOCUMENTS

| | | | | |
|---|---|---|---|---|
| 2015/0027754 | A1* | 1/2015 | Shimoda | C08G 73/1053 524/588 |
| 2018/0009983 | A1* | 1/2018 | Murotani | C09D 179/08 |
| 2018/0156841 | A1* | 6/2018 | Neely | G01R 1/0483 |
| 2018/0259852 | A1 | 9/2018 | Tanigaki et al. | |
| 2018/0277528 | A1 | 9/2018 | Hasegawa et al. | |
| 2018/0356729 | A1* | 12/2018 | Tanigaki | G03F 7/0007 |
| 2019/0165035 | A1 | 5/2019 | Fu | |
| 2021/0183943 | A1 | 6/2021 | Mori et al. | |

FOREIGN PATENT DOCUMENTS

| | | | | | |
|---|---|---|---|---|---|
| JP | 2019-45865 | A | | 3/2019 | |
| KR | 20120120005 | A | * | 11/2012 | H10H 20/854 |
| WO | WO 2016/043203 | A1 | | 3/2016 | |
| WO | WO 2016/121258 | A1 | | 8/2016 | |
| WO | WO-2020026937 | A1 | * | 2/2020 | H10W 70/09 |
| WO | WO 2020/050062 | A1 | | 3/2020 | |
| WO | WO-2020250667 | A1 | * | 12/2020 | H10W 90/00 |

OTHER PUBLICATIONS

Jjapanese First Action, Machine Tranlation (Year: 2023).*
Hashimoto_et_al.__WO2020026937A1__mahcine_translation__6-2020.pdf (Year: 2020).*
Ito_et_al.__WO2020250667__machine_trabslation__12-2020.pdf (Year: 2020).*
International Search Report, issued in PCT/JP2022/017900, PCT/ISA/210, dated Jul. 5, 2022.
Written Opinion of the International Searching Authority, issued in PCT/JP2022/017900, PCT/ISA/237, dated Jul. 5, 2022.

* cited by examiner

LED DISPLAY DEVICE HAVING MULTILAYER CURED RESIN FILMS AND INTERLAYER INORGANIC INSULATION

TECHNICAL FIELD

The present invention relates to display devices such as LED displays.

BACKGROUND ART

From the viewpoint of providing displays with highly improved performances, LED displays in which the same number of light emitting diodes (hereinafter occasionally referred to as LEDs) as that of the required pixels are arranged are attracting attention in recent years as a new display technology to replace the liquid crystal displays, plasma displays, and organic EL displays. In particular, currently in the spotlight are mini-LED displays that have LED light sources with sizes ranging from 1 mm, i.e. about the size of conventional ones, to 100 to 700 μm and micro-LED displays that are as small as 100 μm or less, and research and development efforts are being actively made for them. The main features of these mini-LED displays and micro-LED displays include high contrast, high speed response, low power consumption, and wide viewing angles. It is expected that they will be applied not only to conventional devices such as TVs, smart phones, and wearable displays such as smart watches, but also to a wide range of new products with high future potential such as those for signage, AR, VR, and transparent displaying to display spatial images.

Various structures of LED displays that serve for practical and high performance applications have been proposed, including a structure that includes a multilayer flexible circuit board and micro LEDs arranged thereon (see Patent document 1) and a structure produced by forming a bank layer and trace lines on a display substrate and arranging micro-LEDs and micro-driver chips thereon (see Patent document 2). In addition, also proposed is a structure produced by forming main light emitting element bodies having electrode pads in an integral manner on a growth substrate, forming a planarization film thereon, removing the planarization film located on the electrode pads to expose the electrode pads, forming outer side electrode pads connected to the electrode pads on the aforementioned planarization film, and mounting them on a circuit board with the circuit side electrodes located thereon in such a manner that the outer side electrode pads are opposed to the circuit side electrodes, followed by electrically connecting the front external electrode pads to the circuit side electrodes (see Patent document 3).

PRIOR ART DOCUMENTS

Patent Documents

Patent document 1: Japanese Unexamined Patent Publication (Kokai) No. 2019-153812

Patent document 2: Japanese Unexamined Patent Publication (Kokai) No. 2020-52404

Patent document 3: Japanese Unexamined Patent Publication (Kokai) No. 2020-68313

SUMMARY OF INVENTION

Problems to be Solved by the Invention

LED display devices require temperatures exceeding 200° C. in the course of their production processes and accordingly, this can lead to problems due to a difference in thermal stress between organic materials such as insulation films and protection films used for wiring insulation and inorganic materials such as metal wiring, inorganic light emitting diode chips, and substrates as they cause cracks in the wiring, insulation films, etc., bringing about an insufficient reliability.

Means of Solving the Problems

To solve such problems, the present invention is configured as described below.

A display device including at least metal wires, a cured film, an inorganic insulation film, and a plurality of light emitting elements wherein: the cured film is a film formed by curing a resin composition containing a resin (A); each of the light emitting elements is an inorganic light emitting diode having a pair of electrode terminals on either face thereof; the pair of electrode terminals is connected to the plurality of metal wires extending in the cured film and inorganic insulation film; the multiple metal wires are electrically insulated from each other by the cured film and the inorganic insulation films; the cured film has a plurality of layers; and the inorganic insulation film is arranged so that it is in contact with at least part of the interlayers in the multiple layered cured film.

Advantageous Effects of the Invention

The display device according to the present invention shows a high light extraction efficiency and a sufficiently high brightness and can work as a display device that gives a low defective rate in reliability test performed under accelerated test conditions for practical use simulation.

DESCRIPTION OF PREFERRED EMBODIMENTS

Favorable embodiments of the display device according to the present invention will be described in more detail below, but it should be noted that the present invention is not limited to the embodiments described below and may be modified appropriately to suit particular objectives and purposes.

The display device according to the present invention is a display device that includes at least metal wires, a cured film, an inorganic insulation film, and a plurality of light emitting elements wherein the cured film is a film formed by curing a resin composition containing a resin (A); each of the light emitting elements is an inorganic light emitting diode having a pair of electrode terminals on either face thereof; the pair of electrode terminals is connected to the plurality of metal wires extending in the cured film and inorganic insulation film: the multiple metal wires are electrically insulated from each other by the cured film and the inorganic insulation film; the cured film has a plurality of layers; and the inorganic insulation film is arranged so that it is in contact with at least part of the interlayers in the multiple layered cured film.

The display device according to the present invention is described below with reference to the embodiment illustrated in FIG. 1.

Figure 1:
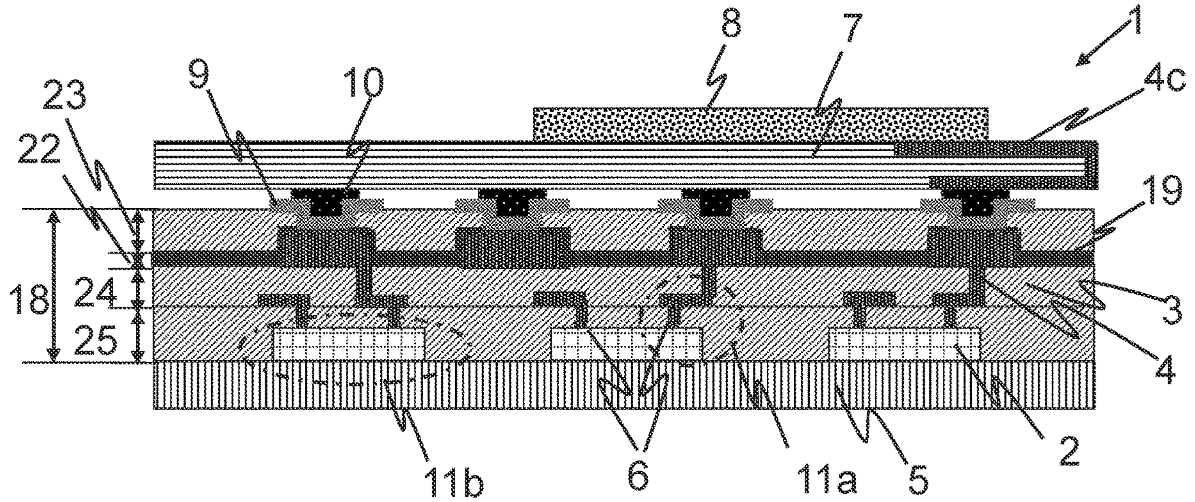
FIG. 1 This gives a frontal sectional view of an embodiment of the display device according to the present invention.

FIG. 1 shows a display device 1 that has a plurality of light emitting elements 2 arranged on an opposite substrate 5 and a cured film 3 formed on the light emitting elements 2. The term “formed on the light emitting elements” means that the film exists at least either on the surface of the light emitting elements or above the support substrate or the light emitting elements. In the embodiment illustrated in FIG. 1, a cured film 3 is disposed in such a manner that it is in contact with at least part of the light emitting elements 2 and is combined with a plurality of additional cured film layers 3 formed on top thereof to form a structure containing a total of three layers. However, it may be a structure containing only two cured film layers 3. Each of the light emitting elements 2 has a pair of electrode terminals 6 on the face opposed to the other face that is in contact with the opposite substrate 5, and these electrode terminals 6 are connected with the plurality of metal wires 4 extending in the cured film 3 and the inorganic insulation film 19.

Here, if the plurality of metal wires 4 extending in the cured film 3 and the inorganic insulation film 19 is covered completely by either or both of the cured film 3 and the inorganic insulation film 19, then the cured film 3 and the inorganic insulation film 19 can act as insulation films to serve to construct a structure in which electrical insulation is maintained. The expression “to construct a structure in which electrical insulation is maintained” means that those portions of the metal wirings that require electrical insulation are covered by the cured film, which is formed by curing the resin composition containing a resin (A), and the inorganic insulation film wherein the cured film and the inorganic insulation film maintain strong electric insulation with a volume resistivity exceeding $10^{12}$ Ω·cm.

Furthermore, the light emitting elements 2 will be electrically connected through metal wires 4 and 4*c* to the drive element 8 that is added to the light emitting element driving substrate 7 located at an opposed position to the opposite substrate 5, thereby serving to control the light emission from the light emitting elements 2. In addition, the light emitting element driving substrate 7 is electrically connected to the metal wires 4 through, for example, a solder bump 10.

Barrier metal 9 may be provided additionally in order to prevent diffusion of metal components from the metal wires 4 etc. It should be noted that in all diagrams given here and hereafter, the metal wires 4*c* may permeate the light emitting element driving substrate 7 to achieve connection to the drive element 8.

The cured film is a film formed by curing a resin composition containing a resin (A) that will be described later, and it is essential for the inorganic insulation film to be disposed so that it is in contact with at least part of the cured film. This serves to reduce the warping of the display device, relieves the stress concentration caused thereby, and prevents peeling and cracking. Accordingly, this prevents misalignment or detachment of light emitting elements, peeling of metal wires, and cracking during the manufacturing process of a display device and during reliability test performed under accelerated test conditions for practical use simulation, thereby serving to produce a display device that gives a low defective rate in reliability test. Useful reliability tests include impact test, high temperature storage test, constant-temperature high-humidity test, and heat cycle test.

The inorganic insulation film can be formed by, for example, the CVD method. It is preferable for the inorganic insulation film to have a thickness of 0.2 μm or more, more preferably 0.4 μm or more, and particularly preferably 0.8 μm or more. It is also preferable for the inorganic insulation film to have a thickness of 1.0 μm or less. There are no specific limitations on the material used in the inorganic insulation film and a generally known material may be adopted. For example, an inorganic material containing one or more of silicon oxide ($SiO_x$), silicon nitride ($SiN_x$), aluminum oxide ($Al_xO_y$), and aluminum oxynitride ($Al_xO_yN_z$) as main component is used.

If able to reflect light, such an inorganic insulation film can also function as a reflecting film and this allows light beams having passed through the cured film 3 to be reflected by the inorganic insulation film, leading to an increase in the light extraction efficiency and improvement in brightness.

This serves to reduce the warping of the display device, relieves the stress concentration caused thereby, and prevents peeling and cracking while also serving to increase the light extraction efficiency and improve brightness.

Figure 12:
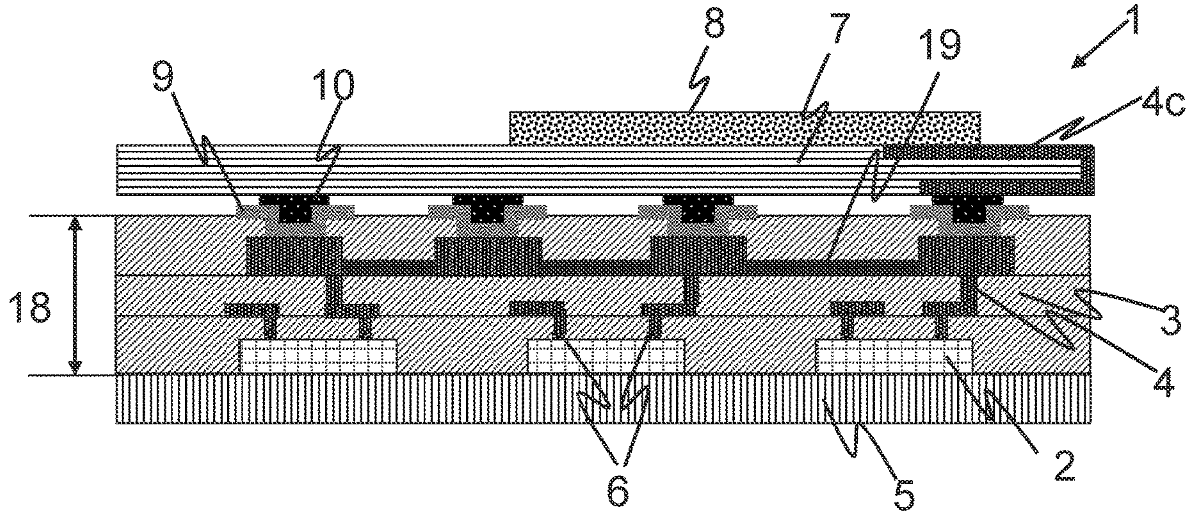
FIG. 12 This gives a frontal sectional view of another embodiment of the display device according to the present invention.

The display device according to the present invention preferably has a sandwich structure in which cured films are disposed on both sides of the inorganic insulation film. In the sandwich structure, cured films 3 are disposed on both upper and lower surfaces of the inorganic insulation film 19, as shown in FIG. 1. In other embodiments of the display device, such a sandwich structure may extend throughout the cured films 3 excluding the portions containing the metal wires 4, as shown in FIG. 1, or a sandwich structure may exist over only a part of the cured films 3, as shown in FIG. 12.

It is preferable, furthermore, for the display device according to the present invention to have a sandwich structure in which the inorganic insulation film exists between the cured film layer located at the furthest position and the cured film layer located at the second furthest position when seen from the light emitting elements in the direction perpendicular to the plane where the plurality of light emitting elements is disposed and also perpendicular to the plurality of stacked cured film layers. More specifically, as illustrated in FIG. 1, a plurality of light emitting elements 2 is disposed on a plane, and a plurality of cured film layers 3, totaling three layers, is disposed on one surface of this plane. It is preferable to have a sandwich structure in which the inorganic insulation film exists between the cured film layer located at the furthest position and the cured film layer located at the second furthest position, which are among the three layers in the cured film 3 mentioned above, when seen in the direction perpendicular to the aforementioned plane.

For such a sandwich structure as described above, it is preferable that $\alpha>\gamma$, that $6\leq\alpha/\beta\leq100$, and also that $0.01\leq\beta/\gamma\leq0.75$, where α (μm) is the thickness of the cured film layer located at the furthest position; β (μm) is the thickness of the inorganic insulation film that exists between the cured film layer located at the furthest position and the cured film layer located at the second furthest position; and γ (μm) is the thickness of the cured film layer located at the second furthest position. More specifically, as illustrated in FIG. 1, it is preferable that the relations $\alpha>\gamma$, $6\leq\alpha/\beta\leq100$, and $0.01\leq\beta/\gamma\leq0.75$ be satisfied, and it is more preferable that the relations $\alpha>\gamma$, $7\leq\alpha/\beta\leq40$, and $0.04\leq\beta/\gamma\leq0.30$ be satisfied, where a (μm) is the thickness 23 of the cured film layer located at the furthest position; β (μm) is the thickness 22 of the inorganic insulation film that exists between the cured film layer located at the furthest position and the cured film layer located at the second furthest position; and γ (μm) is the thickness 24 of the cured film layer located at the second furthest position. Here, the thicknesses α to γ (μm) refer to the maximum thickness of each cured film layer. This serves to reduce the warping of the display device in reliability test, relieve the stress concentration caused thereby, and prevent peeling and cracking while also serving to prevent insulation degradation from being caused by continuous high voltage application while being driven.

Furthermore, for the present invention, the total thickness of the insulation layer including the cured film and the inorganic insulation film is preferably 5 μm to 100 μm. Here, the metal wires 4 may include electrodes inside.

There are no specific limitations on the material used in the metal wires 4, and a generally known material may be adopted. Examples thereof include gold, silver, copper, aluminum, nickel, titanium, molybdenum, and alloys containing them, of which copper is preferable. Here, the metal wires 4 may include electrodes inside.

For the display according to the present invention, the metal wires may be in the form of electrically conductive films.

There are no specific limitations on the materials to use for such electrically conductive films, and examples thereof include compounds containing, as primary component, an oxide of at least one substance selected from indium, gallium, zinc, tin, titanium, niobium, or the like, and photosensitive electrically conductive pastes containing organic substances and electrically conductive particles. Other generally known materials may also be used. Specific examples of such compounds containing, as primary component, an oxide of at least one substance selected from indium, gallium, zinc, tin, titanium, niobium, or the like include indium tin zinc oxide (ITZO), indium gallium zinc oxide (IGZO; InGaZnO), zinc oxide (ZnO), indium zinc oxide (IZO), indium gallium oxide (IGO), indium tin oxide (ITO), and indium oxide (InO).

These electrically conductive films can be produced by, for example, wet plating techniques such as electroless plating and electrolytic plating, CVD (chemical vapor deposition) techniques (CVD) such as thermal CVD, plasma CVD, and laser CVD, dry plating techniques such as vacuum deposition, sputtering, and ion plating, and others such as bonding of metal foil to a substrate and subsequent etching.

In regard to the photosensitive electrically conductive pastes containing organic substances and electrically conductive particles, examples of useful organic substances include epoxy resin, phenoxy resin, acrylic copolymers, and epoxy carboxylate compounds. Two or more of these may be contained together. An organic substance having a urethane bond may also be contained. The inclusion of a substance having a urethane bond can serve to ensure improved flexibility of the wires. Furthermore, it is preferable for the organic substance in use to show photosensitivity because it serves to form a fine wire pattern easily by photolithography. Photosensitivity can be developed by, for example, adding a photo initiator or a component having an unsaturated double bond.

Figure 28:
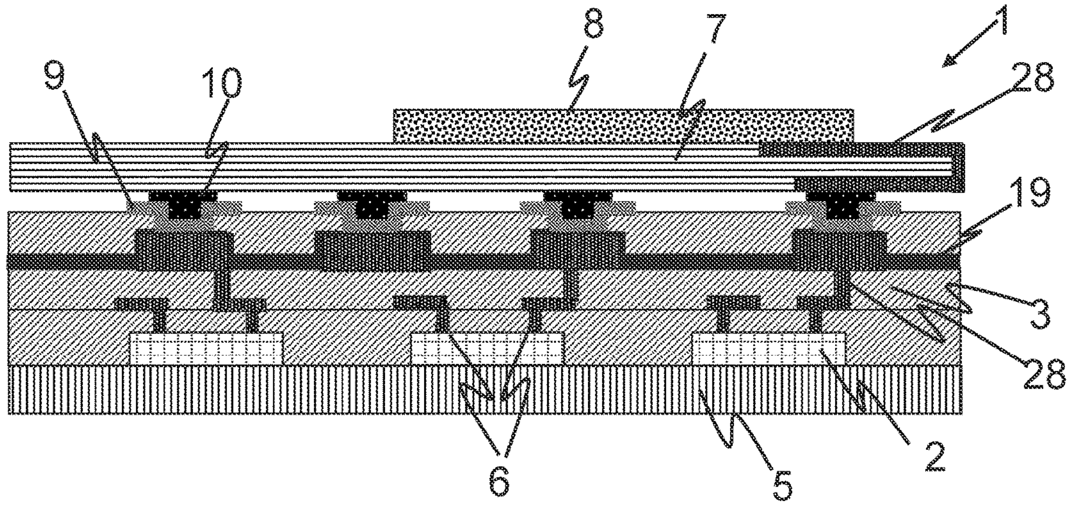
FIG. 28 This gives a frontal sectional view of another embodiment of the display device according to the present invention that has an electrically conductive film.
Figure 29:
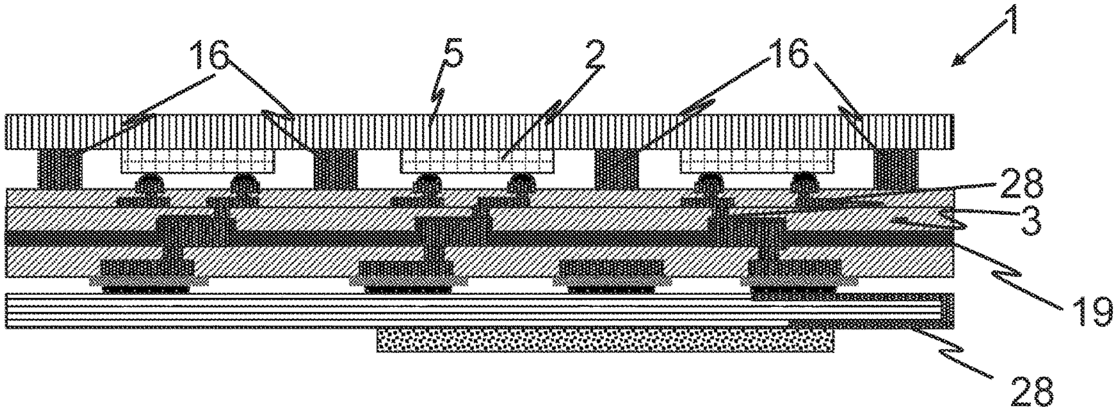
FIG. 29 This gives a frontal sectional view of another embodiment of the display device according to the present invention that has an electrically conductive film.

For the present invention, the electrically conductive particles are particles that contain a substance having an electric resistivity of $10^{-5}$ Ω·m or less. Useful materials for the electrically conductive particles include, for example, silver, gold, copper, platinum, lead, tin, nickel, aluminum, tungsten, molybdenum, chromium, titanium, indium, and alloys of these metals, as well as carbon particles. It should be noted that the electrically conductive film contains electrodes as well. Typical display devices that adopt electrically conductive films are shown in FIG. 28 and FIG. 29.

Figure 11:
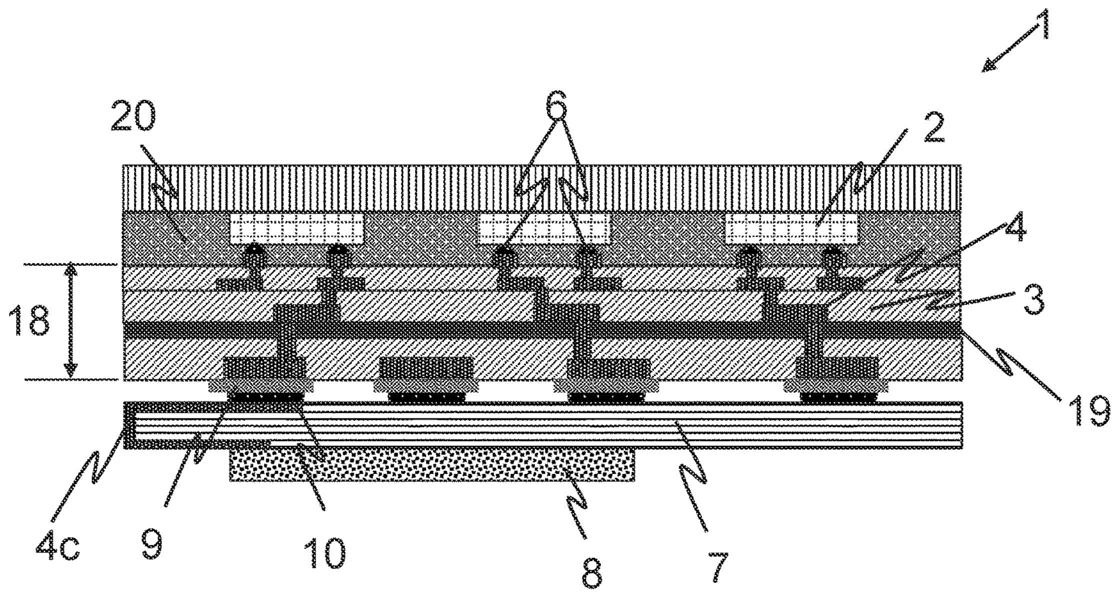
FIG. 11 This gives a frontal sectional view of another embodiment of the display device according to the present invention.

Another illustrative embodiment of the present invention is given in FIG. 11, which shows a structure that, unlike the display device illustrated in FIG. 1, has a cured film 20 disposed so as to be in contact with at least part of the light emitting elements 2. The cured film 20 that is disposed so as to be in contact with at least part of the light emitting elements 2 may be a cured film formed by curing a resin composition or a resin sheet containing the resin (A) or may be of a material other than a cured film formed by curing a resin composition or a resin sheet containing the resin (A), and as that material, a generally known one such as epoxy resin, silicone resin, and fluorine resin may be used.

For the present invention, the light emitting element driving substrate 7 is, for example, a substrate having an element with a driving function, and it is preferably connected to the drive element 8.

There are no specific limitations on the material used for the light emitting element driving substrate 7, and a generally known material may be adopted. Examples thereof include glass substrate, sapphire substrate, printed circuit board, TFT array substrate, and ceramic substrate.

For the present invention, the total thickness of the insulation layer including the cured film and the inorganic insulation film is preferably 5 μm to 100 μm.

If the total thickness of the insulation layer including the cured film and the inorganic insulation film is preferably 5 μm to 100 μm, it serves to prevent the light beams emitted in all directions from the light emitting elements 2 from being absorbed in the cured film 3 to ensure an increased light extraction efficiency and realize an increased brightness. In addition, it also serves to decrease the height of the display device itself that includes light emitting elements and shorten the wire length, thereby realizing the prevention of wiring defects such as short circuits in wires, suppression of loss reduction, and improvement in high speed response.

The total thickness of the insulation layer including the cured film and the inorganic insulation film means the total thickness of the stack of continuously disposed cured film layers in which at least part of each cured film layer is in contact with another cured film layer or the inorganic insulation film. For example, in the case where multiple layers including cured film 3 and inorganic insulation film 19 are stacked as described above as in FIG. 1, the distance denoted by 18 in FIG. 1 shows the total thickness of the insulation layer including the cured film and the inorganic insulation film. The total thickness is preferably 7 to 70 μm and more preferably 8 to 60 μm. If it is less than 5 μm, the metal wires will not be protected adequately and wiring defects such as short circuits may occur in the wires, whereas if it is more than 100 μm, problems may likely to occur in some cases such as insufficient light extraction efficiency as well as hindrance to a decrease in the height of the display device itself and shortening of the wire length that can serve for the prevention of wiring defects such as short circuits in wires, suppression of loss reduction, and improvement in high speed response.

Furthermore, when a stack of a plurality of cured film layers is adopted, it is preferable for the number of stacked cured film layers to be two or more and 10 or less. Here, in the case where an inorganic insulation film is disposed between cured film layers, the inorganic insulation film is not included in the number of cured film layers.

From the viewpoint of disposing a plurality of light emitting elements, it is preferable to adopt two or more cured film layers. It is more preferable to adopt three or more cured film layers because it serves to increase the number of metal wires that can be connected to the light emitting elements, thus allowing a plurality of light emitting elements to be arranged. On the other hand, the number of layers is preferably 10 or less from the viewpoint of decreasing the package height and shortening the wire length, which serves for prevention of wiring defects such as short circuits in wires, reduction in loss, and improvement in high speed response.

Figure 2:
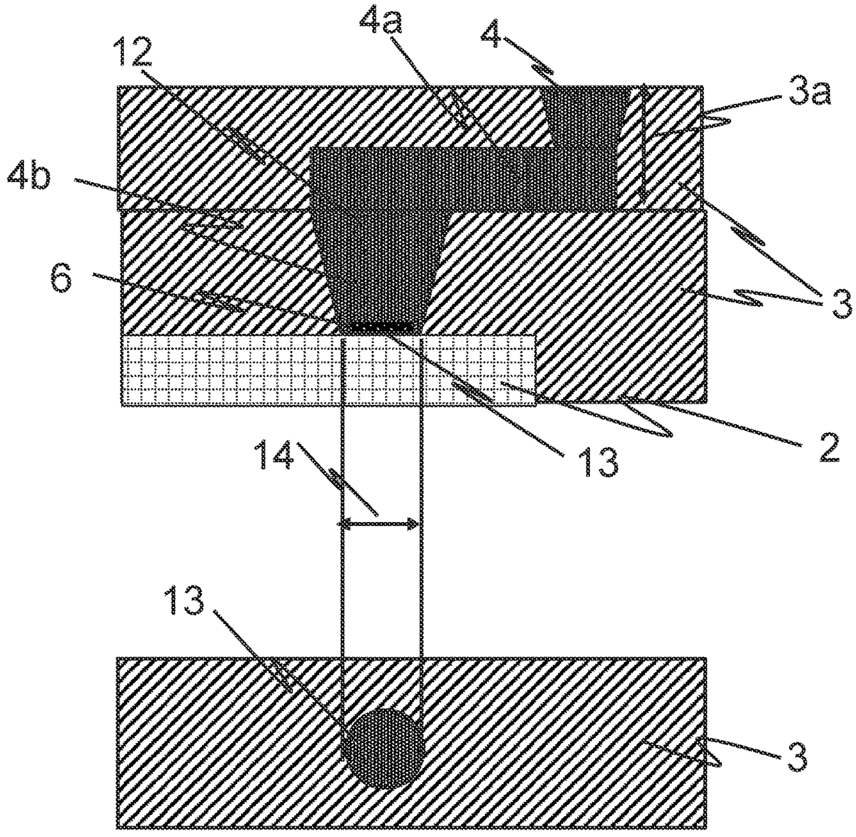
FIG. 2 This gives an enlarged frontal sectional view (upper part) of the designated region A and a bottom face view (lower part) of the designated region A excluding the light emitting elements.

The present invention is characterized by a structure in which a cured film has a hole pattern that penetrates it in the thickness direction, with metal wires extending at least in the hole pattern. The bottom face portion of each metal wire, which is formed at a position where it is in contact with a light emitting element, preferably has a maximum size of 2 to 20 μm FIG. 2 gives an enlarged frontal sectional view (upper part) of the designated region A defined in FIG. 1 and a bottom face view (lower part) of the designated region A excluding the light emitting elements. In the enlarged frontal sectional view (upper part) of the designated region A shown in FIG. 2, cured film layers 3 are disposed on a light emitting element 2. In the diagram, a hole pattern 12 is provided in the cured film layers 3, and a metal wire 4 is provided in the hole pattern 12. The metal wire 4 extends in the cured film layers 3 and comes in contact with the electrode terminal 6 of the light emitting element 2. The bottom face portion 13 of the metal wire 4 shows the shape of the metal wire 4 at the position where it comes in contact with the electrode terminal 6 of the light emitting element 2.

The bottom face portion 13 is shown in the bottom face view (lower part) of the designated region A excluding the light emitting element in FIG. 2. In this view, the light emitting element 2 is excluded and the bottom face portion 13 of the metal wire 4 that extends in the cured film layers 3 is seen from below. The shape of the bottom face portion 13 may depend on the features of a particular product or the form of its light emitting elements. When it is a circle, the diameter is defined as the maximum size 14; when it is an ellipse, the major axis is defined as the maximum size 14; and when it is a polygon such as rectangle, the longest of the diagonals that connect the apexes in the corners is defined as the maximum size 14. Here, FIG. 2 illustrates an example in which the bottom face portion 13 in the bottom face view (lower part) of the designated region A excluding the light emitting element has a circular shape.

This constitution serves to apply minute light emitting elements and achieve high-density mounting of a plurality of light emitting elements to make it possible to develop a wide range of display devices with different sizes that have high resolution light emitting elements. In addition, this serves to realize the formation of fine metal wires, production of cured film layers with a smaller total thickness due to an increase in the number of wires that can be formed in a unit area, prevention of the light beams emitted in all directions from the light emitting elements 2 from being absorbed in the cured film 3 to ensure an increase in the light extraction efficiency and an improvement in brightness. In addition, it also serves to decrease the height of the display device itself that includes light emitting elements and shorten the wire length, thereby realizing the prevention of wiring defects such as short circuits in wires, suppression of loss reduction, and improvement in high speed response.

For the present invention, the bottom face portion of a metal wire that is formed at a position in the vicinity of a light emitting element may have a maximum size of 2 to 20 μm.

This constitution serves to apply minute light emitting elements and achieve high-density mounting of a plurality of light emitting elements to make it possible to develop a wide range of display devices with different sizes that have high resolution light emitting elements. In addition, this serves to realize the formation of fine metal wires, production of cured film layers with a smaller total thickness due to an increase in the number of wires that can be formed in a unit area, prevention of the light beams emitted in all directions from the light emitting elements 2 from being absorbed in the cured film layers 3 to ensure an increase in the light extraction efficiency and an improvement in brightness. In addition, it also serves to decrease the height of the display device itself that includes light emitting elements and shorten the wire length, thereby realizing the prevention of wiring defects such as short circuits in wires, suppression of loss reduction, and improvement in high speed response.

From the viewpoint of the application of minute light emitting elements and high-density mounting of light emitting elements, it is preferable for the bottom face portion of a metal wire to have a maximum size of 2 to 15 μm, more preferably 2 to 10 μm, and still more preferably 2 to 5 μm. If it is less than 2 μm, its connection to the light emitting elements 2 may not be achieved appropriately, whereas if it is more than 20 μm, it may hinder the application of minute light emitting elements and high-density mounting thereof.

Furthermore, it is preferable for the thickness of the cured film to be 1.1 times or more and 4.0 times or less as large as the thickness of each metal wire.

To explain on the basis of the enlarged frontal sectional view (upper part) of the designated region A in FIG. 2, the thickness of a metal wire refers to the thickness of the metal wire 4*a* disposed on the surface the cured film 3 and it does not include the thickness of the metal wire 4*b* that extends in the hole pattern penetrating the cured film 3 in its thickness direction. The metal wire preferably has a thickness of 0.1 to 10 μm, more preferably 3 to 10 μm. If the metal wire has a thickness of 0.1 to 10 μm, it serves to decrease the height of the display device itself that includes light emitting elements and shorten the wire length, thereby realizing the prevention of wiring defects such as short circuits in wires, suppression of loss reduction, and improvement in high speed response. If it is 3 to 10 μm, furthermore, it serves to reduce the wiring resistance and contribute to decreasing the electric power consumption and increasing the brightness.

To explain on the basis of the enlarged frontal sectional view (upper part) of the designated region A in FIG. 2, the thickness of the cured film means the thickness of the cured film 3*a* that covers the metal wire 4*a*.

As a result, it becomes possible to produce a cured film with high reliability that can work as an appropriate protection film for metal wires and prevent wiring defects such as short circuits in wires.

Furthermore, for the present invention, it is preferable for the cured film to cover faces of each light emitting element other than the light extraction face.

Figure 3:
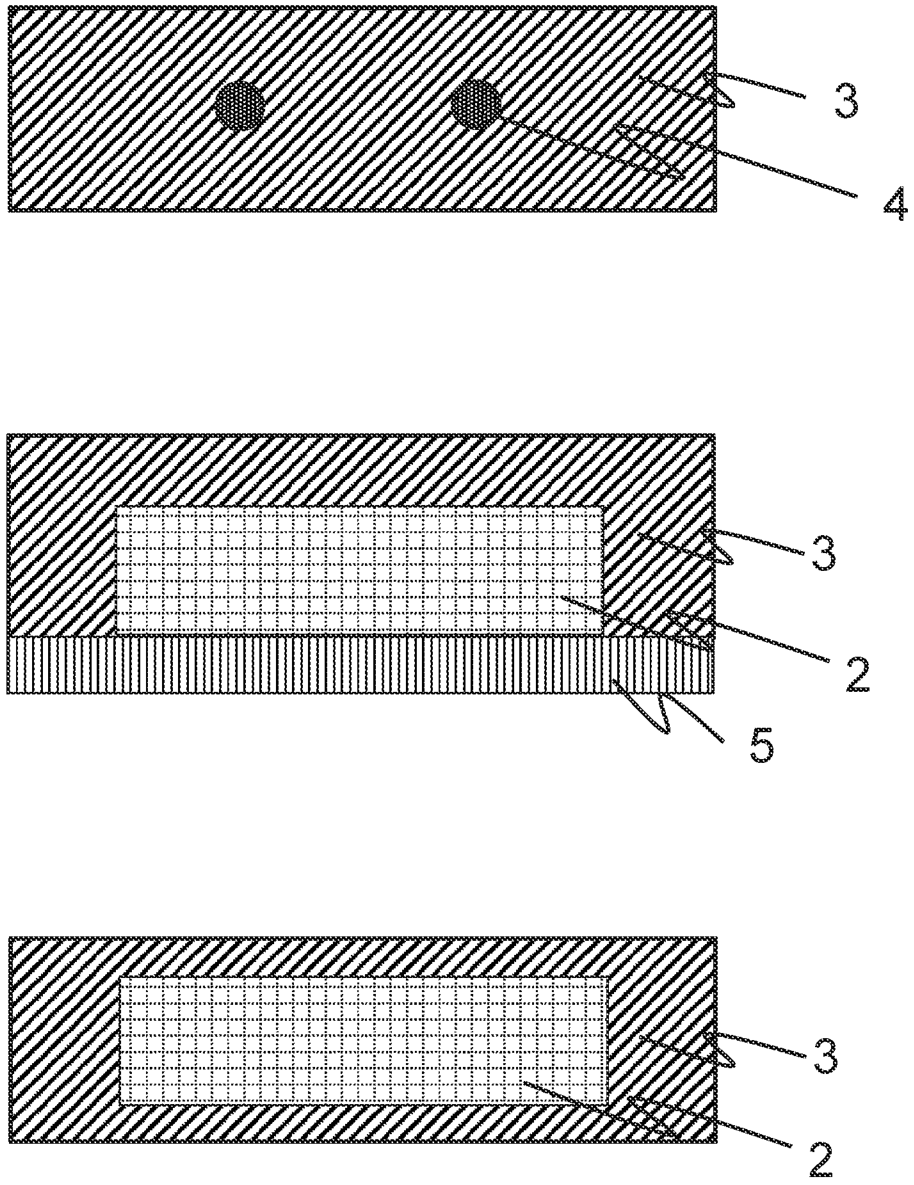
FIG. 3 This gives an enlarged top sectional view (upper part) of the designated region B, a cross-sectional view (middle part) along a plane perpendicular to the front face of the designated region B excluding the wires, and a bottom face view (lower part) of the designated region B excluding the opposite substrate.

As an example, FIG. 3 gives an enlarged top sectional view (upper part) of the designated region B defined in FIG. 1, a cross-sectional view (middle part) along a plane perpendicular to the front face of the designated region B excluding the wires, and a bottom face view (lower part) showing the designated region B excluding the opposite substrate.

In the enlarged top sectional view (upper part) of the designated region B in FIG. 3, the light emitting element 2 is covered by the cured film 3, and the metal wires 4, seen through the top face, are connected to the electrode terminals 6 of the light emitting element and extend in the cured film 3.

In the sectional view (middle part) along a plane perpendicular to the front face excluding the wires in FIG. 3, it is shown that the light emitting element 2 is covered by the cured film 3.

In the bottom face view (lower part) of the designated region B excluding the opposite substrate in FIG. 3, it is shown that the light emitting element 2 is covered by the cured film 3, but one face of the light emitting element 2 is left uncovered by the cured film 3.

As seen in FIG. 1 and FIG. 3, all side faces and the top face of the light emitting element 2 are covered by the cured film 3, and this allows the light emitting element 2 to be protected against external impact. This is preferable also because it serves to planarize the depressed surface that results from the formation of the light emitting elements 2 and also serves to allow an opposite substrate 5 to be attached easily.

Furthermore, for the present invention, it is preferable to provide reflecting films on the cured film.

Figure 4:
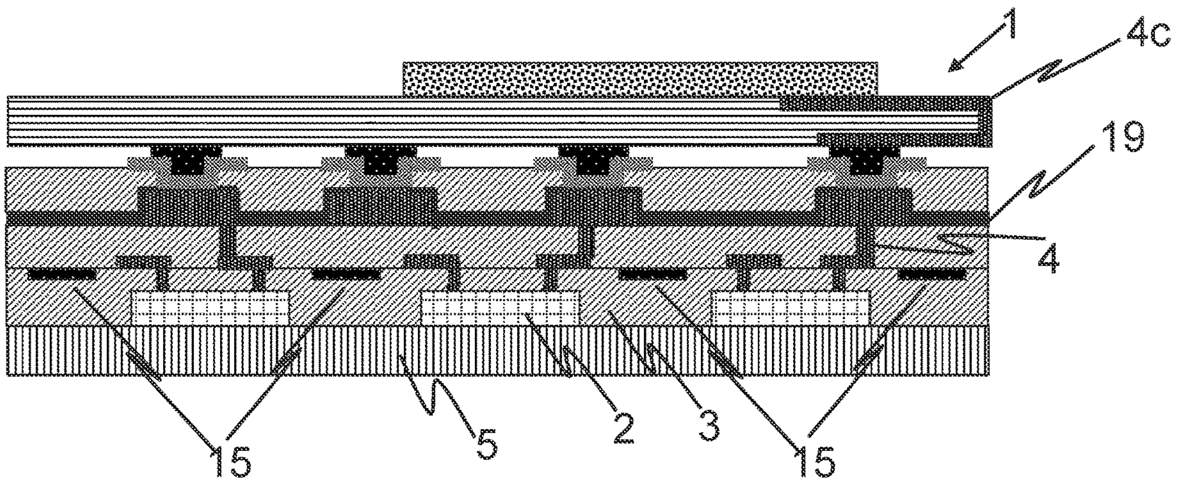
FIG. 4 This gives a frontal sectional view of an embodiment of the display device according to the present invention that has reflecting films.

In FIG. 4, reflecting films 15 are provided on the cured film 3 that surround the light emitting elements 2. If reflecting films 15 are provided on the cured film 3, it is preferable because light beams coming through the cured film 3 are reflected by the reflecting films 15 and serve not only to further increase the light extraction efficiency and improve the brightness, but also prevent the metal wires and cured film from being degraded by absorbed water and light, thereby serving to produce a display device with a low defective rate in reliability test.

These reflecting films can be provided at any appropriate positions in the cured film, and specifically, they may be disposed on the four faces surrounding each light emitting element around the light extraction direction, disposed diagonally to the light emitting element, or disposed along a curved line.

The reflecting films may be of any material as long as they can reflect light, and good materials include, but not limited to, aluminum, silver, copper, titanium, and alloys containing them.

For the present invention, it is preferable that partition walls having a thickness larger than the thickness of the light emitting elements be disposed between the multiple light emitting elements.

Figure 5:
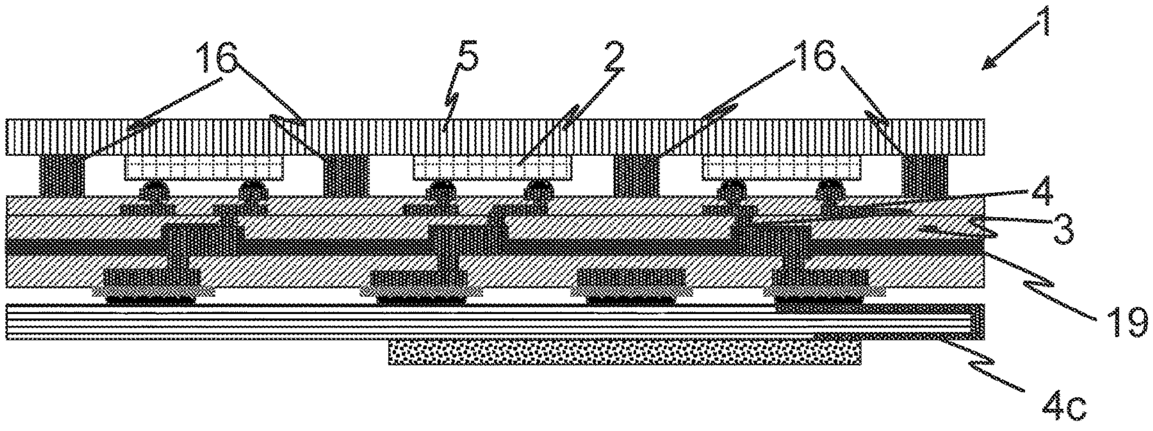
FIG. 5 This gives a frontal sectional view of an embodiment of the display device according to the present invention that has partition walls.

As shown in FIG. 5, it is preferable for partition walls 16 to be disposed in an appropriate repeating pattern that depending on the number of pixels contained in the display 1 that has the light emitting elements 2, and more specifically, they are preferably disposed between the light emitting elements 2 or around each of them. This constitution is preferable because it allows the opposite substrate 5 to be attached easily.

It is preferable for the thickness of each partition wall to be larger than the thickness of the light emitting elements, and more specifically, it is preferably 5 μm to 120 μm.

The partition wall may be constructed mainly of a cured film formed by curing a resin composition containing the resin (A) or may be of a material other than a resin composition containing the resin (A), and good materials include generally known ones such as epoxy resin, (meth) acrylic polymers, polyurethane, polyester, polyolefin, and polysiloxane. The use of these materials serves to form a partition wall having good adhesion property.

The partition wall may have a shading portion on a side face thereof or inside the partition wall itself in order to suppress light leakage from the light emitting elements and mixing of colors between pixels, thereby realizing improved contrast. The shading portion is a portion that contains a black pigment etc.

In addition, a reflecting film may also be provided on a side face of each partition wall in order to reflect light emitted from a light emitting element toward the partition wall, thereby ensuring an increased light extraction efficiency and realizing an increased brightness. The reflecting film is a portion that contains a white pigment etc.

It is preferable that partition walls having thicknesses larger than the thickness of the light emitting elements be disposed between the multiple light emitting elements in the cured film that covers the light emitting elements.

Figure 6:
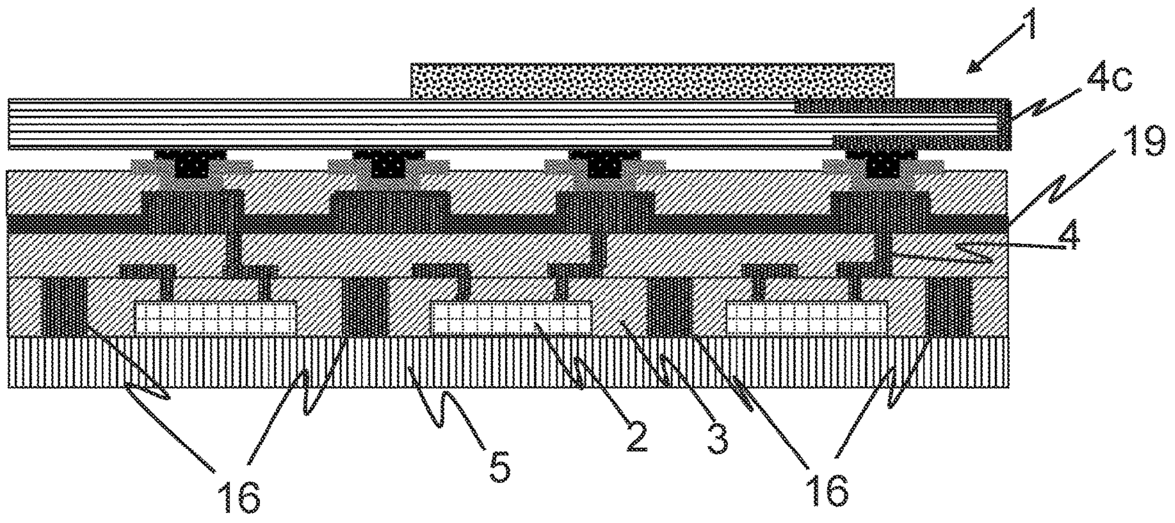
FIG. 6 This gives a frontal sectional view of an embodiment of the display device according to the present invention that has partition walls in the cured film.

FIG. 6, which gives another illustrative embodiment that uses partition walls, shows a structure in which partition walls 16 are disposed between or around the light emitting elements 2 in the cured film 3 that covers the light emitting elements 2.

The partition wall shown in FIG. 6 may be of a material other than a resin composition containing the resin (A), and good materials include generally known ones such as epoxy resin, (meth)acrylic polymers, polyurethane, polyester, polyolefin, and polysiloxane. The use of these materials serves to form partition walls having good adhesion property.

The disposition of such partition walls is preferable because they serve as marks when transferring the light emitting elements in a subsequent step and also because they can work as photospacers to allow the light emitting elements to be transferred more efficiently.

For the present invention, it is also preferable that not only partition walls having thicknesses larger than the thicknesses of the light emitting elements be disposed between the multiple light emitting elements, but also reflecting films are provided around the partition walls.

Figure 7:
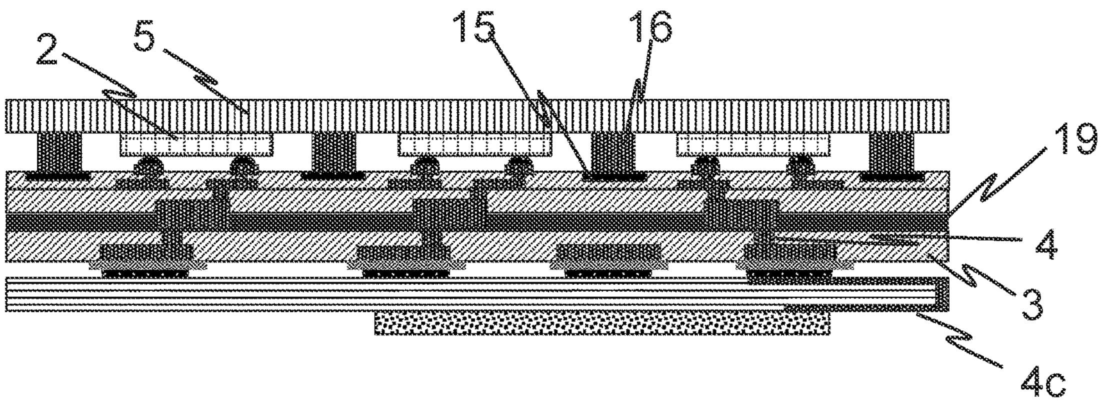
FIG. 7 This gives a frontal sectional view of an embodiment of the display device according to the present invention that has reflecting films and partition walls.
Figure 8:
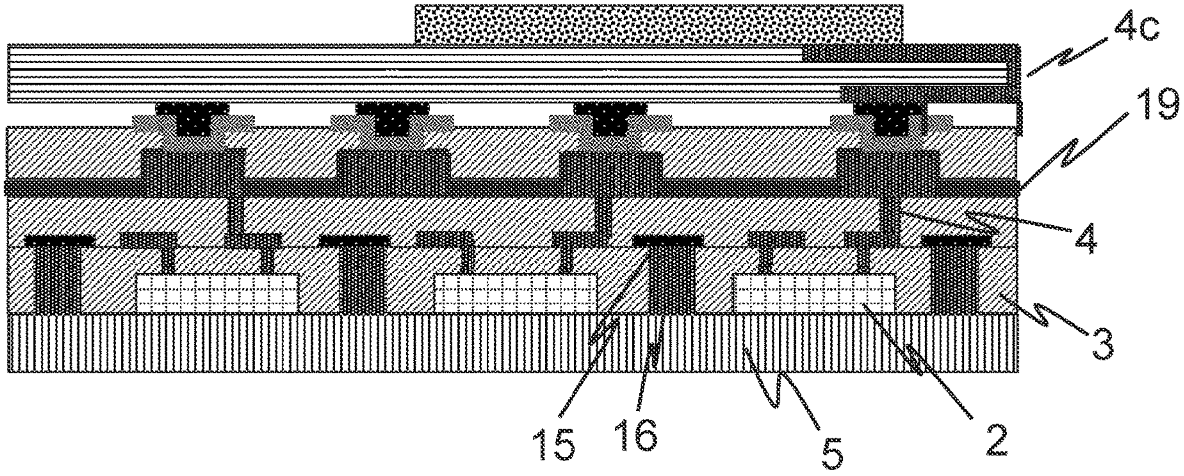
FIG. 8 This gives a frontal sectional view of an embodiment of the display device according to the present invention that has partition walls in the cured film and also has reflecting films disposed thereon.

Specifically, typical display structures are shown in FIG. 7 and FIG. 6, wherein not only partition walls 16 having thicknesses larger than the thicknesses of the light emitting elements 2 are disposed between the multiple light emitting elements 2, but also reflecting films 15 are provided around the partition walls.

The adoption of such a structure in which reflecting films are provided around the partition walls allows the light beams emitted from the light emitting elements to be reflected by the reflecting films disposed around the partition walls, thereby realizing an increased light extraction efficiency and an increased brightness.

For the present invention, light diffusion layers may be provided around the light emitting elements, the cured film, or the metal wires.

For the present invention, the light emitting element is preferably an inorganic light emitting diode with a side length of 5 μm or more and 700 μm or less, and the light emitting element is more preferably an inorganic light emitting diode with a side length of 5 μm or more and 100 μm or less.

An inorganic light emitting diode consists mainly of a p-type semiconductor and an n-type semiconductor joined through a p-n junction. When a voltage is applied in the normal direction to the inorganic light emitting diode, electrons and positive holes will move through the chip to cause an electric current. In this process, electrons and positive holes are recombined to cause an energy difference, and the surplus energy is converted into light energy to cause light emission. The wavelength of the light emitted from an inorganic light emitting diode depends on the compounds, such as GaN, GaAs, InGaAlP, or GaP, that constitute the semiconductors, and the difference in wavelength defines the color of the light to be emitted. In general, a white color is created by mixing two or more light beams of different colors, and in the case of an inorganic light emitting diode, largely improved color reproducibility is realized by mixing the three primary colors of red, green, and blue, thereby creating a more natural white color.

In regard to the shape, there are bullet-like, chip-like, and polyhedral inorganic light emitting diodes, of which chip-like and polyhedral ones are preferable from the viewpoint of the production of minute inorganic light emitting diodes. In addition, it is preferable to use inorganic light emitting diodes with a side length of 5 μm or more and 700 μm or less because it allows a plurality of chips to be arranged, and it is more preferable to adopt inorganic light emitting diodes with a side length of 5 μm or more and 100 μm or less.

Figure 27:
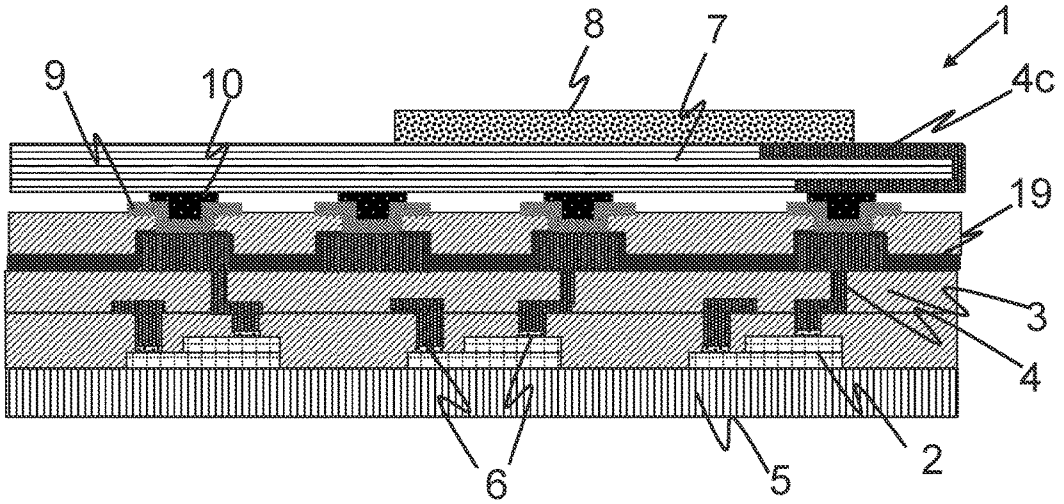
FIG. 27 This gives a frontal sectional view of an embodiment of the display device according to the present invention that has another example of light emitting elements.

Furthermore, for the present invention, it is preferable to provide a reflecting film on each of the discontinuous surfaces. Rather than a continuous surface, such discontinuous surfaces may be, for example, surfaces different in steps, forming a structure as shown in FIG. 27. If electrode terminals 6 are disposed on discontinuous surfaces, it serves to control the light emitting areas in the light emitting elements and ensure that the light emitting elements have improved productivity and light emitting efficiency.

To mount inorganic light emitting diodes on a substrate such as light emitting element driving substrate 7, there are some methods proposed so far including, but not limited to, the pick-and-place method and mass transfer method.

Available techniques for mounting inorganic light emitting diodes on a substrate such as light emitting element driving substrate 7 include, for example, a technique in which inorganic light emitting diodes that emit red, green, and blue light beams are disposed at appropriate positions in a matrix-like array on a light emitting element driving substrate 7 and a technique in which inorganic light emitting diodes that emit red and blue light beams or a single color inorganic light emitting diode such as ultraviolet inorganic light emitting diode that emits an ultraviolet light beam are mounted on a substrate such as light emitting element driving substrate. The latter technique serves for easy mounting of inorganic light emitting diodes in an array. In this case, full color display can be realized by forming red, green, and blue sub-pixels using a wavelength conversion material such as quantum dots.

A generally known substance may be used as the wavelength conversion material.

In the case of using inorganic light emitting diodes that emit blue light beams, for example, it is preferable that only an array of inorganic light emitting diodes that emit blue light beams be mounted first to prepare an inorganic light emitting diode array substrate, then followed by forming wavelength conversion layers in which excitation by blue light is caused to convert wavelengths to emit red and green light beams at the positions corresponding to red and green sub-pixels. This makes it possible to form red, green, and blue sub-pixels by using only inorganic light emitting diodes that emit blue light beams.

On the other hand, in the case of using ultraviolet inorganic light emitting diodes that emit ultraviolet light beams, it is preferable that an array of ultraviolet inorganic light emitting diodes alone be mounted first to prepare an inorganic light emitting diode array substrate, followed by forming wavelength conversion layers in which excitation by ultraviolet light beams is caused to convert wavelengths and emit red, green, and blue light beams at the positions corresponding to red, green, and blue sub-pixels. This serves to reduce the difference in light emission angle among different sub-pixel colors that are described above.

As the wavelength conversion layer, generally known ones may be used and color filters etc. may also be used as required.

As the opposite substrate used for the present invention, a glass plate, resin plate, resin film, or the like may be applied. When using a glass plate, it is preferable to adopt a plate of non-alkali glass. Preferable materials for such a resin plate or resin film include polyester, (meth)acrylic polymers, transparent polyimide, and polyether sulfone. It is preferable for such a glass plate and resin plate to have a thickness of 1 mm or less, more preferably 0.8 mm or less. The thickness of the resin film is preferably 100 μm or less.

For the present invention, it is preferable that the display device have a drive element and that the light emitting elements be electrically connected to the drive element by metal wires extending in the cured film. If the display device has a drive element and the light emitting elements are electrically connected to the drive element by metal wires extending in the cured film, it serves to perform switching-driving of a plurality of light emitting elements separately.

Useful drive elements include driver ICs. A plurality of driver ICs with different functions may be applied to one inorganic light emitting diode or one group of red, blue, and green inorganic light emitting diodes.

Figure 9:
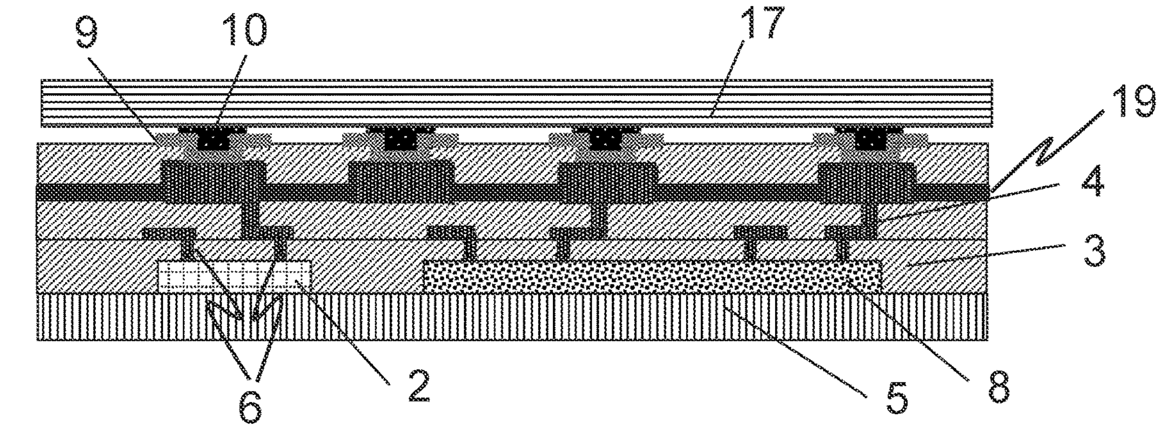
FIG. 9 This gives a frontal sectional view of an embodiment of the display device according to the present invention that has a structure in which a drive element is disposed in the cured film.
Figure 10:
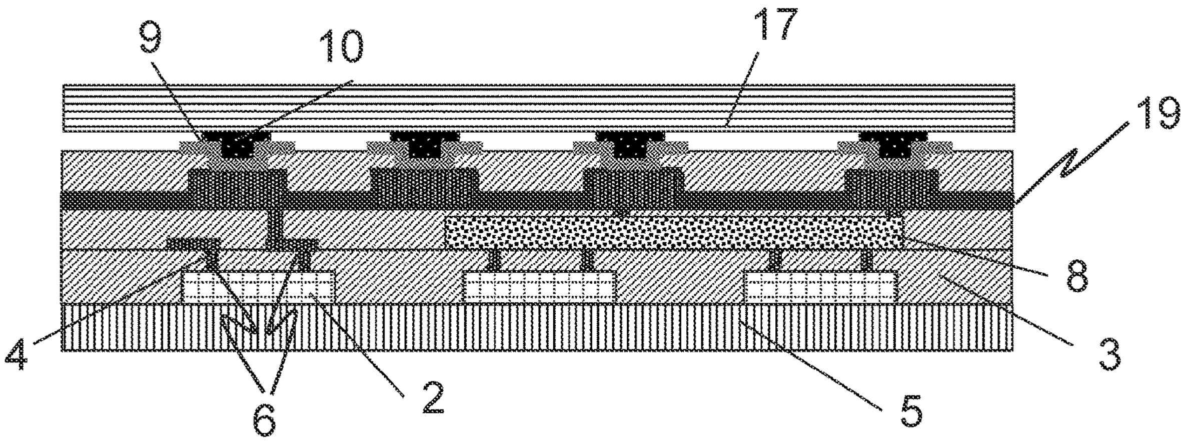
FIG. 10 This gives a frontal sectional view of an embodiment of the display device according to the present invention that has another structure in which a drive element is disposed in the cured film.

Furthermore, in regard to the structure of arranged drive elements, it is preferable to adopt a structure in which the drive element 8 is contained in the cured film 3 in such a manner that it is disposed on the opposite substrate 5 and near the light emitting element 2 as illustrated in FIG. 9. It is also preferable to adopt a structure in which the drive element 8 is contained in the cured film and disposed at a level above the light emitting element 2 as illustrated in FIG. 10.

This serves to shorten the wire length, thereby realizing the prevention of wiring defects such as short circuits in wires, suppression of loss reduction, and improvement in high speed response.

For the present invention, it is preferable that a drive element and a substrate be included in such a manner that the drive element is connected to the light emitting elements by metal wires and that at least part of the metal wires extend along a side face of the substrate. If a drive element and a substrate are included in such a manner that the drive element is connected to the light emitting elements by metal wires and that at least part of the metal wires extend along a side face of the substrate, it serves not only to allow switching-driving of a plurality of light emitting elements separately, but also decrease the height of the display device itself and enhance the high speed response, thereby realizing the production of a smaller display device with a smaller frame.

As in the case of the light emitting element driving substrate 7, there are no specific limitations on the substrate and a generally known one may be adopted. Examples thereof include glass substrate, sapphire substrate, printed circuit board, TFT array substrate, and ceramic substrate. The metal wires at least part of which extend along a side face of the substrate may be of, for example, gold, silver, copper, aluminum, nickel, titanium, tungsten, aluminum, tin, chromium, or an alloy containing them. Furthermore, useful techniques that can be used to form the metal wires extending along a side face of the substrate include, for example, wet plating techniques such as electroless plating and electrolytic plating, CVD (chemical vapor deposition) techniques (CVD) such as thermal CVD, plasma CVD, and laser CVD, dry plating techniques such as vacuum deposition, sputtering, and ion plating, and others such as bonding of metal foil to a substrate and subsequent etching. It is also good to provide a groove along a side face of the substrate. In this case, the groove works to separate mutually adjacent metal wires completely, thereby preventing short circuits from occurring between metal wires. A groove for arranging such a side face conductor wire can be produced by such a technique as cutting, etching, and laser processing.

It is preferable for such metal wires to be laid, for example, as denoted by **4*c* in FIG. 1 and FIG. 5**.

For the present invention, the metal wires may be in the form of electrically conductive films. Useful materials for such electrically conductive films include, for example, compounds containing, as primary component, an oxide of at least one substance selected from indium, gallium, zinc, tin, titanium, niobium, or the like, and photosensitive electrically conductive pastes containing organic substances and electrically conductive particles, and other generally known ones may also be used.

Specific examples of such compounds containing, as primary component, an oxide of at least one substance selected from indium, gallium, zinc, tin, titanium, niobium, or the like include indium tin zinc oxide (ITZO), indium gallium zinc oxide (IGZO; InGaZnO), zinc oxide (ZnO), indium zinc oxide (IZO), indium gallium oxide (IGO), indium tin oxide (ITO), and indium oxide (InO).

These electrically conductive films can be produced by, for example, wet plating techniques such as electroless plating and electrolytic plating, CVD (chemical vapor deposition) techniques (CVD) such as thermal CVD, plasma CVD, and laser CVD, dry plating techniques such as vacuum deposition, sputtering, and ion plating, and others such as bonding of metal foil to a substrate and subsequent etching.

In the photosensitive electrically conductive pastes containing organic substances and electrically conductive particles, it is preferable for the electrically conductive particles to account for 60 to 90 mass %. If an electrically conductive layer containing an organic substance is used, it serves to prevent disconnection in curved faces, bendable portions, etc., to ensure a higher electric conductivity. If the content of electrically conductive particles is less than 60 mass %, the probability of contact between electrically conductive particles decreases, leading to a lower electric conductivity. In addition, electrically conductive particles may be separated from each other easily in bendable portions of the wires. The content of electrically conductive particles is preferably 70 mass % or more. On the other hand, if the content of electrically conductive particles is more than 90 mass %, it will be difficult to form a good wiring pattern and disconnection will occur easily in bendable portions. The content of electrically conductive particles is preferably 80 mass % or less.

Examples of useful organic substances include epoxy resin, phenoxy resin, acrylic copolymers, and epoxy carboxylate compounds. Two or more of these may be contained together. An organic substance having a urethane bond may also be contained. The inclusion of a substance having a urethane bond can serve to ensure improved flexibility of the wires. Furthermore, it is preferable for the organic substance in use to show photosensitivity because it serves to form a fine wire pattern easily by photolithography. Photosensitivity can be developed by, for example, adding a photo initiator or a component having an unsaturated double bond.

For the present invention, the electrically conductive particles are particles that contain a substance having an electric resistivity of $10^{-5}$ Ω·m or less. Useful materials for the electrically conductive particles include, for example, silver, gold, copper, platinum, lead, tin, nickel, aluminum, tungsten, molybdenum, chromium, titanium, indium, and alloys of these metals, as well as carbon particles. Furthermore, it is preferable that two or more types of electrically conductive particles be contained. If two or more types of electrically conductive particles are contained, it serves, in the heat treatment step described later, to prevent the sintering of electrically conductive particles of the same type that can cause volume shrinkage, and as a result, reduce the overall volume shrinkage of the electrically conductive film, leading to a higher bendability.

It is preferable for the electrically conductive particles to have an average particle diameter of 0.005 to 2 μm. Here, in the case where two or more types of electrically conductive particles are contained, the average particle diameter referred to above means the average particle diameter of the particles with the larger diameter. If the electrically conductive particles have an average particle diameter of 0.005 μm or more, it serves to maintain moderate interaction between electrically conductive particles, thereby allowing the electrically conductive particles to be in a stabler dispersed state. It is more preferable for the electrically conductive particles to have an average particle diameter of 0.01 μm or more. On the other hand, if the electrically conductive particles have an average particle diameter of 2 μm or less, it serves to produce a desired wiring pattern more easily. It is more preferable for the electrically conductive particles to have an average particle diameter of 1.5 μm or less.

It is preferable for the electrically conductive film to have a thickness of 2 to 10 μm. If the electrically conductive film has a thickness of 2 μm or more, it serves to prevent disconnection in bendable portions to ensure a higher electric conductivity. It is more preferable for the electrically conductive film to have a thickness of 4 μm or more. On the other hand, if the electrically conductive film has a thickness of 10 μm or less, it serves to produce a wiring pattern more easily in the manufacturing process. It is more preferable for the electrically conductive film to have a thickness of 8 μm or less.

In regard to the constitution of the electrically conductive film, it is preferable, for example, to adopt structures as shown in FIG. 23 to FIG. 26 where it is denoted by 23.

For the present invention, it is preferable to further provide light shading portions between the multiple light emitting elements. If light shading portions are provided between the multiple light emitting elements, they serve to suppress light leakage from the light emitting elements and mixing of colors between pixels and realize improved contrast without suffering a significant decrease in the reliability and light extraction efficiency.

Such light shading portions may be constructed mainly of a cured film formed by curing a resin composition containing the resin (A) and a coloring material (E) or may be of a material other than a resin composition containing the resin (A), and good materials include generally known ones such as epoxy resin, (meth)acrylic polymers, polyurethane, polyester, polyolefin, and polysiloxane. A black pigment may be used as the coloring material (E), and good materials include, for example, black organic pigments such as carbon black, perylene black, and aniline black, and inorganic pigments including graphite and fine particles of metal such as titanium, copper, iron, manganese, cobalt, chromium, nickel, zinc, calcium, and silver, as well as metal oxides, composite oxides, metal sulfides, metal nitrides, and metal oxynitrides thereof. Furthermore, a red pigment and a blue pigment may be combined, along with a yellow pigment and other pigments as required, to provide a black mixture. Dyes may also be used. Two or more coloring materials may be contained together.

The resin composition containing a resin (A) and a coloring material (E) may be made photosensitive, and a photosensitizing agent (B) as described later may be used.

For example, a preferable method to produce a resin composition containing a resin (A) and a coloring material (E) is to disperse a resin solution containing a resin (A) and a coloring material (E), along with a dispersant and an organic solvent as required, using a disperser to prepare a coloring material dispersion liquid with a high coloring material concentration, followed by further adding the resin (A) and other components such as photosensitizing agent as required and stirring the liquid. Filtration may be performed as required.

Examples of the disperser include ball mill, bead mill, sand grinder, triple roll mill, and high-speed impact mill. In particular, from the viewpoint of realizing a higher dispersion efficiency and finer dispersion, the use of a bead mill is preferable. Examples of the bead mill include CoBall Mill, basket mill, pin mill, and dyno mill. Examples of beads to use in bead mills include titania beads, zirconia beads, and zircon beads. For these bead mills, it is preferable to use beads with diameters of 0.03 to 1.0 mm. If the diameter of primary particles and the diameter of secondary particles formed of aggregated primary particles are small in the coloring material (E), it is preferable to use fine beads with diameters of 0.03 to 0.10 mm. In this case, it is preferable to adopt a bead mill equipped with a centrifugal separation type separator that can separate the fine beads from the dispersion liquid. On the other hand, to disperse a coloring material containing bulky particles of a submicronic size, the use of beads with diameters of 0.10 mm or more is preferable because large crushing force can be realized.

A resin composition containing a resin (A) and a coloring material (E) may be spread over a substrate, which can be selected from various appropriate ones, dried, and then heat-treated to form a shading portion. When it has photosensitivity, light irradiation is performed by applying actinic ray as described later, followed by development and heat treatment steps as described later to form a patterned shading portion.

It is preferable for the shading portion to have a thickness of 0.1 to 5 μm. If the shading portion has a thickness of 0.1

μm or more, it serves to suppress light leakage from the light emitting elements and mixing of colors between pixels and realize increased contrast. It is more preferable for the shading portion to have a thickness of 0.5 μm or more. On the other hand, if the wire has a thickness of 5 μm or less, it serves to suppress light leakage from the light emitting elements and mixing of colors between pixels and realize increased contrast without suffering a significant decrease in light extraction efficiency. It is more preferable for the shading portion to have a thickness of 4 μm or less.

The shading portion is produced preferably by forming a colored film with a film thickness of 1.0 μm on a non-alkali glass plate with a thickness of 0.7 mm in such a manner that the reflection chromaticity value (a*, b*), which is the chromaticity measured from the glass surface, is in the range of $-0.5 \leq a^* \leq 1.0$ and $-1.0 \leq b^* \leq 0.5$, more preferably $-0.5 \leq a^* \leq 0.5$ and $-1.0 \leq b^* \leq 0.4$. Reflection chromaticity represents the color tone of an image reflected in the colored film and the reflection color tone can be said to become more achromatic as the (a*, b*) values come closer to (0.0, 0.0). Compared to this, the reflection color tone in a black portion of a liquid crystal display or an organic EL display generally has a negative b* value and is bluish, and accordingly, it is preferable for a decorating film used in a display device to have a negative b* value.

To determine the reflection chromaticity (L*,a*,b*) of a colored film, a spectrophotometer (CM-2600d, manufactured by Konica Minolta, Inc.) calibrated with a white calibration plate (CM-A145, manufactured by Konica Minolta, Inc.) is used, and the total reflection chromaticity (SCI) of light coming through the transparent base is measured under the measuring conditions including the use of a standard light source D65 (color temperature 6504K), view angle of 2° (CIE1976), atmospheric pressure, and 20° C.

Figure 22:
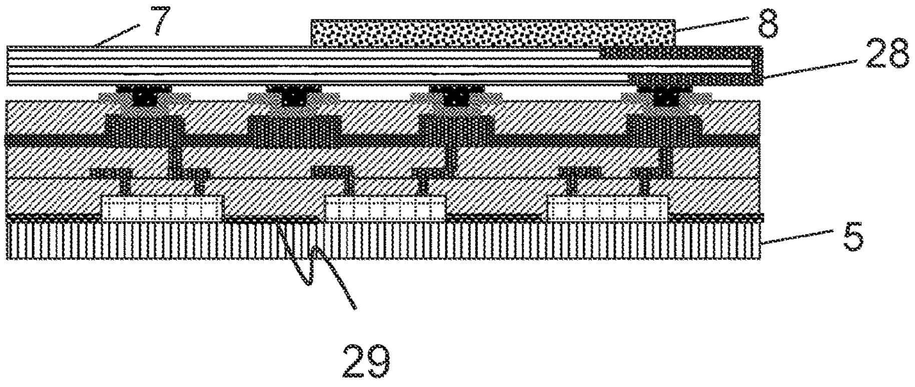
FIG. 22 This gives a frontal sectional view of an embodiment of the display device according to the present invention that has a shading portion.
Figure 23:
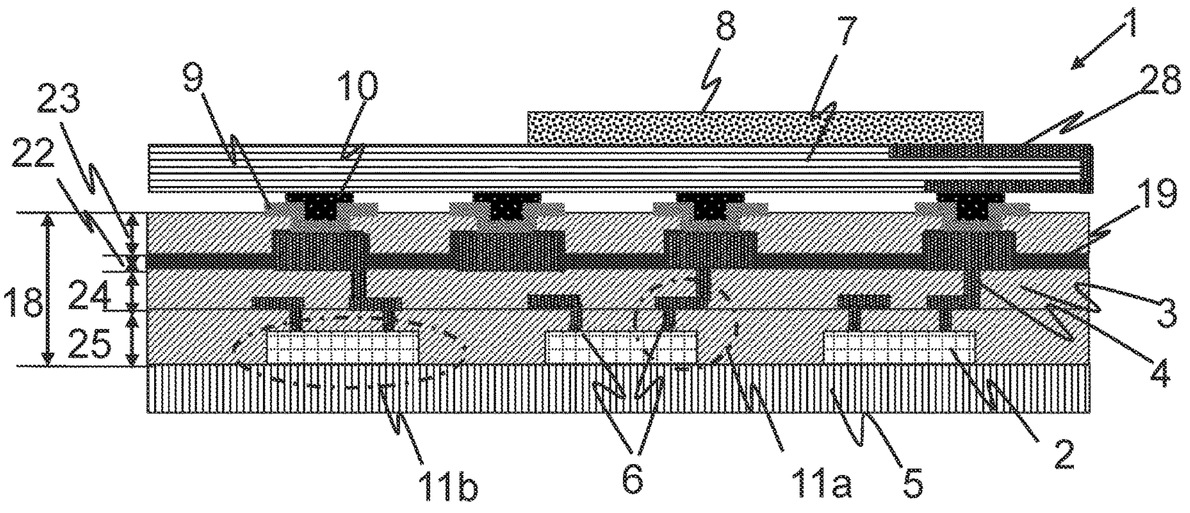
FIG. 23 This gives a frontal sectional view of an embodiment of the display device according to the present invention that has an electrically conductive film.
Figure 24:
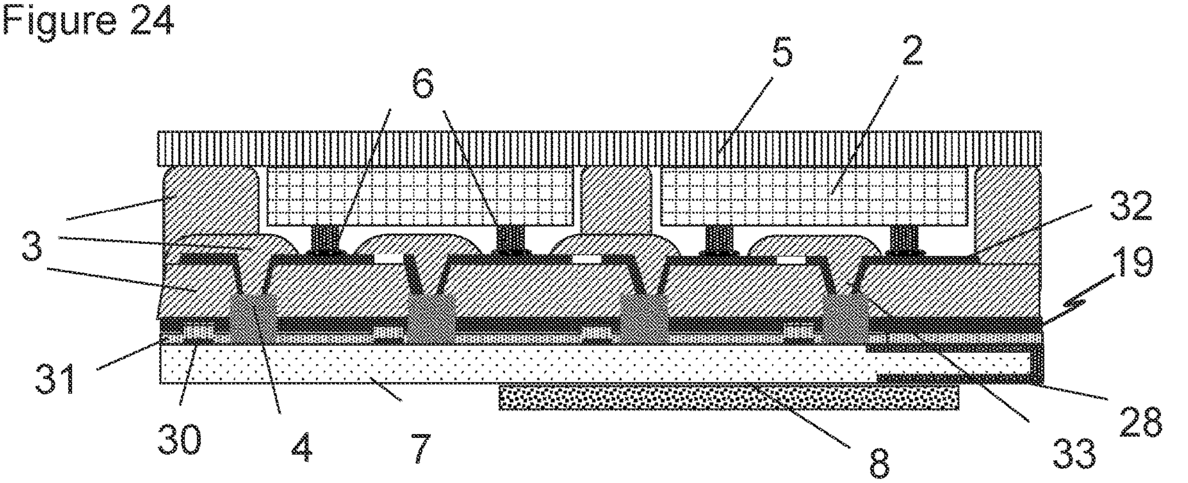
FIG. 24 This gives a frontal sectional view of another embodiment of the display device according to the present invention that has an electrically conductive film.
Figure 25:
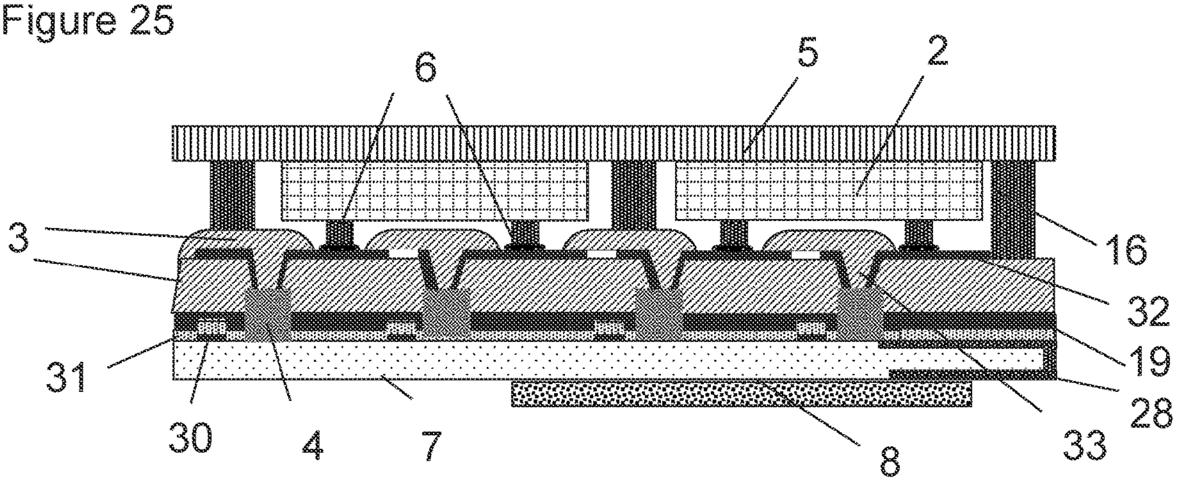
FIG. 25 This gives a frontal sectional view of another embodiment of the display device according to the present invention that has an electrically conductive film.
Figure 26:
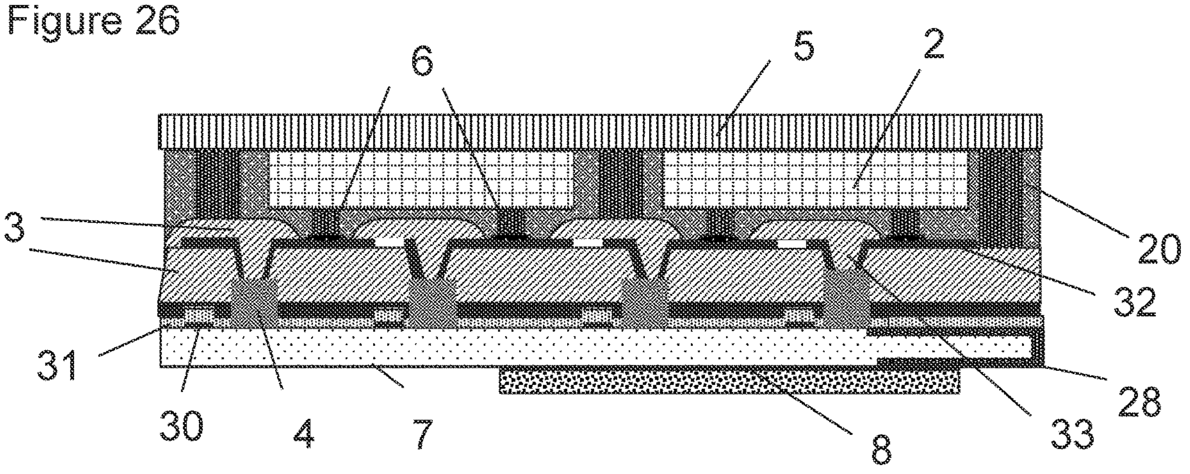
FIG. 26 This gives a frontal sectional view of another embodiment of the display device according to the present invention that has an electrically conductive film.

In regard to the constitution of the shading portion, it is preferable, for example, to adopt a structure as shown in FIG. 22 where it is denoted by 29. The shading portion 29 may be either in contact with the light emitting elements 2 or separated from them.

For the present invention, in the cured film formed by curing a resin composition containing a resin (A), it is preferable for the resin (A) to have a high heat resistance. Specifically, it preferably suffers little resin degradation when exposed to heat at a high temperature of 160° C. or more during heat treatment or after heat treatment and undergoes little formation of a quinone structure, which is a coloring structure, or the like as a result of resin degradation, resin decomposition, etc. Furthermore, such a cured film is preferable because it is low in outgassing rate, which is a good characteristic for a cured film to be used as, for example, insulation film, protection film, or partition wall in a display device.

Furthermore, from the viewpoint of the formation of an intended hole pattern by light exposure and development, it is preferable that before the curing step, the resin (A) have a high light transmittance at the exposure wavelength.

To realize such characteristics, good methods include, for example, shortening the conjugated chains derived from aromatic rings in the resin and reducing the movement of electric charges in a molecule or between molecules.

For protection of the metal wires, furthermore, it is preferably high in processability even when having a large thickness of 10 μm or more.

There are no specific limitations on the resin (A), but it is preferably an alkali-soluble resin from the viewpoint of environmental load reduction. To determine the alkali-solubility, a solution prepared by dissolving the resin in γ-butyrolactone is spread over a silicon wafer and prebaked at 120° C. for 4 minutes to form a prebaked film having a film thickness of 10±0.5 μm. Then, the prebaked film is immersed for 1 minute in an alkaline aqueous solution at 23±1° C. selected from a 2.38 mass % aqueous tetramethyl ammonium hydroxide solution, a 1 mass % aqueous potassium hydroxide solution, and a 1 mass % aqueous sodium hydroxide solution, and then rinsed with pure water, followed by measuring the decrease in film thickness. If the prebaked film is dissolved at a dissolution rate of 50 nm/min or more, then the resin is defined as alkali-soluble.

The resin (A) preferably contains one or more resins selected from the group consisting of polyimide, polyimide precursor, polybenzoxazole, polybenzoxazole precursor, and copolymers thereof. The resin (A) may contain only one of these resins or may contain a combination of two or more of these resins.

Described below are the polyimide, polyimide precursor, polybenzoxazole, and polybenzoxazole precursor.

There are no specific limitations on the polyimide as long as it has an imide ring. There are no specific limitations on the polyimide precursor as long as it has a structure that can form an imide ring-containing polyimide when undergoing dehydration-cyclization, and it may contain polyamic acid, polyamic acid ester, etc. There are no specific limitations on the polybenzoxazole as long as it has an oxazole ring. There are no specific limitations on the polybenzoxazole precursor as long as it has a structure that can form a benzoxazole ring-containing polybenzoxazole when undergoing dehydration-cyclization, and it may contain polyhydroxyamide, etc.

The polyimide has a structural unit as represented by the general formula (1); the polyimide precursor and polybenzoxazole precursor have structural units as represented by the general formula (2) given below; and the polybenzoxazole has a structural unit as represented by the general formula (3). Two or more of these may be contained and a resin formed by copolymerizing a structural unit as represented by the general formula (1), a structural unit as represented by the general formula (2), and a structural unit as represented by the general formula (3) may be contained.

[Chemical compound 1]

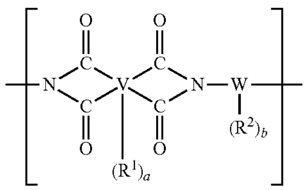

(1)

In the general formula (1), V is a tetravalent to decavalent organic group having 4 to 40 carbon atoms and W is a divalent to octavalent organic group having 4 to 40 carbon atoms; a and b each denote an integer of 0 to 6; $R^1$ and $R^2$ each denote one selected from the group consisting of a hydroxyl group, carboxyl group, sulfonic group, and thiol group; and the plurality of $R^1$'s and $R^2$'s may be identical to or different from each other.

[Chemical compound 2]

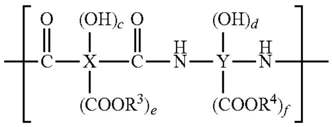

(2)

In the general formula (2), X and Y each independently denote a divalent to octavalent organic group having 4 to 40 carbon atoms; $R^3$ and $R^4$ each independently denote a hydrogen atom or a monovalent organic group containing 1 to 20 carbon atoms; c and d each denote an integer of 0 to 4; and e and f each denote an integer of 0 to 2.

[Chemical compound 3]

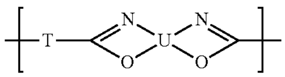

(3)

In the general formula (3), T and U each independently denote a divalent to octavalent organic group having 4 to 40 carbon atoms.

In the general formula (1), it is preferable that a+b>0 in order to allow the resin (A) to be alkali-soluble.

In the general formula (2), furthermore, it is preferable that c+d+e+f>0. In the case where the general formula (2) represents a polyimide precursor, it is preferable that X and Y in the general formula (2) each have an aromatic group. Furthermore, the general formula (2) has an aromatic group in X, meets the relation e>2, and has a carboxyl group or a carboxy ester group at the ortho position of the aromatic amide group. The structure forms an imide ring through dehydration-cyclization.

In the case where the general formula (2) represents a polybenzoxazole precursor, the general formula (2) has an aromatic group in X, meets the relation d>0, and has a hydroxyl group at the ortho position of the aromatic amide group. The structure forms a benzoxazole ring through dehydration-cyclization.

For the resin (A), the number of repetitions n of a structural unit as represented by the general formula (1), general formula (2), or general formula (3) is preferably 5 to 100,000, more preferably 10 to 100,000.

In the resin (A), furthermore, another structural unit may be contained in addition to a structural unit as represented by the general formula (1), general formula (2), or general formula (3). Examples of such another structural unit include, but not limited to, cardo structure and siloxane structure. In this case, the main constituent unit is preferably a structural unit as represented by the general formula (1) or the general formula (2). Here, the main constituent unit is the unit that is represented by the general formula (1), general formula (2), or the general formula (3) and accounts for 50 mol % or more, preferably 70 mol % or more, of all structural units.

$V—(R^1)_a$ in the general formula (1), $(OH)_c—X—(COOR^3)_e$ in the general formula (2), and T in the general formula (3) each denote an acid residue. V is a tetravalent to decavalent organic group having 4 to 40 carbon atoms and in particular, it is preferably an organic group having 4 to 40 carbon atoms and having an aromatic ring or a cycloaliphatic group. X and T are each a divalent to octavalent organic group having 4 to 40 carbon atoms and in particular, they are each preferably an organic group having 4 to 40 carbon atoms and having an aromatic ring or an aliphatic group.

Examples of the acid component present in the acid residue include, but not limited to, dicarboxylic acids such as terephthalic acid, isophthalic acid, diphenyl ether dicarboxylic acid, bis(carboxyphenyl)hexafluoropropane, biphenyldicarboxylic acid, benzophenone dicarboxylic acid, triphenyldicarboxylic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosane diacid, henicosane diacid, docosane diacid, tricosane diacid, tetracosane diacid, pentacosane diacid, hexacosane diacid, heptacosane diacid, octacosane diacid, nonacosane diacid, and triacontane diacid; tricarboxylic acids such as trimellitic acid, trimesic acid, diphenyl ether tricarboxylic acid, and biphenyl tricarboxylic acid; and tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-diphenyl ether tetracarboxylic acid, 3,3',4,4'-benzophenone tetracarboxylic acid, 2,2',3,3'-benzophenone tetracarboxylic acid, 2,2-bis(3,4-dicarboxyphenyl) propane, 2,2-bis(2,3-dicarboxyphenyl) propane, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) ether, 1,2,5,6-naphthalene tetracarboxylic acid, 9,9-bis(3,4-dicarboxyphenyl) fluorene, 9,9-bis{4-(3,4-dicarboxyphenoxy) phenyl}fluorene, 2,3,6,7-naphthalene tetracarboxylic acid, 2,3,6,7-naphthalene tetracarboxylic acid, 2,3,5,6-pyridine tetracarboxylic acid, 3,4,9,10-perylene tetracarboxylic acid, 2,2-bis(3,4-dicarboxyphenyl)hexafluoropropane, aromatic tetracarboxylic acids having structures as shown below, butane tetracarboxylic acid, cyclobutane tetracarboxylic acid, and 1,2,3,4-cyclopentane tetracarboxylic acid. Two or more of these may be used in combination.

[Chemical compound 4]

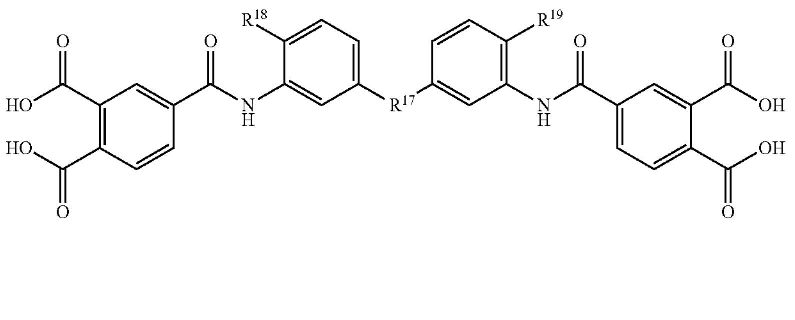

-continued

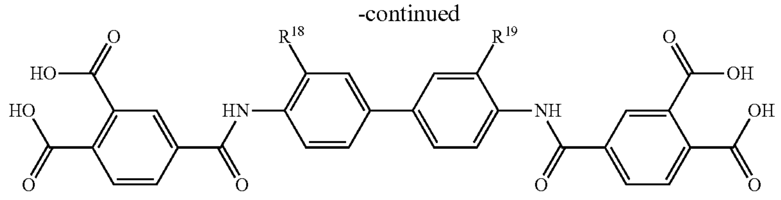

In the formulae, $R^{17}$ denotes an oxygen atom, $C(CF_3)_2$, or $C(CH_3)_2$. $R^{18}$ and $R^{19}$ are each a hydrogen atom or a hydroxyl group.

These acids may be used in their original form or in the form of anhydrides, halides, or active esters.

$W—(R^2)_b$ in the general formula (1), $(OH)_d—Y—(COOR^4)_f$ in the general formula (2), and U in the general formula (3) each denote an diamine residue. W, Y, and U are each a divalent to octavalent organic group having 4 to 40 carbon atoms and in particular, they are each preferably an organic group having 4 to 40 carbon atoms and having an aromatic ring or a cycloaliphatic group.

Specific examples of the diamine present in the diamine residue include hydroxyl group-containing diamines such as bis(3-amino-4-hydroxyphenyl) hexafluoropropane, bis(3-amino-4-hydroxyphenyl) sulfone, bis(3-amino-4-hydroxyphenyl) propane, bis(3-amino-4-hydroxyphenyl)methylene, bis(3-amino-4-hydroxyphenyl) ether, bis(3-amino-4-hydroxy) biphenyl, and bis(3-amino-4-hydroxyphenyl) fluorene; sulfonic acid-containing diamines such as 3-sulfonic acid-4,4'-diaminodiphenyl ether; thiol group-containing diamines such as dimercaptophenylene diamine; aromatic diamines such as 3,4-diaminodiphenyl ether, 4,4'-diaminodiphenyl ether, 3,4-diaminodiphenyl methane, 4,4'-diaminodiphenyl methane, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, benzine, m-phenylene diamine, p-phenylene diamine, 1,5-naphthalene diamine, 2,6-naphthalene diamine, bis(4-aminophenoxy phenyl) sulfone, bis(3-aminophenoxy phenyl) sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-44'-diaminobiphenyl; compounds formed by substituting part of the hydrogen atoms in the aromatic rings in these aromatic substances by an alkyl group or a fluoroalkyl group having 1 to 10 carbon atoms, or a halogen atom; diamines having nitrogen-containing aromatic heterocyclic groups such as 2,4-diamino-1,3,5-triazine (guanamine), 2,4-diamino-6-methyl-1,3,5-triazine (acetoguanamine), and 2,4-diamino-6-phenyl-1,3,5-triazine (benzoguanamine); silicone diamines such as 1,3-bis(3-aminopropyl)-1,1,3,3-tetramethyl disiloxane, 1,3-bis(p-aminophenyl)-1,1,3,3-tetramethyl disiloxane, 1,3-bis(p-aminophenethyl)-1,1,3,3-tetramethyl disiloxane, and 1,7-bis(p-aminophenyl)-1,1,3,3,5,5,7,7-octamethyl tetrasiloxane; alicyclic diamines such as cyclohexyl diamine and methylene biscyclohexyl amine; and diamines having structures as shown below. Two or more of these may be used in combination.

[Chemical compound 5]

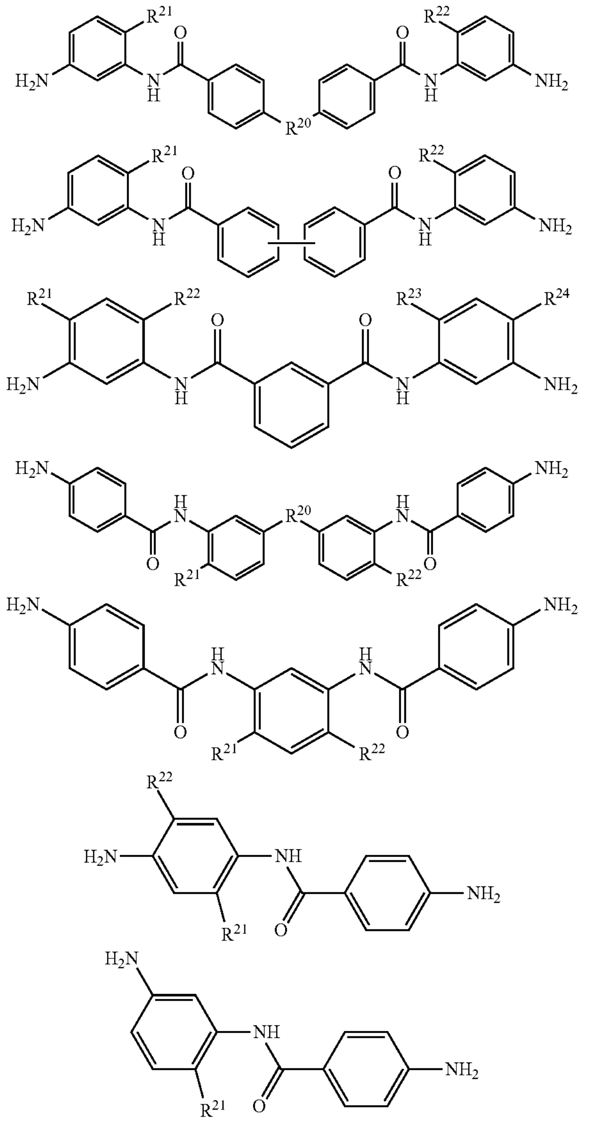

In the formulae, $R^{20}$ denotes an oxygen atom, $C(CF_3)_2$, or $C(CH_3)_2$. $R^{21}$ to $R^{24}$ are each independently a hydrogen atom or a hydroxyl group.

In particular, the inclusion of at least one diamine having a structure as shown below is preferable from the viewpoint of ensuring a higher alkali developability and providing a resin (A) and its cured film with a higher transmittance.

[Chemical compound 6]

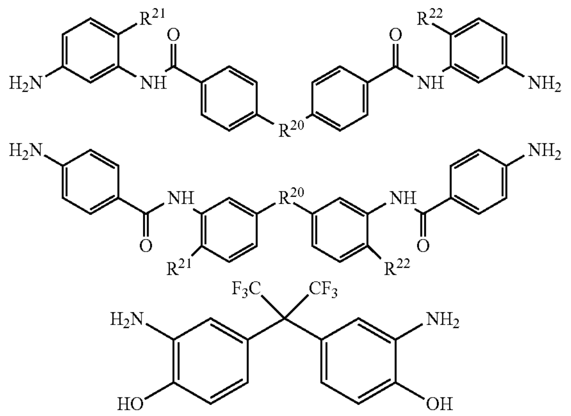

In the formulae, $R^{20}$ denotes an oxygen atom, $C(CF_3)_2$, or $C(CH_3)_2$. $R^{21}$ to $R^{24}$ are each independently a hydrogen atom or a hydroxyl group.

These diamines can be used in the form of the original diamines, diisocyanate compounds produced through reaction between diamine and phosgene, or trimethylsilylated diamines.

It is also preferable for the resin (A) to contain a structural unit selected from alkylene groups and alkylene ether groups. These groups may contain aliphatic rings. It is particularly preferable for the structural unit selected from alkylene groups and alkylene ether groups to be a structural unit as represented by the general formula (4).

[Chemical compound 7]

(4)

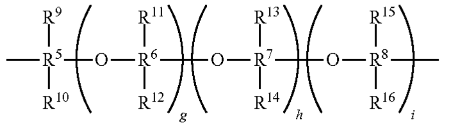

In the general formula (4), $R^5$ to $R^8$ each independently denote an alkylene group having 1 to 6 carbon atoms. $R^9$ to $R^{16}$ each independently denote a hydrogen atom, fluorine atom, or an alkyl group having 1 to 6 carbon atoms. However, the structures in parentheses are different from each other. Furthermore, g, h, and i each independently denote an integer of 0 to 35 and meet the relation $g+h+i>0$.

Structural units as represented by the general formula (4) include, for example, ethylene oxide group, propylene oxide group, and butylene oxide group, which may be linear, branched, or cyclic.

If the resin (A) has a structural unit selected from alkylene groups and alkylene ether groups, it serves to decrease the elastic modulus of the resin (A) and its cured film, reduce the warping of the display device, relieve the stress concentration caused thereby, and prevent peeling and cracking. It also serves to improve the light transmittance at 450 nm between before and after curing.

In regard to the resin (A), it is preferable for W in the general formula (1) or Y in the general formula (2) to contain a structural unit selected from alkylene groups and alkylene ether groups as described above. This serves to allow the resin (A) and its cured film to have better mechanical characteristics, a higher elongation percentage in particular, and also achieve an increase in light transmittance at 450 nm between before and after curing. Furthermore, when the cured film of the resin composition is heat-treated at a low temperature to promote cyclization, it works to achieve an increased chemical resistance, stronger adhesion to the metal substrate, and higher durability in constant-temperature, constant-humidity test (HAST).

Specific examples of such a diamine containing a group selected from alkylene groups and alkylene ether groups include ethylene diamine, 1,3-diaminopropane, 2-methyl-1,3-propane diamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexane diamine, 1,3-cyclohexane diamine, 1,4-cyclohexane diamine, 1,2-bis(aminomethyl)cyclohexane, 1,3-bis(aminomethyl)cyclohexane, 1,4-bis(aminomethyl)cyclohexane, 4,4'-methylene bis(cyclohexylamine), 4,4'-methylene bis(2-methylcyclohexylamine), KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700 (all trade names, manufactured by HUNTSMAN).

Here, these diamines may contain bonds such as —S—, —SO—, $—SO_2—$, —NH—, $—NCH_3—$, $—N(CH_2CH_3)—$, $—N(CH_2CH_2CH)—$, $—N(CH(CH_3)_2)—$, —COO—, —CONH—, —OCONH—, and —NHCONH—.

It is preferable for such a diamine residue containing a group selected from alkylene groups and alkylene ether groups to account for 5 mol % or more, more preferably 10 mol % or more, of all diamine residues. On the other hand, it preferably accounts for 40 mol % or less, more preferably 30 mol % or less, of all diamine residues. If the content is in the above range, it serves not only to realize a higher developability with an alkaline developer, but also to allow the resin (A) and its cured film to have better mechanical characteristics, a higher elongation percentage in particular, and also achieve a higher light transmittance at 450 nm after curing. Furthermore, when the cured film of a resin composition is heat-treated at a low temperature to promote cyclization, it works to achieve an increased chemical resistance, stronger adhesion to the metal surface, and higher durability in constant-temperature, constant-humidity test (HAST).

It may be copolymerized with a diamine residue having an aliphatic polysiloxane structure unless it suffers a decrease in heat resistance. Copolymerization with a diamine residue having an aliphatic polysiloxane structure can serve to improve the adhesion to the substrate. Specific examples of diamine components include bis(3-aminopropyl)tetramethyl disiloxane and bis(p-aminophenyl)octamethyl pentasiloxane copolymerized with 1 to 15 mol % of all diamine residues. Copolymerization in this range is preferable in terms of improvement in the adhesion to the substrate such as silicon wafer and prevention of a decrease in solubility in alkali solutions.

Chain ends of the resin (A) may be capped with a monoamine, anhydride, acid chloride, or monocarboxylic acid having an acidic group to provide a resin having acidic groups at backbone chain ends. As the monoamine, anhydride, acid chloride, or monocarboxylic acid having an acidic group, generally known ones may be adopted and a plurality thereof may be used in combination.

The end-capping agents such as monoamine, anhydride, acid chloride, and monocarboxylic acid preferably account for 2 to 25 mol % of the total quantity of the acid and amine components present in the resin (A), which accounts for 100 mol %.

The resin (A) preferably has a weight average molecular weight of 10,000 or more and 100,000 or less. A weight average molecular weight of 10,000 or more enables the production of a cured film having improved mechanical characteristics after curing. The weight average molecular weight is more preferably 20,000 or more. On the other hand, a weight average molecular weight of 100,000 or less is preferable because it serves to improve the developability with various developers, and a weight average molecular weight of 50,000 or less is preferable because it serves to improve the developability with alkali solutions.

The weight average molecular weight (Mw) can be determined by GPC (gel permeation chromatography). For example, N-methyl-2-pyrrolidone (hereinafter occasionally abbreviated as NMP) can be used as eluent to take measurements to determine the polystyrene based value.

It is preferable for the content of the resin (A) to be 3 to 55 mass %, more preferably 5 to 40 mass %, relative to the total quantity of all components including the solvent, which accounts for 100 mass %. A content in the above range makes it possible to adjust the viscosity appropriately for the implementation of spin coating or slit coating.

Other substances may also be used, including phenol resin, polymers containing, as a monomer unit, a radical polymerizable monomer having an alkali-soluble group such as polyhydroxystyrene and acrylic resin, siloxane polymers, cyclic olefin polymers, and cardo resin. These generally known resins may be employed, and they may be used singly or as a combination of two or more of these resins.

Furthermore, it is preferable for the resin composition containing the resin (A) used for the present invention to further include a photosensitizing agent (B) (hereinafter occasionally referred as component (B)).

The inclusion of the component (B) serves to make the resin composition photosensitive and form a fine hole pattern.

The component (B) is a compound that undergoes changes in chemical structure when exposed to ultraviolet ray. Examples thereof include photo acid generator, photo base generator, and photo initiator. If a photo acid generator is used as the component (B), it works to produce an acid in the irradiated portion of the photosensitive resin composition so that the irradiated portion increases in solubility in alkaline developers, thus forming a positive type pattern in which the irradiated portion will be soluble.

If a photo base generator is used as the component (B), it works to produce a base in the irradiated portion of the resin composition so that the irradiated portion decreases in solubility in alkaline developers, thus forming a negative type pattern in which the irradiated portion will be insoluble.

If a photo initiator is used as the component (B), it works to produce radicals to cause radical polymerization in the irradiated portion of the resin composition so that the portion becomes insoluble in alkaline developers, thus forming a negative type pattern. Furthermore, UV curing is accelerated by the light irradiation to ensure an increase in sensitivity.

From the viewpoint of fine processability, it is preferable for the resin composition containing the resin (A) and the component (B) to have positive photosensitivity.

Of the above substances that can work as the component (B), the use of a photo acid generator is preferable from the viewpoint of high sensitivity and fine processability. Examples of the photo acid generator include quinonediazide compounds, sulfonium salts, phosphonium salts, diazonium salts, and iodonium salts. In addition, a sensitizing agent etc. may also be included as required.

It is preferable for such a quinonediazide compound to have a structure in which a sulfonic acid of naphthoquinonediazide is connected through an ester bond to a compound having a phenolic hydroxyl group, Useful examples of the compound having a phenolic hydroxyl group include generally known ones, which preferably contain 4-naphthoquinonediazide sulfonic acid or 5-naphthoquinonediazide sulfonic acid that is introduced through an ester bond, though compounds other than these may also be used.

It is preferable that 50 mol % or more of the functional groups in these compounds having phenolic hydroxide groups be substituted by quinonediazide. If using a quinonediazide compound that is substituted by 50 mol % or more, the quinonediazide compound is lower in the affinity with aqueous alkali solutions. As a result, the resin composition in the unirradiated portion will decrease significantly in solubility in the aqueous alkali solution. Furthermore, light irradiation works to convert the quinonediazide sulfonyl group into an indenecarboxylic acid, and accordingly, the photosensitive resin composition in the irradiated portion will become very high in the rate of dissolution in the aqueous alkali solution. Thus, this results in a larger ratio in dissolution rate between the irradiated portion and the unirradiated portion of the composition, thereby making it possible to form a pattern with high resolution.

The inclusion of such a quinonediazide compound enables the production of a positive type photosensitive resin composition that is photosensitive not only to the i-line (365 nm), h-line (405 nm), or g-line (436 nm) of a common mercury lamp, but also to broad band light that contains them. Furthermore, the aforementioned compounds useful for the component (B) may be contained singly or two or more of them may be contained in combination to provide a highly photosensitive resin composition.

Useful quinonediazide compounds include not only those containing either a 5-naphthoquinonediazide sulfonyl group or a 4-naphthoquinonediazide sulfonyl group but also those containing both a 5-naphthoquinonediazide sulfonyl group and a 4-naphthoquinonediazide sulfonyl group in one molecule.

Useful naphthoquinonediazide sulfonyl ester compounds include 5-naphthoquinonediazide sulfonyl ester compounds (B-1) and 4-naphthoquinonediazide sulfonyl ester compounds (B-2), but for the present invention, it is preferable that a compound (B-1) be included. The compounds (B-1) absorb light over a wide range including the g-line of a mercury lamp, and therefore, they are suitable not only for g-line irradiation but also for full wavelength range irradiation. In addition, they react with the resin (A) etc. in the curing step to form a crosslinked structure and accordingly serve to ensure increased chemical resistance. Furthermore, as compared with the compounds (B-2), they do not cause significant coloring in the heat treatment step, and therefore, their use is also preferable from the viewpoint of light transmittance after the heat treatment step. In regard to the content of the compounds (B-1), they preferably account for 55 mass % or more and 100 mass % or less relative to the total quantity of all photosensitizing agents, that is, the total quantity of the compounds (B-1) and the compounds (B-2). If their content is in this range, it serves to produce a cured film with a high light transmittance.

A quinonediazide compound can be synthesized by a generally known method through an esterification reaction between a compound containing a phenolic hydroxyl group and a quinonediazide sulfonic acid compound. The use of a quinonediazide compound serves to further increase the resolution, sensitivity, and residual film rate.

The molecular weight of the component (B) is preferably 300 or more, more preferably 350 or more, and preferably 3,000 or less, more preferably 1,500 or less, from the viewpoint of the heat resistance, mechanical characteristics, and adhesiveness of the film that can be produced by heat treatment.

Of the useful substances for the component (B), sulfonium salts, phosphonium salts, and diazonium salts are preferable because they can stabilize moderately the acid component generated by light irradiation. In particular, the use of a sulfonium salt is preferable.

It is preferable for the component (B) to account for 0.1 part by mass or more and 100 parts by mass or less relative to 100 parts by mass of the resin (A). When accounting for 0.1 part by mass or more and 100 parts by mass or less, the component (B) can work to develop photosensitivity while serving to produce a heat-treated film with high heat resistance, chemical resistance, and mechanical characteristics.

In the case where the component (B) contains a quinonediazide compound, it is more preferable for the component (B) to account for 1 part by mass or more, and still more preferably 3 parts by mass or more, relative to 100 parts by mass of the component (A). On the other hand, its content is more preferably 100 parts by mass or less, and still more preferably 80 parts by mass or less. When accounting for 1 part by mass or more and 100 parts by mass or less, it can work to develop photosensitivity while serving to produce a heat-treated film with high heat resistance, chemical resistance, and mechanical properties.

In the case where the component (B) contains a sulfonium salt, phosphonium salt, or diazonium salt, it is more preferable for the component (B) to account for 0.1 part by mass or more, still more preferably 1 part by mass or more, and particularly preferably 3 parts by mass or more, relative to 100 parts by mass of the resin (A). On the other hand, its content is more preferably 100 parts by mass or less, still more preferably 80 parts by mass or less, and particularly preferably 50 parts by mass or less. When accounting for 0.1 part by mass or more and 100 parts by mass or less, it can work to develop photosensitivity while serving to produce a heat-treated film with high heat resistance, chemical resistance, and mechanical properties.

In the case where it contains a photo base generator as the component (B), specific examples of good photo base generators include amide compounds and ammonium salts.

Such amide compounds include, for example, 2-nitrophenylmethyl-4-methacryloyloxypiperidine-1-carboxylate, 9-anthrylmethyl-N,N-dimethyl carbamate, 1-(anthraquinone-2-yl)ethylimidazole carboxylate, and (E)-1-[3-(2-hydroxyphenyl)-2-propenoyl]piperidine.

Such ammonium salts include, for example, 1,2-diisopropyl-3-(bisdimethylamino)methylene) guanidium 2-(3-benzoylphenyl) propionate, (Z)-{[bis(dimethylamino)methylidene]amino}-N-cyclohexylamino)methaniumtetrakis(3-fluorophenyl) borate, and 1,2-dicyclohexyl-4,4,5,5-tetramethylbiguanidium n-butyltriphenyl borate.

In the case where it contains a photo base generator as the component (B), it is preferable for the component (B) in the resin composition to account for 0.1 part by mass or more, more preferably 0.5 part by mass or more, still more preferably 0.7 part by mass or more, and particularly preferably 1 part by mass or more, relative to 100 parts by mass of the resin (A).

A content in the above range allows it to have an increased sensitivity in the light irradiation step. On the other hand, the content is preferably 25 parts by mass or less, more preferably 20 parts by mass or less, still more preferably 17 parts by mass or less, and particularly preferably 15 parts by mass or less. A content in the above range allows it to have an increased resolution after the development step.

When a photo initiator is to be added as the component (B), examples of preferable photo initiators include benzylketal based photo initiators, α-hydroxyketone based photo initiators, α-aminoketone based photo initiators, acylphosphine oxide based photo initiators, oxime ester based photo initiators, acridine based photo initiators, benzophenone based photo initiators, acetophenone based photo initiators, aromatic keto ester based photo initiators, benzoic ester based photo initiators, and titanocene based photo initiators. For all these photo initiators, generally known substances may be adopted, and two or more thereof may be used together. Of these, from the viewpoint of ensuring improved sensitivity in the light irradiation step, more preferable ones include α-hydroxyketone based photo initiators, α-aminoketone based photo initiators, acylphosphine oxide based photo initiators, oxime ester based photo initiators, acridine based photo initiators, and benzophenone based photo initiators, of which α-aminoketone based photo initiators, acylphosphine oxide based photo initiators, and oxime ester based photo initiators are still more preferable.

In the case where a photo initiator is to be added as the component (B), it is preferable for the component (B) in the resin component to account for 0.1 part by mass or more, more preferably 0.5 part by mass or more, still more preferably 0.7 part by mass or more, and particularly preferably 1 part by mass or more, relative to 100 parts by mass of the resin (A).

A content in the above range allows it to have an increased sensitivity in the light irradiation step. On the other hand, the content is preferably 25 parts by mass or less, more preferably 20 parts by mass or less, still more preferably 17 parts by mass or less, and particularly preferably 15 parts by mass or less. A content in the above range allows it to have an increased resolution after the development step.

For the present invention, it is preferable for the resin composition containing the resin (A) to further include a thermal crosslinking agent (C) (hereinafter occasionally referred as component (C)).

A thermal crosslinking agent is a resin or a compound that contains at least two thermally reactive functional groups in one molecule. Examples of the thermally reactive functional groups include alkoxymethyl groups, methylol groups, and cyclic ether groups.

For the present invention, the inclusion of the component (C) is preferable because it serves to realize increased chemical resistance.

For the present invention, the cured film formed by curing a resin composition containing the resin (A), component (B), and component (C) preferably has a high light transmittance. This serves to prevent the light beams emitted in all directions from the light emitting elements from being absorbed in the cured film, which is formed by curing a resin composition containing the resin (A), component (B), and components (C), to ensure an increased light extraction efficiency and realize an increased brightness.

To realize such characteristics, it is preferable for the component (C) to be as follows: the component (C) itself is high in transmittance for light of 450 nm; it is so high in heat resistance that a quinone structure, which is a coloring structure, or the like will not be formed significantly; reaction products resulting from reactions with the component (B), resin (A), etc., are high in light transmittance; and decomposition products themselves of the component (C) and reaction products originating from decomposition products thereof are high in light transmittance.

One or more compounds selected from alkoxymethyl compounds and methylol compounds (hereinafter occasionally referred to as the component (C-1)) may be used as the thermal crosslinking agent. The inclusion of the component (C-1) serves to further strengthen the crosslinks and allows the cured film to have increased chemical resistance to flux liquids and the like. Specific examples of the component (C-1) include methylol compounds having structures as given below and alkoxymethyl compounds with a hydrogen atom in the methylol group substituted by a methyl group or an alkyl group having 2 to 10 carbon atoms, though they are not limited to the structures shown below.

[Chemical compound 8]

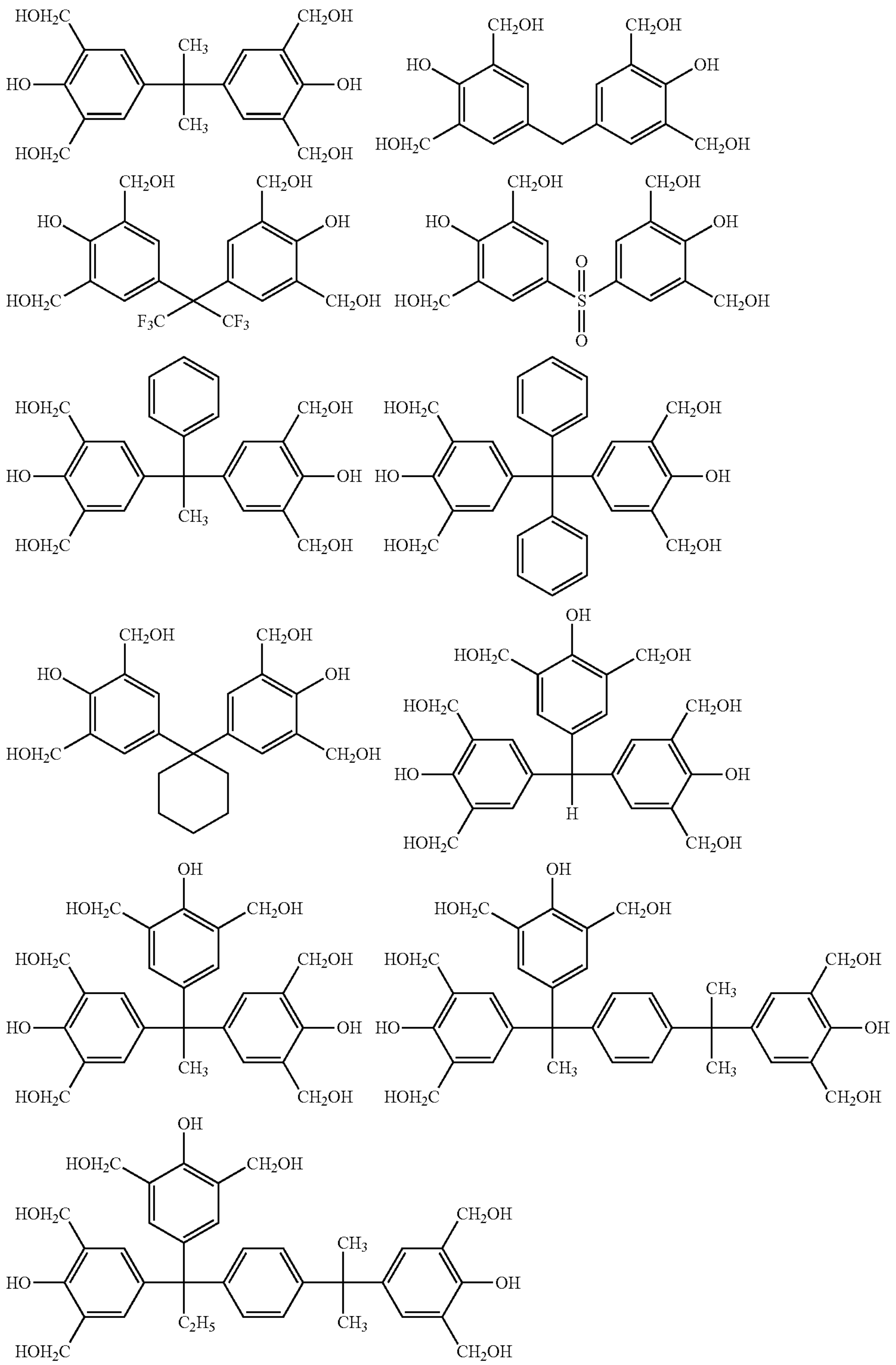

-continued

[Chemical compound 9]

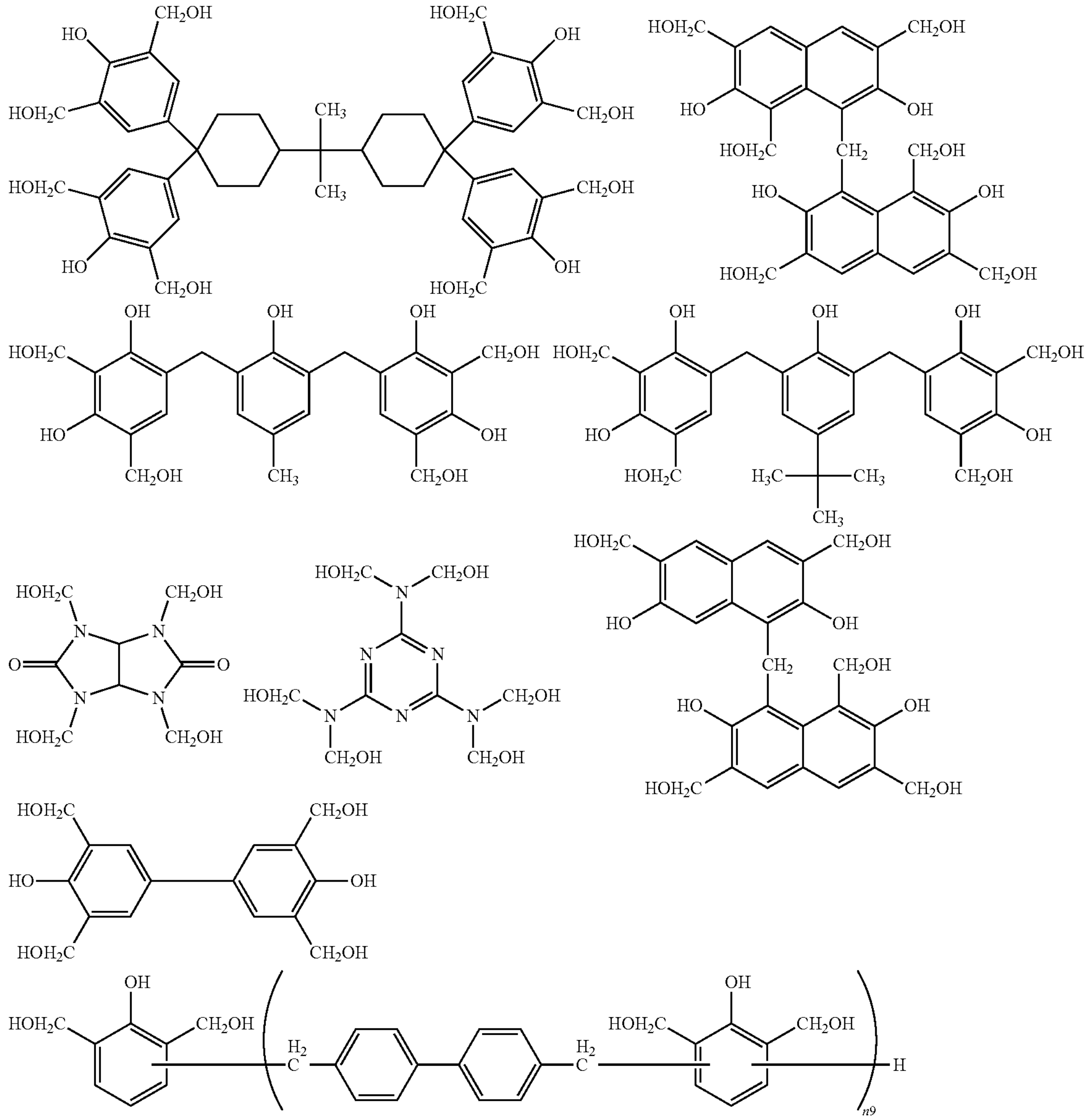

Furthermore, as the component (C), one or more cyclic ether group-containing compounds (hereinafter occasionally referred to as the component (C-2)) may be contained. The inclusion of the component (C-2) serves to allow the reaction to proceed at a low temperature of 160° C. or lower, further strengthen the crosslinks, and increase the chemical resistance of the cured film.

Specific examples of the component (C-2) include Denacol (registered trademark) EX-212L, Denacol EX-214L, Denacol EX-216L, Denacol EX-850L, Denacol EX-321L (all manufactured by Nagase ChemteX Corporation), GAN, GOT (both manufactured by Nippon Kayaku Co., Ltd.), Epikote (registered trademark) 828, Epikote 1002, Epikote 1750, Epikote 1007, YX4000, YX4000H, YX8100-BH30, E1256, E4250, E4275 (all manufactured by Mitsubishi Chemical Corporation), Epicron (registered trademark) 850-S, Epicron HP-4032, Epicron HP-7200, Epicron HP-820, Epicron HP-4700, Epicron HP-4770, Epicron HP4032 (all manufactured by DIC Corporation), TECHMORE VG3101L (manufactured by Printec, Inc.), Tepic (registered trademark) S, Tepic G, Tepic P (all manufactured by Nissan Chemical Industries, Ltd.), Epotohto YH-434L (manufactured by Tohto Kasei Co., Ltd.), EPPN502H, NC-3000, NC-6000, XD-1000 (all manufactured by Nippon Kayaku Co., Ltd.), Epicron N695, HP7200 (both manufactured by DIC Corporation), Eternacoll (registered trademark) EHO, Eternacoll OXBP, Eternacoll OXTP, Eternacoll OXMA (all manufactured by Ube Industries, Ltd.), and oxetanized phenol novolac.

As the component (C-2), it is preferable to adopt a cyclic ether group-containing compound having a triaryl methane structure or a biphenyl structure, of which the use of a cyclic ether group-containing compound having a biphenyl structure is more preferable.

Specific examples include YX4000, YX4000H, YL6677 (all manufactured by Mitsubishi Chemical Corporation), TECHMORE VG3101 L (manufactured by Printec, Inc.), and NC-3000 (manufactured by Nippon Kayaku Co., Ltd.).

A cyclic ether group-containing compound having a biphenyl structure can work to moderately lower the glass transition temperature of a resin containing the resin (A), component (B), etc. to increase its flowability, and accordingly, it serves to relieve the stress concentration on the display device and reduce the warping of the display device.

In addition, one or more compounds each having a structural unit as represented by the general formula (5) given below (hereinafter occasionally referred to as the component (C-3)) may be contained as the component (C).

[Chemical compound 10]

(5)

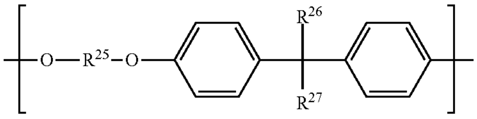

groups, alkoxysilyl groups, aryl groups, aryl ether groups, carboxyl groups, carbonyl groups, allyl groups, vinyl groups, heterocyclic groups, and other substituent groups. $R^{26}$ and $R^{27}$ each independently denote a hydrogen atom or a methyl group.

Since the component (C-3) itself has a flexible alkylene group and a rigid aromatic group, the inclusion of the component (C-3) serves to produce a cured film that is higher in elongation percentage and lower in stress while maintaining heat resistance.

There are no specific limitations on the crosslink group contained in the component (C-3), but good examples include, but not limited to, acrylic group, methylol group, alkoxymethyl group, and cyclic ether group. Of these, cyclic ether groups are preferable because they can react with hydroxyl groups in the resin (A) to provide a cured film with an improved heat resistance and also because they can react without undergoing dehydration.

Specific examples of the compound that contains a structural unit as represented by the general formula (5) include, but not limited to, those having structures as described below.

[Chemical compound 11]

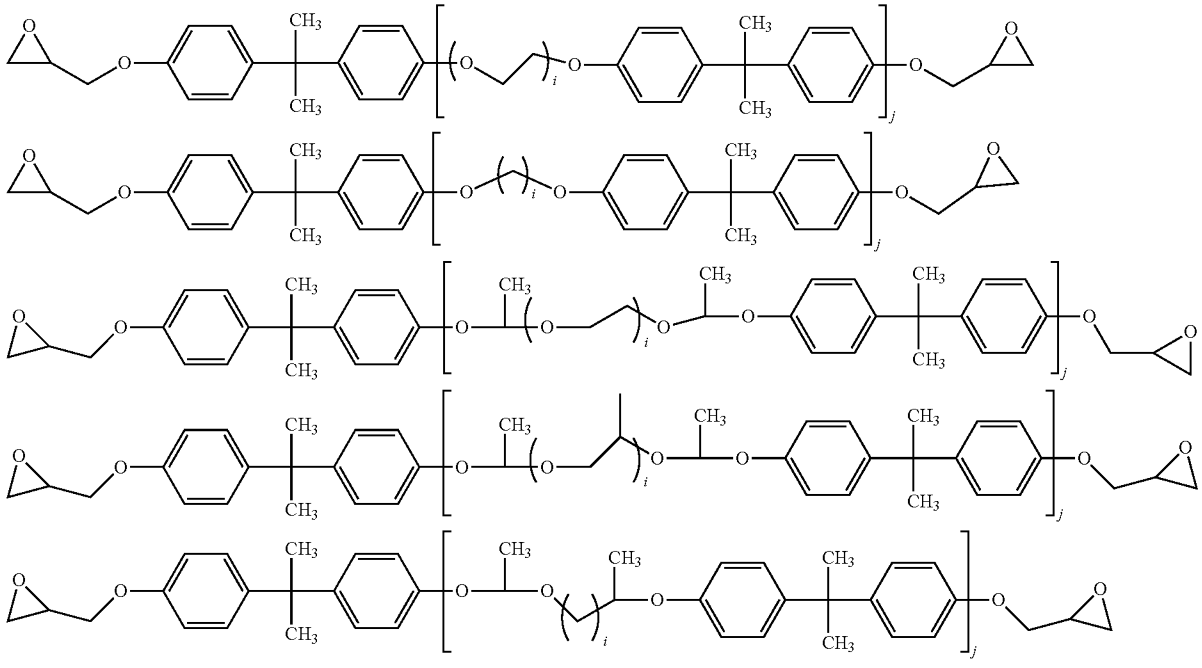

In the general formula (5), $R^{25}$ denotes a divalent organic group having an alkylene group or an alkylene ether group having 1 or more and 15 or less carbon atoms, and examples of such a group include methylene group, ethylene group, propylene group, butylene group, ethylene oxide group, propylene oxide group, and butylene oxide group, which may be linear, branched, or cyclic. Furthermore, some of the substituent groups in the divalent organic group having an alkylene group or an alkylene ether group containing 1 or more and 15 or less carbon atoms may have one or a combination of the following: cyclic ether groups, alkylsilyl In the formulae, $o^1$ denotes an integer of 1 to 20 and $o^2$ denotes an integer of 1 to 5. In order to ensure both improved heat resistance and elongation percent, it is preferable that 01 be an integer of 3 to 7 and $o^2$ be an integer of 1 or 2.

For the component (C), a combination of two or more of the aforementioned substances may be contained.

The component (C) preferably accounts for 5 parts by mass or more, more preferably 10 parts by mass or more, relative to 100 parts by mass of the resin (A), from the viewpoint of producing a cured film having high chemical resistance to flux liquids and the like. It preferably accounts for 100 parts by mass or less, more preferably 90 parts by mass or less, and still more preferably 80 parts by mass or less, relative to 100 parts by mass of the resin (A) because a cured film having high chemical resistance to flux liquids and the like can be produced while allowing the resin composition to maintain a high storage stability and also because it serves to prevent the separation of metal wires and cracks in the cured film after reliability test of the wires to which the cured film is applied.

The resin composition containing the resin (A) may also include other components such as a radical polymerizable compound, antioxidant, solvent, compound having a phenolic hydroxyl group, adhesion promoter, adhesion promoter, and surfactant, as required.

Next, described below are production methods for the resin composition according to the present invention. For example, a resin composition can be prepared by mixing and dissolving the resin (A) along with the component (B), component (C), and various others such as radical polymerizable compound, antioxidant, solvent, compound with a phenolic hydroxyl group, adhesion promoter, adhesion promoter, and surfactant, as required.

For their dissolution, generally known methods such as heating and stirring can be used. The resin composition preferably has a viscosity of 2 to 5,000 mPa·s. A desired film thickness can be realized easily by controlling the solid content so as to adjust the viscosity to 2 mPa·s or more. On the other hand, a highly uniform resin film can be obtained easily if the viscosity is 5,000 mPa·s or less. A resin composition having such a viscosity can be prepared easily by, for example, adjusting the solid content to 5 to 60 mass %. Here, the solid content means the content of the components other than the solvents.

The resulting resin composition is preferably filtrated through a filter to remove dust and particles. The filter to be used for filtration may be of such a material as polypropylene (PP), polyethylene (PE), nylon (NY), and polytetrafluoroethylene (PTFE), of which polyethylene and nylon are preferable.

To form a cured film by curing a resin composition containing the resin (A), a good method is to form a resin sheet first from the resin composition containing the resin (A) and then cure the resin sheet to produce a film.

A resin sheet as referred to above means a sheet of the resin composition formed on a base. Specifically, such a resin sheet is prepared by spreading the resin composition over a base and then dry it.

A film of polyethylene terephthalate (PET) or the like may be used as the base over which the resin composition is to be spread. In the case where a resin sheet is to be used after attaching it to a base such as silicon wafer, it may be necessary to remove the base by peeling.

In such a case, it is preferable to adopt a base having a surface coated with a mold releasing agent such as silicone resin to allow the resin sheet and the base to be separated easily.

The display device according to the present invention can be suitably used in various displays such as LED displays and in various lamps etc. for automobiles.

EXAMPLES

The present invention will be illustrated below in greater detail with reference to examples etc., but the invention should not be construed as being limited thereto.

Here, the following methods were used in the examples to make evaluations of display devices and cured films prepared from resin compositions and applied to the display devices.

<Evaluation Method for Defective Rate after Reliability Test>

For each display device with three light emitting elements, 10 samples were prepared in Examples and Comparative examples, and these display device samples were subjected to reliability test in which a voltage of 5 V was applied at temperature of 85° C. and a humidity of 85% for 2,000 hours using a HAST instrument (HAST CHAMBER EHS-211MD, manufactured by Tabai Espec Corp.), followed by lighting test by visual observation. For the 10 display device samples, the number of light emitting elements that failed to work was counted and its ratio was used for defective rate evaluation.

<Evaluation Method for Light Extraction Efficiency of Display Device>

The display device described in each example or comparative example was examined to measure its light extraction efficiency. The measurement was performed using an external quantum efficiency measuring instrument (c9920, manufactured by Hamamatsu Photonics K.K.). For evaluation, a measured light extraction efficiency was converted to a value relative to the light extraction efficiency of the display device described in Example 1 which was defined as 1.00.

Synthesis Example 1 Synthesis of Hydroxyl-Containing Diamine Compound

First, 18.3 g (0.05 mole) of 2,2-bis(3-amino-4-hydroxyphenyl)hexafluoropropane (manufactured by Central Glass Co. Ltd., hereinafter referred to as BAHF) was dissolved in 100 mL of acetone and 17.4 g (0.3 mole) of propylene oxide (manufactured by Tokyo Kasei), and the liquid was cooled to −15° C. To this liquid, a solution of 20.4 g (0.11 mole) of 3-nitrobenzoyl chloride (manufactured by Tokyo Kasei) dissolved in 100 mL of acetone was added dropwise. After the end of dropwise addition, the liquid was stirred at −15° C. for 4 hours, followed by leaving it to return to room temperature. The resulting white solid precipitate was separated out by filtration and vacuum-dried at 50° C.

A 30 g portion of the resulting white solid was put in a 300 mL stainless steel autoclave and dispersed in 250 mL of methyl cellosolve, followed by adding 2 g of 5% palladium-carbon (manufactured by Wako Pure Chemical Industries, Ltd.). Hydrogen was introduced into this liquid using a balloon to cause a reduction reaction at room temperature. About 2 hours later, the reaction was terminated after confirming that the balloon would deflate no more. After the end of the reaction, the liquid was filtrated to remove the palladium compound used as catalyst and concentrated in a rotary evaporator to provide a hydroxyl-containing diamine compound as represented by the formula given below.

[Chemical compound 12]

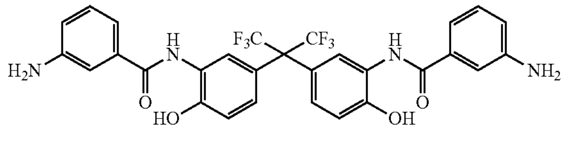

Synthesis Example 2 Synthesis of Polybenzoxazole Precursor (a-1)

In a dry nitrogen flow, 1.5 g (0.0075 mole) of 4,4'-diaminodiphenyl ether (hereinafter referred to as 4,4'-DAE), 12.8 g (0.035 mole) of BAHF, and 5.0 g (0.0050 mole) of RT-1000 (manufactured by HUNTSMAN) were dissolved in 100 g of NMR To this liquid, diimidazole dodecanoate (74 g, 0.023 mole) and 1,1'-(4,4'oxybenzoyl)diimidazole (hereinafter referred to as PBOM) (8.1 g, 0.023 mole) were added along with 25 g of NMP and allowed to react at 85° C. for 3 hours. Then, 0.6 g (0.0025 mole) of 1,3-bis(3-aminopropyl)tetramethyl disiloxane (hereinafter referred to as SiDA), 0.8 g (0.0025 mole) of 4,4'-oxydiphthalic anhydride (hereinafter referred to as ODPA), and 0.8 g (0.0050 mole) of 5-norbornene-2,3-dicarboxylic anhydride (hereinafter referred to as NA) were added along with 25 g of NMP and allowed to react at 85° C. for 1 hour. After the end of the reaction, the liquid was allowed to cool to room temperature and 13.2 g (0.25 mole) of acetic acid was added along with 25 g of NMP and stirred at room temperature for 1 hour. After the end of stirring, the solution was poured in 1.5 L of water to provide a white precipitate. This precipitate was collected by filtration, rinsed with water three times, and dried in a forced-air drier at 50° C. for 3 days to produce powder of a polybenzoxazole precursor (a-1).

Synthesis Example 3 Synthesis of Polybenzoxazole Precursor (a-2)

In a dry nitrogen flow, 27.5 g (0.075 mole) of BAHF was dissolved in 257 g of NMP. To this liquid, 17.2 g (0.048 mole) of PBOM was added along with 20 g of NMP and allowed to react at 85° C. for 3 hours. Subsequently, 20.0 g (0.02 mole) of RT-1000, 1.2 g (0.005 mole) of SiDA, and 14.3 g (0.04 mole) of PBOM were added along with 50 g of NMP and allowed to react at 85° C. for 1 hour. In addition, 3.9 g (0.024 mole) of NA, which was adopted as end-capping agent, was added along with 10 g of NMP and allowed to react at 85° C. for 30 minutes. After the end of the reaction, the liquid was allowed to cool to room temperature and 52.8 g (0.50 mole) of acetic acid was added along with 87 g of NMP, followed by stirring at room temperature for 1 hour. After the end of stirring, the solution was poured in 3 L of water to provide a white precipitate. This precipitate was collected by filtration, rinsed with water three times, and dried in a forced-air drier at 50° C. for 3 days to produce powder of a polybenzoxazole precursor (a-2).

Synthesis Example 4 Synthesis of Polyimide Precursor (a-3)

In a dry nitrogen flow, 51.9 g (0.086 mole) of the hydroxyl-containing diamine prepared in Synthesis example 1 and 1.0 g (0.004 mole) of SiDA were dissolved in 200 g of NMP. To this liquid, 31.0 g (0.10 mole) of ODPA was added and stirred at 40° C. for 2 hours. Then, 1.1 g (0.01 mole) of 3-aminophenol (manufactured by Tokyo Chemical Industry Co. Ltd.), which was adopted as end-capping agent, was added along with 10 g of NMP and allowed to react at 40° C. for 1 hour. Subsequently, a solution prepared by diluting 7.1 g (0.06 mole) of dimethylformamide dimethylacetal (manufactured by Mitsubishi Rayon, Ltd.) with 5 g of NMP was added dropwise. After the end of dropping, stirring was continued at 40° C. for 2 hours. After the end of stirring, the solution was poured in 2 L of water, and the resulting solid polymer precipitate was collected by filtration. In addition, it was rinsed three times with 2 L of water, and the collected solid polymer was dried at 50° C. in a vacuum dryer for 72 hours to prepare a polyimide precursor (a-3).

Synthesis Example 5 Synthesis of Polyimide Precursor (a-4)

In a dry nitrogen flow, 41.1 g (0.068 mole) of the hydroxyl-containing diamine prepared in Synthesis example 1, 18.0 g (0.018 mole) of RT-1000, and 1.0 g (0.004 mole) of SiDA were dissolved in 200 g NMP. To this liquid, 31.0 g (0.10 mole) of ODPA was added and stirred at 40° C. for 2 hours. Then, 1.1 g (0.01 mole) of 3-aminophenol, which was adopted as end-capping agent, was added along with 10 g of NMP and allowed to react at 40° C. for 1 hour. Subsequently, a solution prepared by diluting 6.0 g (0.05 mole) of DFA with 5 g of NMP was added dropwise. After the end of dropping, stirring was continued at 40° C. for 2 hours. After the end of stirring, the solution was poured in 2 L of water, and the resulting solid polymer precipitate was collected by filtration. In addition, it was rinsed three times with 2 L of water, and the collected solid polymer was dried at 50° C. in a vacuum dryer for 72 hours to prepare a polyimide precursor (a-4).

Synthesis Example 6 Synthesis of Polyimide (a-5)

In a dry nitrogen flow, 29.3 g (0.08 mole) of BAHF, 1.2 g (0.005 mole) of SiDA, and 3.3 g (0.03 mole) of 3-aminophenol, which was adopted as end-capping agent, were dissolved in 80 g of NMP. To this solution, 31.2 g (0.1 mole) of ODPA was added along with 20 g of NMP and allowed to react at 60° C. for 1 hour, followed by stirring at 180° C. for 4 hours. After the end of stirring, the solution was poured in 3 L of water to provide a white precipitate. This precipitate was collected by filtration, rinsed with water three times, and dried in a vacuum dryer at 80° C. for 20 hours to provide powder of polyimide (a-5).

Synthesis Example 7 Synthesis of Cardo Resin (a-6)

In a dry nitrogen flow, 198.53 g of a 50% PGMEA solution of the product of a reaction of bisphenol fluorene type epoxy resin with an equivalent quantity of acrylic acid (a solution of ASF-400 (product name), manufactured by Nippon Steel Chemical Co., Ltd.), 39.54 g (0.12 mole) of benzophenone tetracarboxylic dianhydride, 8.13 g (0.08 mole) of succinic anhydride, 48.12 g of PGMEA, and 0.45 g of triphenyl phosphine were fed to a four-necked flask with a reflux condenser, heated while stirring at 120° C. to 125° C. for 1 hour, and additionally heated while stirring at 75° C. to 80° C. for 6 hours, followed by adding 8.6 g of glycidylmethacrylate and further stirring at 80° C. for 8 hours to provide a resin (a-6) that had two cyclic structures bonded to a quaternary carbon atom in another cyclic structure.

Synthesis Example 8 Synthesis of Polyimide Precursor (a-7)

In a dry nitrogen flow, 3.2 g (0.03 mole) of 1,4-paraphenylene diamine and 12.0 g (0.06 mole) of 4,4'-DAE were dissolved in 200 g of NMR To this liquid, 31.0 g (0.10 mole) of ODPA was added and stirred at 40° C. for 2 hours. Then, 1.1 g (0.01 mole) of 3-aminophenol (manufactured by Tokyo Chemical Industry Co. Ltd.), which was adopted as end-capping agent, was added along with 10 g of NMP and allowed to react at 40° C. for 1 hour. Subsequently, a solution prepared by diluting 7.1 g (0.06 mole) of DFA with 5 g of NMP was added dropwise. After the end of dropping, stirring was continued at 40° C. for 2 hours. After the end of stirring, the solution was poured in 2 L of water, and the resulting solid polymer precipitate was collected by filtration. In addition, it was rinsed three times with 2 L of water, and the collected solid polymer was dried at 50° C. in a vacuum dryer for 72 hours to prepare a polyimide precursor (a-7).

Synthesis Example 9 Synthesis of Polyimide Precursor (a-8)

To a separable flask with a capacity of 2 liters, 155.1 g (0.50 mole) of ODPA was fed and 134.0 g (1.00 mole) of 2-hydroxyethyl methacrylate (HEMA) and 400 g of γ-butyrolactone were added. At room temperature, 79.1 g of pyridine was added while stirring to provide a reaction mixture. After the end of heat generation from the reaction, the liquid was left to stand to cool to room temperature and left to stand for additional 16 hours.

Then, while cooling with ice, a solution prepared by dissolving 206.3 g (1.00 mole) of dicyclohexyl carbodiimide (DCC) in 180 g of γ-butyrolactone was added to the reaction mixture over 40 minutes while stirring. Then, a suspension liquid prepared by suspending 16.2 g (0.15 mole) of 1,4-paraphenylene diamine and 60.1 g (0.30 mole) of 4,4'-DAE in 350 g of γ-butyrolactone was added over 60 minutes while stirring. After additional stirring for 2 hours at room temperature, 30 ml of ethyl alcohol was added and stirred for 1 hour. Then, 400 g of γ-butyrolactone was added. The deposit formed in the reaction mixture was removed by filtration to provide a reaction liquid.

The reaction liquid was poured in 3 L of water to provide a white precipitate. This precipitate was collected by filtration, rinsed twice with water, washed once with isopropanol, and dried in a vacuum dryer at 50° C. for 72 hours to provide a polyimide precursor (a-8).

Synthesis Example 10 Synthesis of Photosensitizing Agent (Quinonediazide Compound) (b-1)

In a dry nitrogen flow, 21.22 g (0.05 mole) of 4,4'-[1-[4-[1-(4-hydroxyphenyl-1)-1-methylethyl]phenyl]ethylidene] bisphenol (manufactured by Honshu Chemical Industry Co. Ltd., hereinafter referred to as TrisP-PA) and 26.8 g (0.10 mole) of 5-naphthoquinone diazide sulfonic acid chloride (NAC-5, manufactured by Toyo Gosei Co., Ltd.) were dissolved in 450 g of γ-butyrolactone at room temperature. To this liquid, a mixture of 12.7 g of triethyl amine with 50 g of γ-butyrolactone was added dropwise while maintaining the system below 35° C. After the end of dropping, stirring was performed at 40° C. for 2 hours. The resulting triethylamine salt was filtered and the filtrate was poured in water. Subsequently, the resulting precipitate was collected by filtration, and then washed with 1 L of a 1% hydrochloric acid solution. In addition, further rinsing with 2 L of water was performed twice. The resulting precipitate was dried in a vacuum dryer to provide a quinonediazide compound (b-1) as represented by the following formula.

[Chemical compound 13]

(b-1)

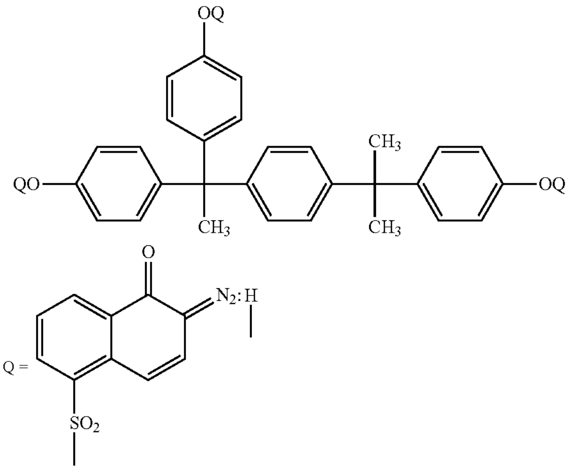

2.0:1.0

Synthesis Example 11 Synthesis of Photosensitizing Agent (Quinonediazide Compound) (b-2)

In a dry nitrogen flow, 21.2 g (0.05 mole) of TrisP-PA and 26.8 g (0.10 mole) of 4-naphthoquinonediazide sulfonic acid chloride (NAC-5, manufactured by Toyo Gosei Co., Ltd.) were dissolved in 450 g of γ-butyrolactone at room temperature. To this liquid, a mixture of 12.7 g of triethyl amine with 50 g of γ-butyrolactone was added dropwise while maintaining the system below 35° C. After the end of dropping, stirring was performed at 40° C. for 2 hours. The resulting triethylamine salt was filtered and the filtrate was poured in water. Subsequently, the resulting precipitate was collected by filtration, and then washed with 1 L of a 1% hydrochloric acid solution. In addition, further rinsing with 2 L of water was performed twice. The resulting precipitate was dried in a vacuum dryer to provide a quinonediazide compound (b-2) as represented by the following formula.

[Chemical compound 14]

(b-2)

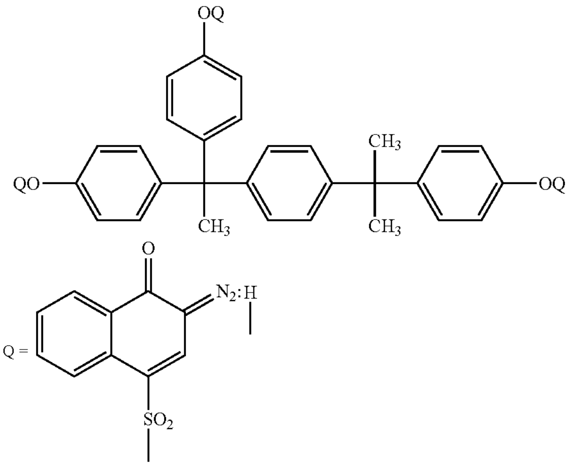

2.0:1.0

Synthesis Example 12 Synthesis of Acrylic Resin (a-10)

In a reaction vessel placed in a nitrogen atmosphere, 150 g of dimethyl aminomethanol (hereinafter referred to as DMEA, manufactured by Tokyo Chemical Industry Co., Ltd.) was fed and heated to 80° C. using an oil bath. To this liquid, a mixture of 20 g of ethyl acrylate (hereinafter referred to as EA), 40 g of 2-ethylhexyl methacrylate (hereinafter referred to as 2-EHMA), 20 g of styrene (hereinafter referred to as St), 15 g of acrylic acid (hereinafter referred to as AA), 0.8 g of 2,2'-azobisisobutyronitrile, and 10 g of DMEA was added dropwise over 1 hour After the end of dropping, the polymerization reaction was continued in a nitrogen atmosphere at 80° C. for additional 6 hours. Then, 1 g of hydroquinone monomethyl ether was added to stop the polymerization reaction. Following this, a mixture of 5 g of glycidyl methacrylate (hereinafter referred to as GMA), 1 g of triethylbenzyl ammonium chloride, and 10 g of DMEA was added dropwise over 0.5 hour. After the end of dropping, the addition reaction was continued in a nitrogen atmosphere at 80° C. for additional 2 hours. The resulting reaction solution was purified with methanol to remove unreacted impurities and vacuum-dried for 24 hours to provide an acrylic resin (a-10) with a copolymerization ratio (by mass) EA/2-EH MA/St/GMA/AA of 20/40/20/5/15. The resulting resin (a-10) had an acid value of 103 mgKOH/g.

Synthesis Example 13 Synthesis of Acrylic Resin (a-11)

A methyl methacrylate/methacrylic acid/styrene copolymer (30/40/30 by weight) was synthesized by the method described in Example 1 of Japanese Patent No. 3120476. After adding 40 parts by weight of glycidyl methacrylate to 100 parts by weight of the resulting copolymer, the addition product was reprecipitated with purified water, filtered, and dried to provide an acrylic resin (a-11) having a weight average molecular weight of 15,000 and an acid value of 110 mgKOH/g.

Preparation Example 1 Preparation of Photosensitive Electrically Conductive Paste 1

In a 100 mL clean bottle, 10.0 g of the resin (a-10), adopted as the resin component, 0.50 g of IRGACURE (registered trademark) OXE-01 (manufactured by Ciba Japan K.K.) as photo initiator, 5.0 g of DMEA as solvent, and 2.0 g of LightAcrylate (registered trademark) BP-4EA (manufactured by Kyoeisha Chemical Co., Ltd.) as a compound with an unsaturated double bond were fed and they were mixed in a rotation-revolution type vacuum mixer (Awatori Rentaro ARE-S10, manufactured by Thinky Corporation) to provide 17.5 g of a resin solution (solid content 71.4 mass %).

Then, 17.50 g of the resulting resin solution, 44.02 g of silver particles with an average particle diameter of 1.0 μm, and 0.28 g of carbon black with an average particle diameter of 0.05 μm were mixed and kneaded in a triple roll mill (EXAKT M-50, manufactured by EXAKT) to provide 61.8 g of a photosensitive electrically conductive paste 1, Here, to determine the average particle diameters of the silver particles and carbon black, their particles were observed by electron microscopy (SEM) under the conditions of a magnification of 10,000× and a visual field width of 12 μm. For the silver particles and carbon black, the maximum sizes of randomly selected 40 primary particles were measured and their number average was calculated.

Preparation Example 2 Preparation of Coloring Agent Dispersion Liquid (DC-1)

Particles of a zirconia compound (Zr-1, manufactured by Nisshin Engineering Inc.), which were produced by the thermal plasma technique, were used as coloring agent. In a tank, 200 g of Zr-1, 114 g of a 35 wt % solution of an acrylic polymer (P-1) in propylene glycol monomethyl ether acetate (PGMEA), 25 g of DISPERBYK (registered trademark) LPN-21116, which has a tertiary amino group and a quaternary ammonium salt and which was adopted as polymer dispersant, and 661 g of PGMEA were fed and stirred by a homo mixer for 20 minutes to provide a preliminary dispersion liquid. The resulting preliminary dispersion liquid was fed to a disperser equipped with a centrifugal separator (Ultra Apex Mill, manufactured by Kotobuki Industry Co., Ltd.) that was 75 vol % filled with zirconia beads with a diameter of 0.05 mm, and dispersion was carried out at a rotation speed of 8 m/s for 3 hours to provide a coloring agent dispersion liquid (DC-1) having a solid content of 25 wt % and a coloring agent/resin ratio (by weight) of 80/20.

Preparation Example 3 Preparation of Photosensitive Coloring Resin Composition 1

To 283.1 g of the coloring agent dispersion liquid (DC-1), 184.4 g of a 35 wt % solution of the resin (a-11) in PGMEA, 50.1 g of dipentaerythritol hexaacrylate (manufactured by Nippon Kayaku Co., Ltd.), which was adopted as polyfunctional monomer, 7.5 g of Irgacure (registered trademark) 907 (manufactured by BASF), 3.8 g of KAYACURE (registered trademark) DETX-S (manufactured by Nippon Kayaku Co., Ltd.), both as photo initiator, 12.0 g of KBM5103 (manufactured by Shin-Etsu Chemical Co., Ltd.) as adhesion promoter, and a solution prepared by dissolving 3 g of a 10 wt % PGMEA solution of a silicone based surfactant (BYK (registered trademark) 333, manufactured by BYK-Chemie) in 456.1 g of PGMEA, which was adopted as surfactant, were added to provide a photosensitive coloring resin composition 1 having a total solid content of 20 wt % and a coloring agent/resin ratio (by weight) of 30/70.

Preparation Example 4 Preparation of Coloring Agent Dispersion Liquid (DC-2)

According to the method described in Published Japanese Translation of PCT International Publication JP 2008-517330, the carbon black (CB-Bk1), which had a surface modified with the sulfo group, had a surface element constitution of [C: 88%, O: 7%, Na: 3%, S: 2%] and the state of the S element was such that those S2p peak components attributed to C—S and S—S accounted for 90% while those attributed to SO and SOx accounted for 10%. The BET value was 54 $m^2/g$.

In a tank, this carbon black CB-Bk1 (200 g), a 40 mass % solution of the acrylic resin (a-11) in propylene glycol monomethyl ether acetate (94 g), a 40 mass % solution of LPN21116 (manufactured by BYK-Chemie Japan) (31 g), which was adopted as polymer dispersant, and propylene glycol monomethyl ether acetate (675 g) were fed and stirred for 1 hour using a homo mixer (manufactured by Tokushu Kika Kogyo Co., Ltd.) to provide a preliminary dispersion liquid. After that, the preliminary dispersion liquid was fed to a disperser equipped with a centrifugal separator (Ultra Apex Mill, manufactured by Kotobuki Industry Co., Ltd.) that was 70% filled with zirconia beads (YTZ Ball, manufactured by Nikkato Corporation) with a diameter of 0.05 mm, and dispersion was carried out at a rotation speed of 8 m/s for 2 hours to provide a coloring agent dispersion liquid (DC-2) having a solid content of 25 mass % and a coloring agent/resin ratio (by mass) of 80/20.

Preparation Example 5 Preparation of Photosensitive Coloring Resin Composition 2

To 534.8 g of the coloring agent dispersion liquid (DC-2), 122.1 g of a 40 mass % solution of the resin (a-11) in PGMEA, 47.3 g of dipentaerythritol hexaacrylate (manufactured by Nippon Kayaku Co., Ltd.), which was adopted as polyfunctional monomer, 11.8 g of ADEKA KLUSE NCI-831 (manufactured by Adeka Corporation) as photo initiator, 12.0 g of KBM5103 (manufactured by Shin-Etsu Chemical Co., Ltd.) as adhesion promoter, and a solution prepared by dissolving 4 g of a 10 mass % PGMEA solution of a silicone based surfactant (BYK (registered trademark) 333, manufactured by BYK-Chemie) in 194.0 g of PGMEA, which was adopted as surfactant, were added to provide a photosensitive coloring resin composition 2 having a total solid content of 25 mass % and a coloring agent/resin ratio (by weight) of 45/55.

The component (a-9), component (b-3), component (c-1), component (c-2), other components, and solvents that were used in Examples and Comparative examples are listed below.

(a-9) phenol resin MEHC-7851 (manufactured by Meiwa Plastic Industries, Ltd.)

(c-1) HMOM-TPHAP (manufactured by Honshu Chemical Industry Co., Ltd.)

(c-2) YX4000H (manufactured by Mitsubishi Chemical Corporation)

(b-3): photo initiator NCI-831 (manufactured by Adeka Corporation)

Other Components:

(f-1): dipentaerythritol hexaacrylate (DPHA, manufactured by Kyoceisha Chemical Co., Ltd.)

(f-2): 2,4-diethyl thioxanthone (KAYACURE DETX-S, manufactured by Nippon Kayaku Co., Ltd.)

(f-3): 2,5-bis(1,1,3,3-tetramethylbutyl)hydroquinone (DOHQ, manufactured by Wako Pure Chemical Industries, Ltd.)

Solvent:

GBL: γ-butyrolactone

PGMEA: propylene glycol monomethyl ether acetate

Table 1 lists the constitutions of the resin compositions used, each consisting of a resin (A), photosensitizing agent (B), thermal crosslinking agent (C), etc. Table 2-1 shows the resin compositions used in Examples, inorganic insulation films, the total thickness of the insulation film (μm), the number of cured film layers, the number of inorganic insulation films, the positions of the inorganic insulation films, the thickness of the inorganic insulation films (μm), α/β, β/γ, and the defective rate evaluation results after reliability test of display devices. Furthermore, Table 2-2 gives the resin compositions used in Examples, the shape and length of hole pattern created in the cured film, and the efficiency of light extraction from display devices.

TABLE 1

| | components of resin (A) (content) | | photosensitive agent (B) (content) |
|---|---|---|---|
| resin composition 1 | (a-1) (100 parts by mass) | — | (b-1) (11 parts by mass) |
| resin | (a-1) (100 | — | (b-1) (14 |

[Chemical compound 15]

(a-9)

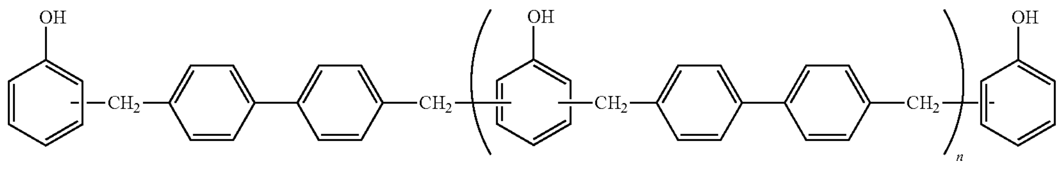

(c-1)

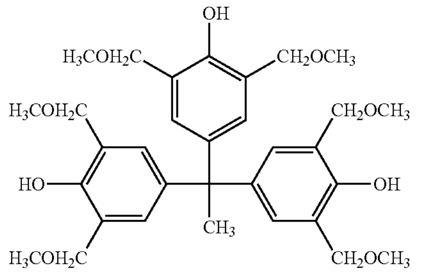

(c-2)

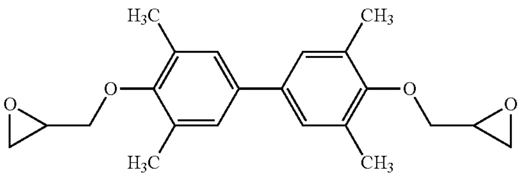

TABLE 1-continued

| | | | |
|---|---|---|---|
| composition 2 | parts by mass) | | parts by mass) |
| resin composition 3 | (a-1) (100 parts by mass) | — | (b-1) (20 parts by mass) |
| resin composition 4 | (a-1) (100 parts by mass) | — | (b-1) (20 parts by mass) |
| resin composition 5 | (a-2) (100 parts by mass) | — | (b-1) (20 parts by mass) |
| resin composition 6 | (a-3) (100 parts by mass) | — | (b-1) (20 parts by mass) |
| resin composition 7 | (a-4) (100 parts by mass) | — | (b-1) (20 parts by mass) |
| resin composition 8 | (a-5) (100 parts by mass) | — | (b-1) (20 parts by mass) |
| resin composition 9 | (a-6) (100 parts by mass) | — | (b-1) (20 parts by mass) |
| resin composition 10 | (a-1) (100 parts by mass) | (a-9) (19 parts by mass) | (b-1) (20 parts by mass) |
| resin composition 11 | (a-5) (100 parts by mass) | — | — |
| resin composition 12 | (a-1) (100 parts by mass) | — | — |
| resin composition 13 | (a-7) (100 parts by mass) | — | (b-1) (20 parts by mass) |
| resin composition 14 | (a-8) (100 parts by mass) | — | — |
| resin composition 15 | (a-1) (100 parts by mass) | — | (b-1) (10 parts by mass) |
| resin composition 16 | (a-1) (100 parts by mass) | — | — |

| | photosensitive agent (B) (content) | | thermal crosslinking agent (C) (content) |
|---|---|---|---|
| resin composition 1 | (b-2) (9 parts by mass) | — | (c-1) (20 parts by mass) |
| resin composition 2 | (b-2) (6 parts by mass) | — | (c-1) (20 parts by mass) |
| resin composition 3 | — | — | (c-1) (20 parts by mass) |
| resin composition 4 | — | — | (c-1) (10 parts by mass) |
| resin composition 5 | — | — | (c-1) (20 parts by mass) |
| resin composition 6 | — | — | (c-1) (20 parts by mass) |
| resin composition 7 | — | — | (c-1) (20 parts by mass) |
| resin composition 8 | — | — | (c-1) (20 parts by mass) |
| resin composition 9 | — | — | (c-1) (20 parts by mass) |
| resin composition 10 | — | — | (c-1) (20 parts by mass) |
| resin composition 11 | — | (b-3) (5 parts by mass) | (c-1) (20 parts by mass) |
| resin composition 12 | — | — | (c-1) (20 parts by mass) |
| resin composition 13 | — | — | (c-1) (20 parts by mass) |
| resin composition 14 | — | (b-3) (5 parts by mass) | (c-1) (20 parts by mass) |
| resin composition 15 | (b-2) (10 parts by mass) | — | (c-1) (20 parts by mass) |
| resin composition 16 | (b-2) (20 parts by mass) | — | (c-1) (20 parts by mass) |

| | thermal crosslinking agent (C) (content) | other components | solvent |
|---|---|---|---|
| resin composition 1 | — | — | GBL |
| resin composition 2 | — | — | GBL |
| resin composition 3 | — | — | GBL |
| resin composition 4 | (c-2) (10 parts by mass) | — | GBL |
| resin composition 5 | — | — | GBL |
| resin composition 6 | — | — | GBL |
| resin composition 7 | — | — | GBL |
| resin composition 8 | — | — | GBL |
| resin composition 9 | — | — | GBL |
| resin composition 10 | — | — | GBL |
| resin composition 11 | — | (f-1) (20 parts by mass) | GBL |
| resin composition 12 | — | — | GBL |
| resin composition 13 | — | — | GBL |
| resin composition 14 | — | (f-1) (20 parts by mass) | GBL |
| resin composition 15 | — | — | GBL |
| resin composition 16 | — | — | GBL |

TABLE 2-1

| | display device | resin composition | inorganic insulation film | total thickness of insulation (μm) | number of cured film layers | number of inorganic insulation film layers | position of inorganic insulation film | thickness of inorganic insulation film (μm) | α/β | β/γ | evaluation item (1) |
|---|---|---|---|---|---|---|---|---|---|---|---|
| Example 1 | display device 1 | resin composition 1 | $SiO_2$ | 24.4 | 3 | 1 | between 3rd and 2nd layers | 0.4 | 25.0 | 0.06 | B |
| Example 2 | display device 2 | resin composition 2 | $SiO_2$ | 24.4 | 3 | 1 | between 3rd and 2nd layers | 0.4 | 25.0 | 0.06 | B |
| Example 3 | display device 3 | resin composition 3 | $SiO_2$ | 24 4 | 3 | 1 | between 3rd and 2nd layers | 0.4 | 25.0 | 0.06 | B |
| Example 4 | display device 4 | resin composition 4 | $SiO_2$ | 24.4 | 3 | 1 | between 3rd and 2nd layers | 0.4 | 25.0 | 0.06 | A |
| Example 5 | display device 5 | resin composition 5 | $SiO_2$ | 24.4 | 3 | 1 | between 3rd and 2nd layers | 0.4 | 25.0 | 0.06 | B |
| Example 6 | display device 6 | resin composition 6 | $SiO_2$ | 24.4 | 3 | 1 | between 3rd and 2nd layers | 0.4 | 25.0 | 0.06 | B |
| Example 7 | display device 7 | resin composition 7 | $SiO_2$ | 24.4 | 3 | 1 | between 3rd and 2nd layers | 0.4 | 25.0 | 0.06 | B |
| Example 8 | display device 8 | resin composition 8 | $SiO_2$ | 24 4 | 3 | 1 | between 3rd and 2nd layers | 0.4 | 25.0 | 0.06 | A |
| Example 9 | display device 9 | resin composition 9 | $SiO_2$ | 24.4 | 3 | 1 | between 3rd and 2nd layers | 0.4 | 25.0 | 0.06 | C |

TABLE 2-1-continued

| | display device | resin composition | inorganic insulation film | total thickness of insulation (μm) | number of cured film layers | number of inorganic insulation film layers | position of inorganic insulation film | thickness of inorganic insulation film (μm) | α/β | β/γ | evaluation item (1) |
|---|---|---|---|---|---|---|---|---|---|---|---|
| Example 10 | display device 10 | resin composition 10 | $SiO_2$ | 24.4 | 3 | 1 | between 3rd and 2nd layers | 0.4 | 25.0 | 0.06 | A |
| Example 11 | display device 11 | resin composition 11 | $SiO_2$ | 24.4 | 3 | 1 | between 3rd and 2nd layers | 0.4 | 25.0 | 0 06 | C |
| Example 12 | display device 12 | resin composition 12 | $SiO_2$ | 24.4 | 3 | 1 | between 3rd and 2nd layers | 0.4 | 25.0 | 0.06 | D |
| Example 13 | display device 13 | resin composition 13 | $SiO_2$ | 24 4 | 3 | 1 | between 3rd and 2nd layers | 0.4 | 25.0 | 0.06 | E |
| Example 14 | display device 14 | resin composition 14 | $SiO_2$ | 24.4 | 3 | 1 | between 3rd and 2nd layers | 0.4 | 25.0 | 0.06 | E |
| Example 15 | display device 15 | resin composition 4 | $SiO_2$ | 24.4 | 3 | 1 | between 3rd and 2nd layers | 0.4 | 25.0 | 0.06 | B |
| Example 16 | display device 16 | resin composition 4 | $SiO_2$ | 24.4 | 3 | 1 | between 3rd and 2nd layers | 0.4 | 25.0 | 0 06 | A |
| Example 17 | display device 17 | resin composition 4 | $SiO_2$ | 24.4 | 3 | 1 | between 1st layer and LED | 0.4 | 17.5 | — | C |
| Example 18 | display device 18 | resin composition 4 | $SiO_2$ | 24.4 | 3 | 1 | between 2nd and 1st layers | 0.4 | 17.5 | 0.06 | C |
| Example 19 | display device 19 | resin composition 4 | $SiO_2$ | 21 4 | 3 | 1 | on 3rd cure film layer | 0.4 | — | 0.06 | D |
| Example 20 | display device 20 | resin composition 4 | $SiO_2$ | 26.0 | 3 | 1 | between 3rd and 2nd layers | 2.0 | 5.0 | 0.29 | B |
| Example 21 | display device 21 | resin composition 4 | $SiO_2$ | 25.0 | 3 | 1 | between 3rd and 2nd layers | 1.0 | 10.0 | 0 14 | A |
| Example 22 | display device 22 | resin composition 4 | $SiO_2$ | 24.1 | 3 | 1 | between 3rd and 2nd layers | 0.1 | 100.0 | 0.01 | B |
| Example 23 | display device 23 | resin composition 4 | $SiO_2$ | 38.0 | 3 | 1 | between 3rd and 2nd layers | 1.0 | 15.0 | 0.06 | B |
| Example 24 | display device 24 | resin composition 4 | $SiO_2$ | 30 0 | 3 | 1 | between 3rd and 2nd layers | 1.0 | 15.0 | 0.14 | A |
| Example 25 | display device 25 | resin composition 4 | $SiO_2$ | 25.0 | 3 | 1 | between 3rd and 2nd layers | 1.0 | 7.0 | 0.06 | B |
| Example 26 | display device 28 | resin composition 4 | $SiO_2$ | 24.4 | 3 | 1 | between 3rd and 2nd layers | 0.4 | 25.0 | 0.06 | A |
| Example 27 | display device 29 | resin composition 4 | $SiO_2$ | 24.4 | 3 | 1 | between 3rd and 2nd layers | 0.4 | 25.0 | 0.06 | A |
| Example 28 | display device 30 | resin composition 4 | $SiO_2$ | 24.4 | 3 | 1 | between 3rd and 2nd layers | 0.4 | 25.0 | 0.06 | A |
| Example 29 | display device 31 | resin composition 4 | $SiO_2$ | 24 4 | 3 | 1 | between 3rd and 2nd layers | 0.4 | 25.0 | 0.06 | A |
| Example 30 | display device 32 | resin composition 4 | $SiO_2$ | 24.4 | 3 | 1 | between 3rd and 2nd layers | 0.4 | 25.0 | 0.06 | A |
| Example 31 | display device 33 | resin composition 4 | $SiO_2$ | 24.4 | 3 | 1 | between 3rd and 2nd layers | 0.4 | 25.0 | 0.06 | A |
| Comparative example 1 | display device 26 | resin composition 15 | — | 24.0 | 3 | 1 | — | — | — | — | F |
| Comparative example 2 | display device 27 | resin composition 16 | — | 24.0 | 3 | 1 | — | — | — | — | F |

TABLE 2-2

| | display device | resin composition | shape and maximum size of hole created in cured film | light extraction efficiently | evaluation item (2) |
|---|---|---|---|---|---|
| Example 1 | display device 1 | resin composition 1 | circular, diameter 2 μm | 1.00 | C |
| Example 4 | display device 4 | resin composition 4 | circular, diameter 2 μm | 1.18 | B |
| Example 15 | display device 15 | resin composition 4 | circular, diameter 2 μm | 1.22 | A |
| Example 16 | display device 16 | resin composition 4 | circular, diameter 2 μm | 1.30 | A |
| Example 30 | display device 32 | resin composition 4 | circular, diameter 2 μm | 1.10 | B |
| Example 31 | display device 33 | resin composition 4 | circular, diameter 2 μm | 1.10 | B |
| Comparative example 1 | display device 26 | resin composition 15 | circular, diameter 2 μm | 0.98 | D |
| Comparative example 2 | display device 27 | resin composition 16 | circular, diameter 2 μm | 0.92 | D |

For the evaluation item (1), a display device was rated as level A if its 10 samples gave a defective rate of 0.25 or less, rated as level B if display device samples gave a defective rate of more than 0.25 and 0.30 or less, rated as level C if display device samples gave a defective rate of 0.35 or less, rated as level D if display device samples gave a defective rate of 0.40 or less, rated as level E if display device samples gave a defective rate of more than 0.40 and 0.45 or less, and rated as level F if display device samples gave a defective rate of more than 0.45. A display device is assessed as practically acceptable if it is rated as level A to level E or it is assessed as practically unacceptable if it is rated as level F because the defective rate is too high for the display device.

For the evaluation item (2), a display device was rated as level A if it showed a light extraction efficiency of 1.20 or more relative to the one produced in Example 1, rated as level B if the display device produced showed a light extraction efficiency of 1.10 or more relative to the one produced in Example 1, rated as level C if the display device produced showed a light extraction efficiency of 1.00 or more relative to the one produced in Example 1, and rated as level D if the display device produced showed a light extraction efficiency of less than 1.00 relative to the one produced in Example 1.

Figure 13:
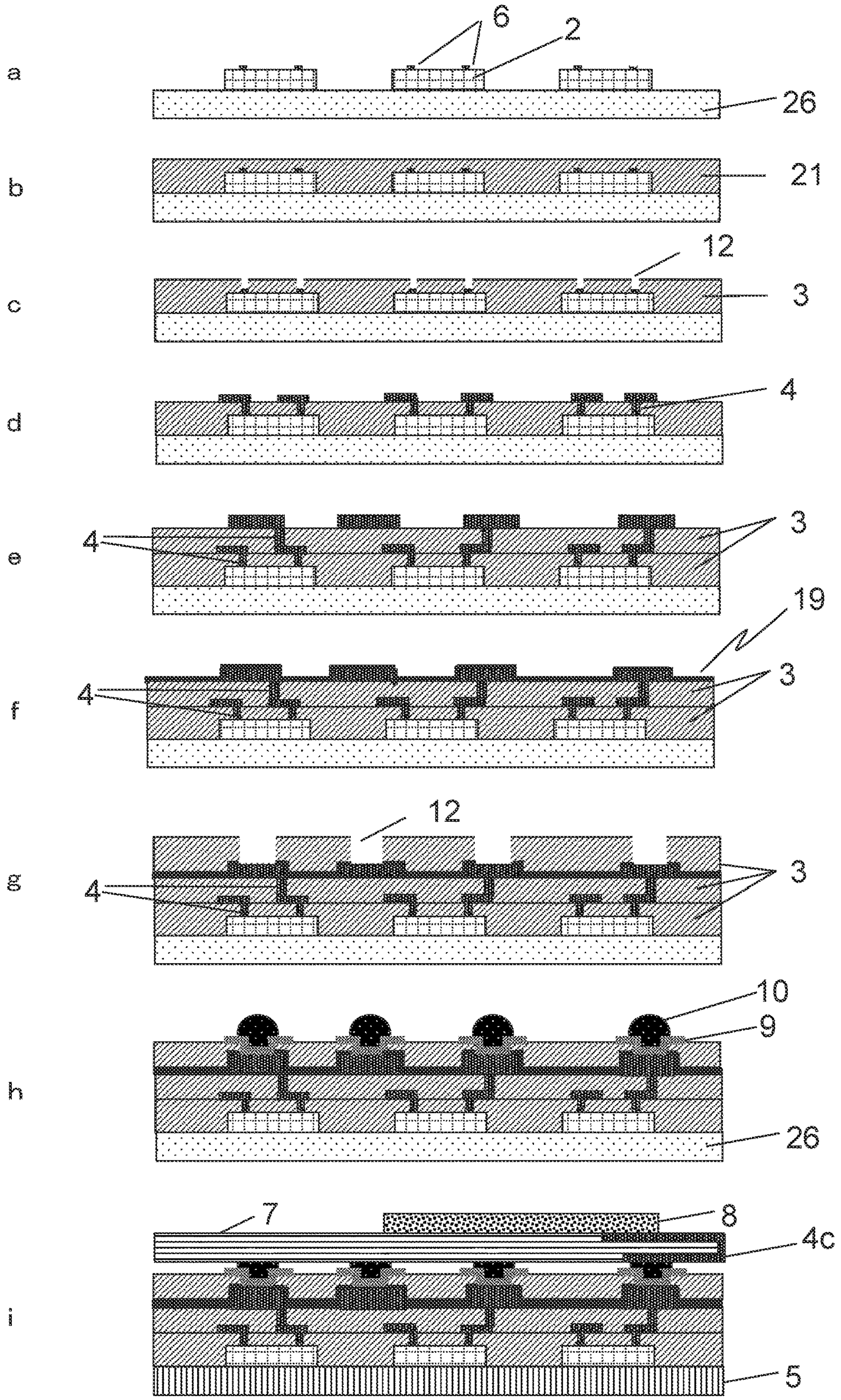
FIG. 13 This gives a cross-sectional view of a production process for an embodiment of the display device according to the present invention.

Example 1 (Steps in FIG. 13)

An example of the display according to the present invention is described below with reference to the cross-sectional views of the production steps given in FIG. 13.

As illustrated in FIG. 13*a*, a glass substrate was used as the support substrate 26. Some temporarily attached materials made of polyimide were disposed on the glass substrate, and light emitting elements 2, which were designed to work as light emitting elements, were disposed on the support substrate 26 (step (D1)). Each light emitting element 2 had a thickness of 5 μm and had a pair of sides with a length of 30 μm and the other pair of sides with a length of 50 μm.

Next, as illustrated in FIG. 13*b*, the resin composition 1 given in Table 1 was spread on the support substrate 26 and the light emitting elements 2 in such a manner that its thickness would be 7 μm after heat treatment, thereby forming a resin film 21 (step (D2)).

Then, as illustrated in FIG. 13*c*, the resin film 21 was irradiated with i-line light (365 nm) through a mask having a desired pattern. The irradiated resin film 21 was developed with a 2.38 mass % aqueous solution of tetramethyl ammonium (TMAH) to form a plurality of hole patterns 12 that penetrated the resin film 21 in the thickness direction (step (D3)). Each hole pattern had a circular shape, and the hole pattern had a diameter of 2 μm as the maximum size in the bottom face portion in the smallest region.

Next, the resin film 21 was cured by performing heat treatment at 110° C. for 30 minutes in an atmosphere having an oxygen concentration of 100 ppm or less and additional heat treatment at 230° C. for 60 minutes to form a cured film 3 with a thickness of 7 μm (step (D4)). Thus, the resin film 21 was cured directly to form a cured film 3.

Next, as illustrated in FIG. 13*d*, barrier metal of titanium was sputtered on the cured film 3 and in addition, a copper seed layer was formed on top of it by sputtering. Following this, a photoresist layer was formed, and then metal wires 4 of copper connected electrically to the emitting elements 2 were formed by the plating technique in the hole pattern 12 in the cured film 3 and on part of the surface of the cured film 3. Subsequently, the photoresist, seed layer, and barrier metal were removed (step (D5)). The metal wires 4*a* formed on part of the surface of the cured film 3 had a thickness of 5 μm.

Then, as illustrated in FIG. 13*e*, the step (D2), step (D3), step (D4), and step (D5) were carried out repeatedly to form two cured film layers 3 in such a manner that their thickness would be 7 μm after heat treatment.

Next, as illustrated in FIG. 13*f*, silicon oxide ($SiO_2$) was deposited by the CVD technique on the cured film 3 and the metal wires 4 to form an inorganic insulation film with a thickness of 0.4 μm (corresponding to the step (D6)).

Subsequently, as illustrated in FIG. 13*g*, the step (D2) was carried out in such a manner that the thickness would be 10 μm after heat treatment, and then the step (D3), step (D4), step (D5), and step (D7) for removing the inorganic insulation film by etching were carried out to form a total of three cured film layers 3.

The resulting insulation layer had a total thickness of 24.4 μm.

Then, as illustrated in FIG. 13*h*, barrier metal 9 was formed by sputtering on each hole pattern 12 in the cured film 3, followed by forming solder bumps 10. Subsequently, as illustrated in FIG. 13*i*, the solder was reflowed at 250° C. for 1 minute to allow it to be electrically connected through the solder bump 10 to a light emitting element driving substrate 7 that had a driver IC as drive element 8*d*. Then, the support substrate 26 was removed and an opposite substrate 5 was attached using an adhesive etc., thus producing a display device 1 that had a plurality of emitting elements 2.

Example 2

Except for replacing the resin composition 1 used in Example 1 with a resin sheet prepared from the resin composition 2 and using the lamination technique to form the resin film 21, the same procedure as in Example 1 was carried out to produce a display device 2.

Examples 3 to 14

Except for replacing the resin composition 1 used in Example 1 with the resin compositions 3 to 14, the same procedure as in Example 1 was carried out to produce displays 3 to 14.

Example 15

Figure 14:
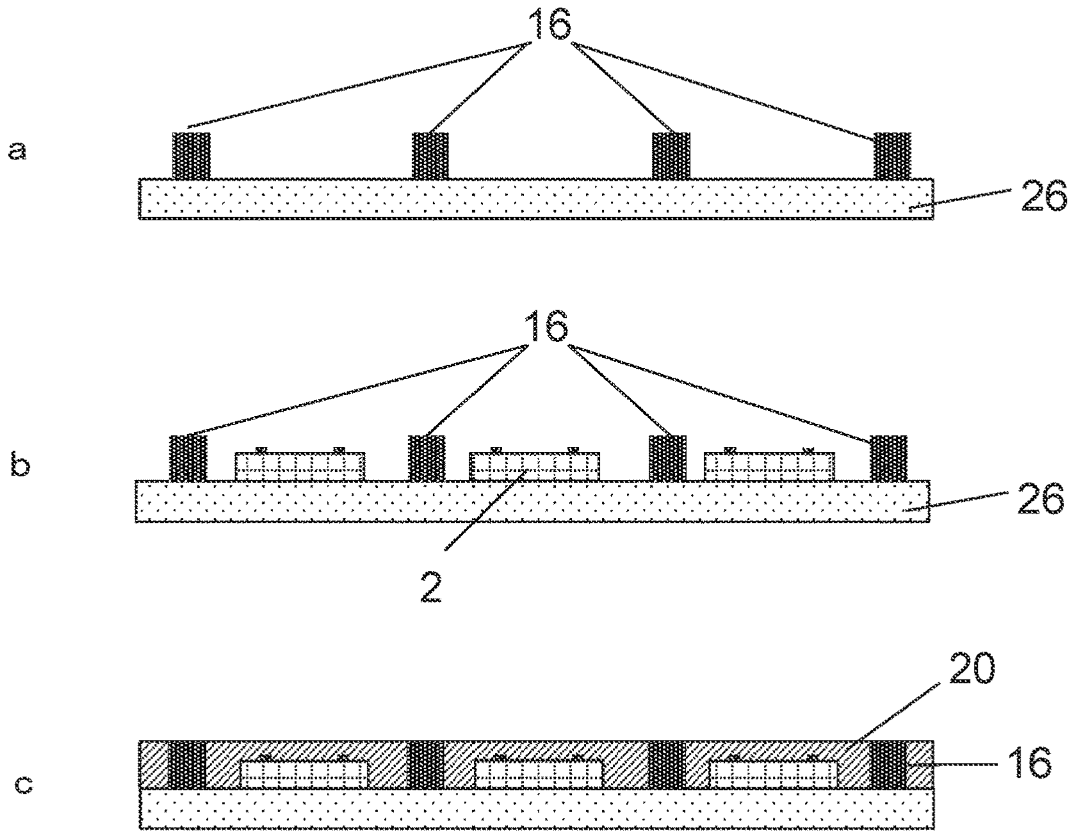
FIG. 14 This gives a cross-sectional view of a production process for an embodiment of the display according to the present invention that has partition walls.

As illustrated in FIG. 14*a*, partition walls 16 were formed on the support substrate 26 (corresponding to the step (D8)). Next, as illustrated in FIG. 14*b*, emitting elements 2 were formed between the partition walls 16 (corresponding to the step (D1)). Except for this, the same steps as in Example 4 were carried out to produce a display device 15. Here, each emitting element 2 had a thickness of 5 μm and each partition wall 16 had a thickness of 7 μm. To form the partition walls 16, an acrylic resin containing a generally known white pigment was used.

Example 16

Figure 15:
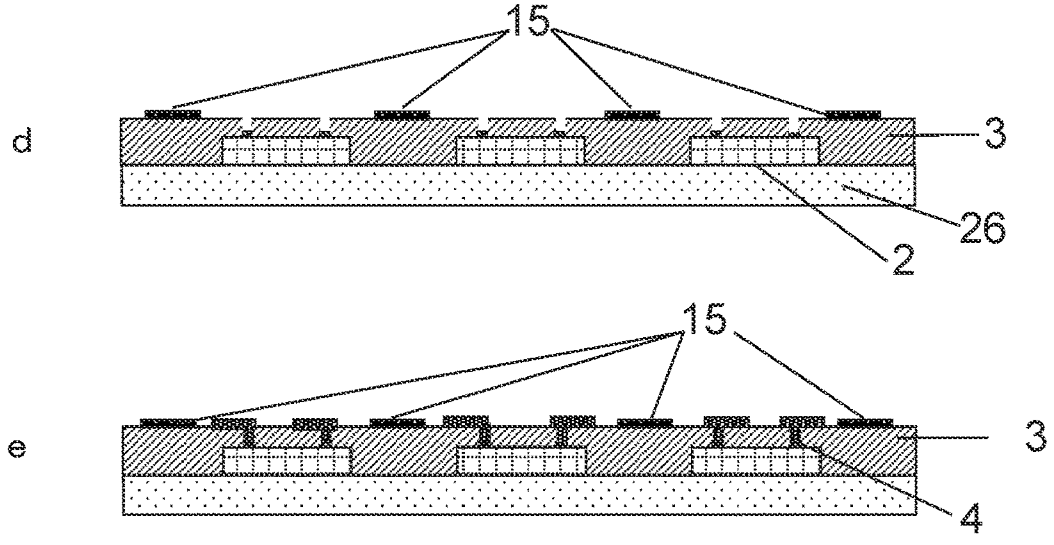
FIG. 15 This gives a cross-sectional view of a production process for an embodiment of the display according to the present invention that has reflecting walls.

As illustrated in FIG. 15*d*, after carrying out the step (D4) shown in FIG. 13*c* where a cured film was formed by the same procedure as in Example 4, aluminum was sputtered to a thickness of 0.2 μm at appropriate positions so as to avoid the metal wires 4 to be formed later, thereby producing reflecting films 15 (step (09)). Except for this, the same steps as in Example 4 were carried out to produce a display device 16.

Example 17

Figure 16:
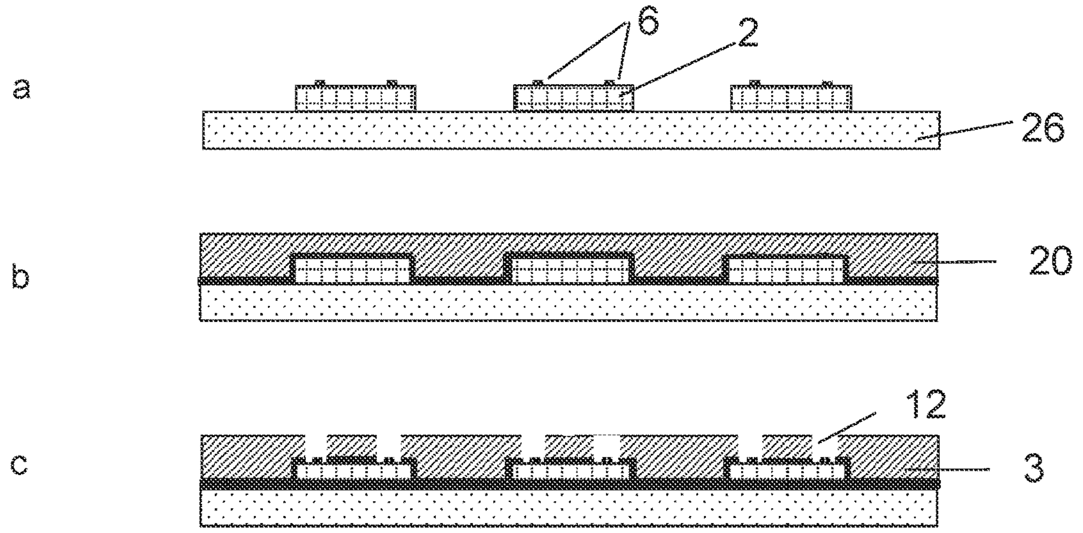
FIG. 16 This gives a cross-sectional view of a production process for another embodiment of the display device according to the present invention.

As illustrated in FIG. 16*a*, light emitting elements 2, which were designed to work as light emitting elements, were disposed on the support substrate 26 (step (D1)). Next, as illustrated in FIG. 16*b*, silicon oxide ($SiO_2$) was deposited by the CVD technique to form an inorganic insulation film with a thickness of 0.4 μm (corresponding to the step (D6)). As illustrated in FIG. 16*c*, the step (D2) was carried out in such a manner that the thickness would be 7 μm after heat treatment, and then the step (D3), step (04), step (D5), and step (07) for removing the inorganic insulation film by etching were carried out to form the first cured film layer 3. Then, the step (D2), step (03), step (D4), and step (D5) were carried out repeatedly to form three cured film layers 3. The second cured film layer and the third cured film layer were formed in such a manner that they would have thicknesses of 7 μm and 10 μm, respectively. Except for this, the same steps as in Example 4 were carried out to produce a display device 17.

Example 18

Figure 17:
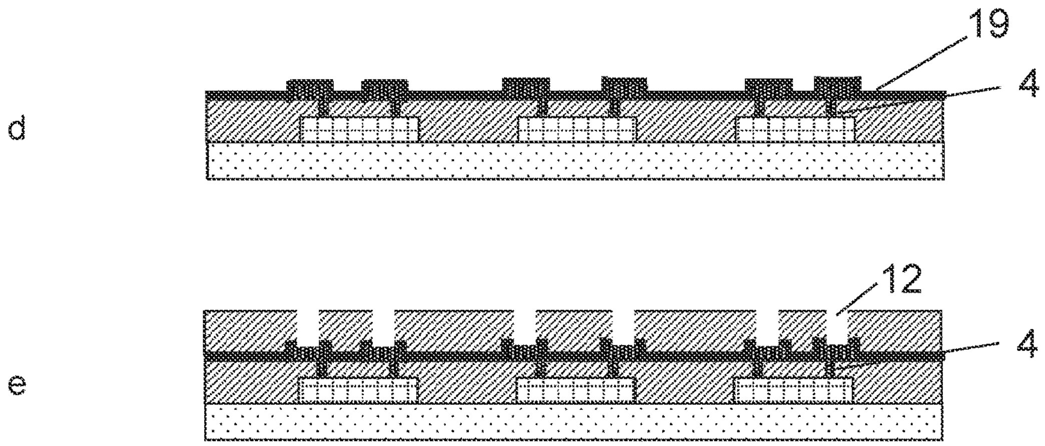
FIG. 17 This gives a cross-sectional view of a production process for another embodiment of the display device according to the present invention.

As illustrated in FIG. 17*d*, after carrying out the step (D4) shown in FIG. 13*c* where a cured film was formed by the same procedure as in Example 4, silicon oxide ($SiO_2$) was deposited by the CVD technique to form an inorganic insulation film with a thickness of 0.4 μm (corresponding to the step (D6)). As illustrated in FIG. 17*e*, the step (D2) was carried out in such a manner that the thickness would be 7 μm after heat treatment, and then the step (03), step (D4), step (D5), and step (D7) for removing the inorganic insulation film by etching were carried out to form the second cured film layer 3. Then, the step (D2), step (D3), step (D4), and step (D5) were carried out to form three cured film layers 3. The third cured film layer was formed in such a manner that it would have a thickness of 10 μm. Except for this, the same steps as in Example 4 were carried out to produce a display device 18.

Example 19

Figure 18:
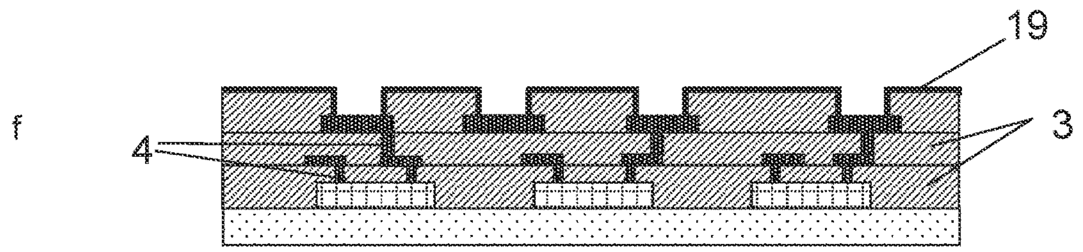
FIG. 18 This gives a cross-sectional view of a production process for another embodiment of the display device according to the present invention.

As illustrated in FIG. 18*f*, after carrying out the step (D4) shown in FIG. 13*e* where a cured film was formed by the same procedure as in Example 4, the step (D2) was carried out in such a manner that the thickness would be 7 μm after heat treatment, and then the step (03), step (D4), and step (D5) were carried out to form the third cured film layer 3. Subsequently, silicon oxide ($SiO_2$) was deposited by the CVD technique to form an inorganic insulation film with a thickness of 0.4 μm (corresponding to the step (D6)). The step (D7) for removing the inorganic insulation film by etching was carried out to allow connection to the barrier metal 9 and bumps 10 that would be formed later. Except for this, the same steps as in Example 4 were carried out to produce a display device 19.

Example 20

Unlike Example 4, the inorganic insulation film had a thickness of 2.0 μm, and except for this, the same procedure as in Example 4 was carried out to produce a display device 20.

Example 21

Unlike Example 4, the inorganic insulation film had a thickness of 1.0 μm, and except for this, the same procedure as in Example 4 was carried out to produce a display device 21.

Example 22

Unlike Example 4, the inorganic insulation film had a thickness of 0.1 μm, and except for this, the same procedure as in Example 4 was carried out to produce a display device 22.

Example 23

Unlike Example 4, the inorganic insulation film had a thickness of 1.0 μm, and the second cured film layer 3 and the third cured film layer 3 both had a thickness of 15 μm. Except for this, the same procedure as in Example 4 was carried out to produce a display device 23.

Example 24

Unlike Example 4, the inorganic insulation film had a thickness of 1.0 μm, and the second cured film layer 3 and the third cured film layer 3 had thicknesses of 7 μm and 15 μm, respectively. Except for this, the same procedure as in Example 4 was carried out to produce a display device 24.

Example 25

Unlike Example 4, the inorganic insulation film had a thickness of 1.0 μm, and the second cured film layer 3 and the third cured film layer 3 had thicknesses of 15 μm and 7 μm, respectively. Except for this, the same procedure as in Example 4 was carried out to produce a display device 25.

Example 26

The resin composition 4 was adopted instead of the resin composition 1 used in Example 1 and, as illustrated in FIG. 13*i*, a groove was formed by laser processing in a side face of the light emitting element driving substrate, followed by sputtering of titanium and copper in this order and plating with copper to form a metal wire 4*c* (corresponding to the step D10). Except for this, the same procedure as in Example 1 was carried out to produce a display 28.

Example 27

Figure 19:
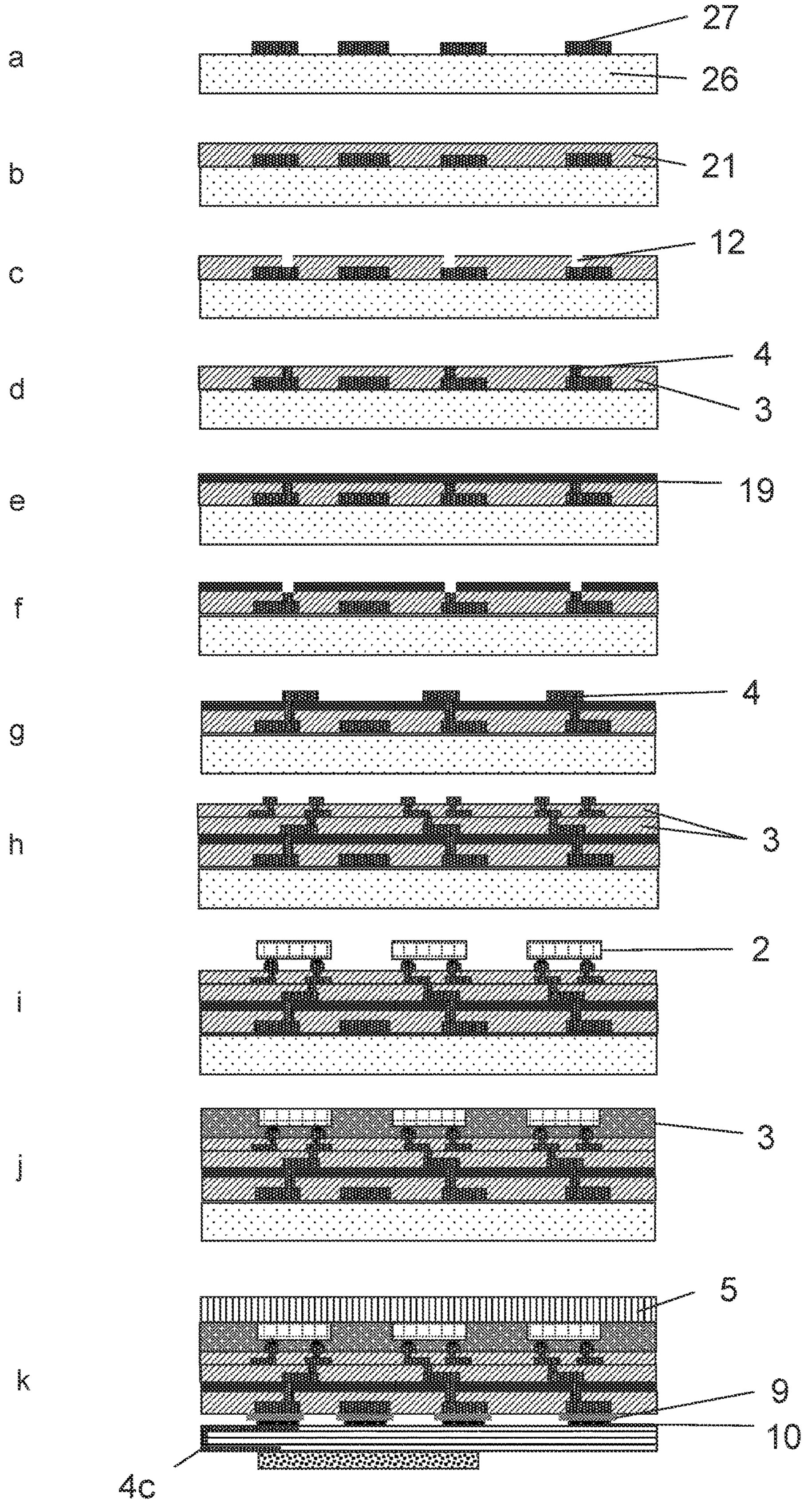
FIG. 19 This gives a cross-sectional view of a production process for another example of the display device according to the present invention.

An example of the display device according to the present invention is described below with reference to the cross-sectional views of the production steps given in FIG. 19.

First, as illustrated in FIG. 19*a*, electrode pads 27 made of copper were formed on the support substrate 26 (corresponding to the step (E1)), The electrode pads had a thickness of 0.2 μm, Next, as illustrated in FIG. 19*b*, the resin composition 4 described in Table 1 was spread on the support substrate 26 and on the metal pads 27 in such a manner that its thickness would be 10 μm after heat treatment, thereby forming a resin film 21 (corresponding to the step (E2)).

Next, as illustrated in FIG. 19*c*, a plurality of hole patterns 12 was formed in the resin film 21 under the same conditions as adopted in the photolithography steps described in Example 1 (corresponding to the step (E3)).

Next, the resin film 21 was cured under the same conditions as in Example 1 to form a cured film 3 with a thickness of 10 μm (corresponding to the step (E4)).

Following this, in order to improve the adhesion between the cured film 3 and the metal wires 4 in FIG. 19*c*, barrier metal such as titanium was sputtered on the cured film 3 and in addition, a copper seed (seed layer) was formed on top of it by sputtering.

Next, as illustrated in FIG. 19*d*, a photoresist layer was formed and then metal wires 4 of copper were formed by the plating technique in the hole patterns 12 in the cured film 3 (corresponding to the step (E5)). Subsequently, the photoresist, seed layer, and barrier metal were removed.

Next, as illustrated in FIG. 19*e*, silicon oxide ($SiO_2$) was deposited by the CVD technique on the cured film 3 and the metal wires 4 to form an inorganic insulation film with a thickness of 0.4 μm (corresponding to the step (E6)). Subsequently, as illustrated in FIG. 19*f*, the step (E7) for removing the inorganic insulation film by etching was carried out.

Then, the step (E2), step (E3), step (E4), and step (E5) were repeated twice to form three cured film layers 3 that had metal wires 4 extending in the cured film 3 as illustrated in FIG. 19*h*. The resulting insulation layer had a total thickness of 24.4 μm.

Next, as illustrated in FIG. 19*i*, light emitting elements 2 were formed on the cured film 3 while maintaining electric connection to the metal wires 4 (corresponding to the step (E8)). The emitting elements 2 had a thickness of 7 μm.

Next, as illustrated in FIG. 19*j*, a resin film 21 was formed from the resin composition 4 on the cured film 3 and light emitting elements 2 and cured by heat treatment to form a cured film 3. Here, the cured film 3 was formed by performing heat treatment at 110° C. for 30 minutes in an atmosphere having an oxygen concentration of 100 ppm or less and additional heat treatment at 230° C. for 60 minutes.

Subsequently, as illustrated in FIG. 19*k*, the support substrate 26 was removed, followed by attaching a light emitting element driving substrate 7 that had a driver IC as drive element 8 and was electrically connected via the solder bumps 10.

Furthermore, a groove was formed by laser processing in a side face of the light emitting element driving substrate as illustrated in FIG. 19*k*, followed by sputtering of titanium and copper in this order and plating with copper to form a metal wire 4*c* (corresponding to the step E9).

Then, an opposite substrate 5 was attached to the light emitting elements 2 using an adhesive etc., thus producing a display device 29 having a plurality of light emitting elements.

Example 28

Figure 20:
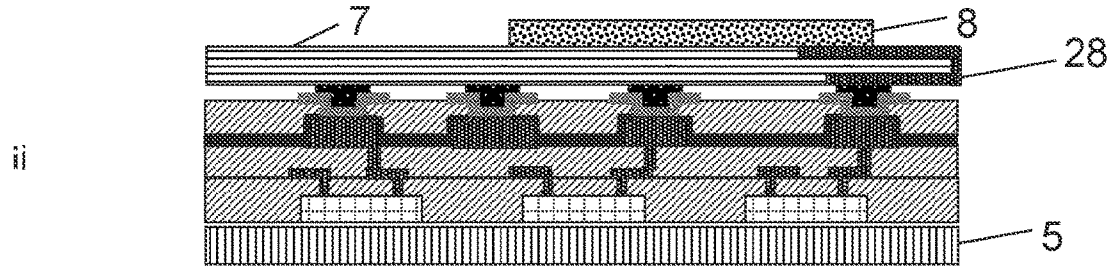
FIG. 20 This gives a cross-sectional view of a production process for an embodiment of the display device according to the present invention that has an electrically conductive film.

In the side face of a light emitting element driving substrate 7 as described in Example 26, an electrically conductive film 28 was adopted as illustrated in FIG. 20*i*, and the photosensitive electrically conductive paste 1 prepared in Preparation example 1 was used as the electrically conductive film 28 (corresponding to the step D11). Except for this, the same procedure as in Example 26 was carried out to produce a display device 30. The formation of the electrically conductive film 28 was performed as described below.

Preparation of Electrically Conductive Film 28

The photosensitive electrically conductive paste 1 was spread on a PET mold release film prepared by coating a PET film having a thickness of 16 μm with a mold releasing agent in such a manner that the film thickness would be 6.0 μm after drying, followed by drying the resulting coating film in a drying oven at 100° C. for 10 minutes. Then, it was irradiated with an exposure energy of 350 mJ/$cm^2$ using a light irradiation machine equipped with an ultrahigh pressure mercury lamp and then, using a 0.1 mass % aqueous solution of sodium carbonate as developer, spray development under a pressure of 0.1 MPa was performed for 30 seconds, thereby forming a pattern. Subsequently, the resulting pattern was cured in a drying oven at 140° C. for 30 minutes to prepare a wired sample for transfer test. The resulting pattern had a line width of 50 μm and a line length of 90 mm. Such samples for transfer test were attached to both faces of a glass plate in such a manner that part of the wires were disposed along the edge of the plate that had a beveled curved portion. Then, a side face of the glass plate was pressed against a hot plate at 130° C. for 30 seconds, followed by transferring the remaining portion using a hot roll laminator under the conditions of 130° C. and 1.0 m/min.

Example 29

In a side face of a light emitting element driving substrate 7 as described in Example 27, an electrically conductive film 28 was adopted as illustrated in FIG. 20*i*, and the photosensitive electrically conductive paste 1 prepared in Example 28 was used as the electrically conductive film 28 (corresponding to the step E12). Except for this, the same procedure as in Example 27 was carried out to produce a display device 31.

Example 30

Figure 21:
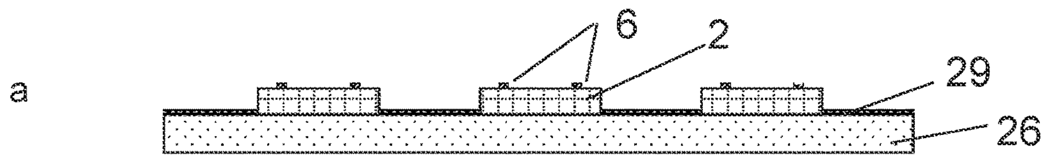
FIG. 21 This gives a cross-sectional view of a production process for an embodiment of the display device according to the present invention that has a shading portion.

As illustrated in FIG. 21*a*, shading portions 29 were formed on the support substrate 26 (corresponding to the step D12). Next, as illustrated in FIG. 21*a*, light emitting elements 2 were formed between the shading portions 29 (corresponding to the step (D1)). Except for this, the same steps as in Example 3 were carried out to produce a display device 32. The formation of the shading portions 29 was performed as described below.

<Formation of Shading Portions 29>

The coloring resin composition 1 was spread on the support substrate 26 in such a manner that its thickness would be 1 μm after heat treatment, and the coating film was dried by heating on a hot plate at 100° C. for 2 minutes. The dried film was irradiated with ultraviolet ray with an exposure energy of 200 mJ/$cm^2$ using a light irradiation machine equipped with an ultrahigh pressure mercury lamp. Next, it was developed with a 0.045 wt % aqueous solution of potassium hydroxide used as alkaline developer, followed by rinsing with pure water to produce a pattern film. The resulting pattern film was postbaked in a hot air oven at 230° C. for 30 minutes to produce shading layers.

Example 31

Except for replacing the shading portions 29 formed in Example 30 with shading portions 29 formed from the coloring resin compositions 2, the same steps as in Example 30 were carried out to produce a display device 33.

Comparative Examples 1 and 2

Except for replacing the resin composition 1 used in Example 1 with the resin composition 15 or 16 and omitting the step (D6) and step (D7), the same procedure as in Example 1 was carried out to produce display devices 26 and 27.

When the resulting display devices 26 and 27 were examined, warping and cracking were found in the display devices, leading to undesired defective rates after reliability test. They also failed to show a desired light extraction efficiency.

INDUSTRIAL APPLICABILITY

The display device according to the present invention can be suitably used in large signage displays, televisions, monitors, automotive displays, smartphones, smartwatches, wearable devices, tablets, and laptop computers, although its applications are not limited to these.

EXPLANATION OF NUMERALS

- 1 display device
- 2 light emitting element
- 3 cured film
- 4, 4*c* metal wire
- 4*a* thickness of metal wire disposed on surface of cured film
- 4*b* thickness of metal wire extending in hole pattern that penetrates cured film in thickness direction
- 5 opposite substrate
- 6 electrode terminal
- 7 light emitting element driving substrate
- 8 drive element
- 9 barrier metal
- 10 solder bump
- 11*a* designated region A
- 11*b* designated region B
- 12 hole pattern
- 13 bottom face portion of metal wire 4
- 14 maximum size of bottom face portion
- 15 reflecting film
- 16 partition wall
- 17 external substrate
- 18 total thickness of insulation film
- 19 inorganic insulation film
- 20 cured film
- 21 resin film
- 22 thickness β of inorganic insulation film existing between cured film layer located at the furthest position and cured film layer located at the second furthest position
- 23 thickness α of cured film layer located at the furthest position
- 24 thickness γ of cured film layer located at the second furthest position
- 25 thickness of the first cured film layer
- 26 support substrate
- 27 metal pad
- 28 electrically conductive film
- 29 light shading portion
- 30 TFT
- 31 TFT insulation layer
- 32 wire
- 33 contact hole

The invention claimed is:

1. A display device comprising at least metal wires, a cured film, an inorganic insulation film, and a plurality of light emitting elements, the cured film being a film formed by curing a resin composition containing a resin (A), each of the light emitting elements being an inorganic light emitting diode having a pair of electrode terminals on one face thereof, the pair of electrode terminals being connected to the plurality of metal wires extending in the cured film and the inorganic insulation film, the plurality of metal wires being electrically insulated by the cured film and the inorganic insulation film, the cured film having a plurality of layers, and the inorganic insulation film being in contact with at least part of the interlaminar portions of the multiple cured film layers, the display device having a sandwich structure in which the inorganic insulation film is located between two of or more of the cured film layers in such a manner that both surfaces of the inorganic insulation film being in contact with such cured film layers, where in the sandwich structure, inorganic insulation film exists between the cured film layer located at the furthest position and the cured film layer located at the second furthest position when seen from the light emitting elements in the direction perpendicular to the plane where the plurality of light emitting elements is disposed and also perpendicular to the plurality of stacked cured film layers, and wherein the relations $\alpha > \gamma$, $6 \leq \alpha/\beta \leq 100$, and $0.01 \leq \beta/\gamma \leq 0.75$ are satisfied where α (μm) is the thickness of the cured film layer located at the furthest position; β (μm) is the thickness of the inorganic insulation film that exists between the cured film layer located at the furthest position and the cured film layer located at the second furthest position; and γ (μm) is the thickness of the cured film layer located at the second furthest position in the sandwich structure.

2. A display device as set forth in claim 1 wherein the cured film has two or more and ten or less layers.

3. A display device as set forth in claim 1 wherein the inorganic insulation film has a thickness of 0.2 μm or more and 1.0 μm or less.

4. A display device as set forth in claim 1 wherein the cured film covers faces of each light emitting element other than the light extraction face.

5. A display device as set forth in claim 1 wherein the cured film further has a reflecting film.

6. A display device as set forth in claim 1 wherein a partition wall having a thickness equal to or larger than the thickness of the light emitting elements is disposed between the two or more light emitting elements.

7. A display device as set forth in claim 1 wherein a partition wall having a thickness equal to or larger than the thickness of the light emitting elements is disposed between the two or more light emitting elements in the cured film that covers the light emitting elements.

8. A display device as set forth in claim 1 wherein each light emitting element is an inorganic light emitting diode having sides of 5 μm or more and 700 μm or less.

9. A display device as set forth in claim 1 further comprising a drive element and a substrate in such a manner that the drive element is connected to the light emitting elements by metal wires and that at least part of the metal wires extend along a side face of the substrate.

10. A display device as set forth in claim 1 wherein shading portions are disposed between the two or more light emitting elements.

11. A display device as set forth in claim 1 wherein the resin (A) contains one or more resins selected from the group consisting of polyimide, polyimide precursor, polybenzoxazole, polybenzoxazole precursor, and copolymers thereof.

12. A display device as set forth in claim 1 wherein the resin (A) further includes a structural unit as represented by the general formula (4):

(4)

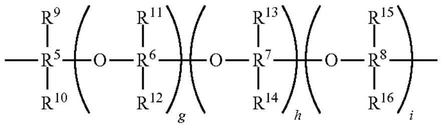

wherein, in the general formula (4), $R^5$ to $R^8$ each independently denote an alkylene group having 1 to 6 carbon atoms; $R^9$ to $R^{16}$ each independently denote a hydrogen atom, fluorine atom, or an alkyl group having 1 to 6 carbon atoms; the structures in parentheses are different from each other; and g, h, and i each independently denote an integer of 0 to 35 and meet the relation g+h+i>0.

13. A display device as set forth in claim 1 wherein the resin composition containing the resin (A) further includes a photosensitizing agent (B).

14. A display device as set forth in claim 1 wherein the resin composition containing the resin (A) further includes a thermal crosslinking agent (C).

15. A display device as set forth in claim 14 wherein the thermal crosslinking agent (C) is a compound containing a cyclic ether group having a biphenyl structure.

16. A display device as set forth in claim 1 wherein the resin composition containing the resin (A) has positive photosensitivity.

* * * * *